US012306236B2

(12) United States Patent
Noaman et al.

(10) Patent No.: US 12,306,236 B2
(45) Date of Patent: May 20, 2025

(54) SENSING RADIO FREQUENCY ELECTROMAGNETIC FIELDS

(71) Applicant: Quantum Valley Ideas Laboratories, Waterloo (CA)

(72) Inventors: Mohammad Noaman, Waterloo (CA); Donald Booth, Kitchener (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 18/650,804

(22) Filed: Apr. 30, 2024

(65) Prior Publication Data

US 2024/0393379 A1 Nov. 28, 2024

Related U.S. Application Data

(60) Provisional application No. 63/504,406, filed on May 25, 2023.

(51) Int. Cl.
*G01R 29/08* (2006.01)

(52) U.S. Cl.
CPC ..... *G01R 29/0892* (2013.01); *G01R 29/0885* (2013.01)

(58) Field of Classification Search
CPC ............ G01R 29/0885; G01R 29/0892; G01R 29/0878; G01R 33/032; G01R 29/0871;

(Continued)

(56) References Cited

U.S. PATENT DOCUMENTS

| 10,509,065 | B1 | 12/2019 | Shaffer |
| 2019/0187198 | A1* | 6/2019 | Anderson .......... G01R 29/0878 |
| 2020/0295838 | A1 | 9/2020 | Gordon et al. |

FOREIGN PATENT DOCUMENTS

| CA | 3121263 | 7/2020 | |
| WO | WO-2024054642 A2 * | 3/2024 | ............. G01R 29/08 |

OTHER PUBLICATIONS

Jayaseelan, Maitreyi, et al. "EIT spectra of Rydberg atoms dressed with dual-tone radio-frequency fields." arXiv preprint arXiv: 2305.09583 (May 16, 2023). (Year: 2023).*

(Continued)

*Primary Examiner* — Rishi R Patel
(74) *Attorney, Agent, or Firm* — Henry Patent Law Firm PLLC

(57) ABSTRACT

In a general aspect, a system is described for sensing radio frequency (RF) electromagnetic fields. The system includes a laser system that generates probe and coupling laser signals. The system also includes an RF source that generates a reference RF electromagnetic field. The reference RF electromagnetic field is part of a combined RF electromagnetic field that also includes a perturbing RF electromagnetic field. A vapor cell sensor of the system generates an optical signal in response to the probe laser signal, the coupling laser signal, and the combined RF electromagnetic field interacting with a vapor of the vapor cell sensor. The system additionally includes a control system that tunes the coupling laser signal and the reference RF electromagnetic field relative to respective transitions of the vapor. The control system generates, based on the optical signal, a value that represents a property of the perturbing RF electromagnetic field.

28 Claims, 34 Drawing Sheets

(58) Field of Classification Search
CPC .................. G01R 29/14; G01R 29/0807; G01R 29/0814; G01R 33/26; G01R 29/0864; G01R 33/20; G01R 33/0029; G01R 33/02; G01R 33/24
See application file for complete search history.

(56) References Cited

OTHER PUBLICATIONS

Rotunno, Andrew P., et al. "Detection of HF and VHF Fields through Floquet Sideband Gaps byRabi Matching'Dressed Rydberg Atoms." arXiv preprint arXiv:2212.03304 (2022). (Year: 2022).*
Kong, Hyeran. Towards many-body physics with Rydberg-dressed cavity polaritons. MS thesis. University of Waterloo, 2018. (Year: 2018).*
ISA, International Search Report and Written Opinion issued in Application No. PCT/CA2024/050647 on Aug. 13, 2024, 9 pages.
Adams, et al., "Rydberg atom quantum technologies", J. Phys. B: At. Mol. Opt Phys. 53, Dec. 3, 2019, 14 pgs.
Agarwal, G S, et al., "Spectrum of radiation from two-level atoms under intense bichromatic excitation", vol. 8, No. 5/May 1991/ Journal of the Optical Society of America B, 1991, 6 pages.
Bohaichuk, Stephanie M, et al., "The Origins of Rydberg Atom Electrometer Transient Response and its Impact on Radio Frequency Pulse Sensing", arXiv:2203.01733, Mar. 3, 2022, 21 pgs.
Booth, D, et al., "Rydberg atomic electrometry: a near-field technology for complete far-field imaging in seconds?", 3 pages.
Fan, Haoquan, et al., "Atom based RF electric field sensing", Journal of Physics B: Atomic, Molecular and Optical Physics 48 202001 (2015), Sep. 9, 2015, 17 pgs.
Gordon, Joshua A, et al., "Weak electric-field detection with sub-1 Hz resolution at radio frequencies using a Rydberg atom-based mixer", AIP Advances 9, 045030 (2019), Apr. 25, 2019, 6 pages.
Greentree, Andrew D, et al., "Probing a doubly driven two-level atom", Andrew D Greentree et al.1999 J. Opt. B: Quantum Semiclass. Opt. 1 240, Jan. 28, 1999, 6 pages.
Gustin, Chris, et al., "High-resolution spectroscopy of a quantum dot driven bichromatically by two strong coherent fields", Physical Review Research 3, 013044 (2021), Jan. 14, 2021, 12 pages.
Hu, Jinlian, et al., "Continuously tunable radio frequency electrometry with Rydberg atoms", Appl. Phys. Lett. 121, 014002 (2022), Jul. 7, 2022, 7 pages.
Jayaseelan, Maitreyi, et al., "EIT spectra of Rydberg atoms dressed with dual-tone radio-frequency fields", arXiv:2305.09583v1 [physics.atom-ph], 12 pages.
Jing, et al., "Atomic superheterodyne receiver based on microwave-dressed Rydberg spectroscopy", Nature Physics, vol. 16, Sep. 2020, 11 pgs.
Kumar, et al., "Atom-Based Sensing of Weak Radio Frequency Electric Fields Using Homodyne Readout", Scientific Reports 7:42981, Feb. 20, 2017, 10 pgs.
Meyer, David H, et al., "Assessment of Rydberg Atoms for Wideband Electric Field Sensing", arXiv: 1910.00646v2 [physics.atom-ph], 16 pages.
Papageorge, Alexander, et al., "Bichromatic driving of a solid-state cavity quantum electrodynamics system", New Journal of Physics 14 (2012) 013028, Jan. 17, 2012, 14 pages.
Rotunno, Andrew P, et al., "Detection of HF and VHF Fields through Floquet Sideband Gaps by Rabi Matching' Dressed Rydberg Atoms", aparXiv:2212.03304v2 [physics.atom-ph], 12 pages.
Rudolph, T, et al., "Shift of the subharmonic resonances and suppression of fluorescence in a two-level atom driven by a bichromatic field", J. Opt. Soc. Am. B/ vol. 15, No. 8/Aug. 1998, 1998, 6 pages.
Sedlacek, et al., "Atom-Based Vector Microwave Electrometry Using Ribidium Rydberg Atoms in a Vapor Cell", Physical Review Letters, Aug. 6, 2013, 5 pgs.
Wang, J, et al., "Bichromatic electromagnetically induced transparency in cold rubidium atoms", arxiv.org/abs/quant-ph/0312195v1, 4 pages.

* cited by examiner

|  | $\Delta_1 < 0$ | $\Delta_1 > 0$ |
|---|---|---|
| $\Delta_2 < 0$ | $\Delta E_{min} < \hbar\Omega_2/2$ | $\Delta E_{min} > \hbar\Omega_2/2$ |
| $\Delta_2 > 0$ | $\Delta E_{min} > \hbar\Omega_2/2$ | $\Delta E_{min} < \hbar\Omega_2/2$ |

FIG. 14

SENSING RADIO FREQUENCY ELECTROMAGNETIC FIELDS

CROSS-REFERENCE TO RELATED APPLICATIONS

This application claims priority to U.S. Prov. Pat. App. No. 63/504,406, which was filed on May 25, 2023, and entitled, "Sensing Multichromatic Radio Frequency Fields." The disclosure of the priority application is hereby incorporated herein by reference in its entirety.

BACKGROUND

The following description relates to sensing radio frequency (RF) electromagnetic fields.

Sensors may be used to determine the properties of an RF electromagnetic field. However, in certain environments, the sensors may experience additional RF electromagnetic fields. In these environments, interference from these additional RF electromagnetic fields may hinder or prevent the properties of the RF electromagnetic field from being accurately measured.

DESCRIPTION OF DRAWINGS

FIG. 14 is a table showing the dependence of $\Delta E_{min}$ for different example conditions of $\Delta_1$ and $\Delta_2$;

DETAILED DESCRIPTION

Figure 1:
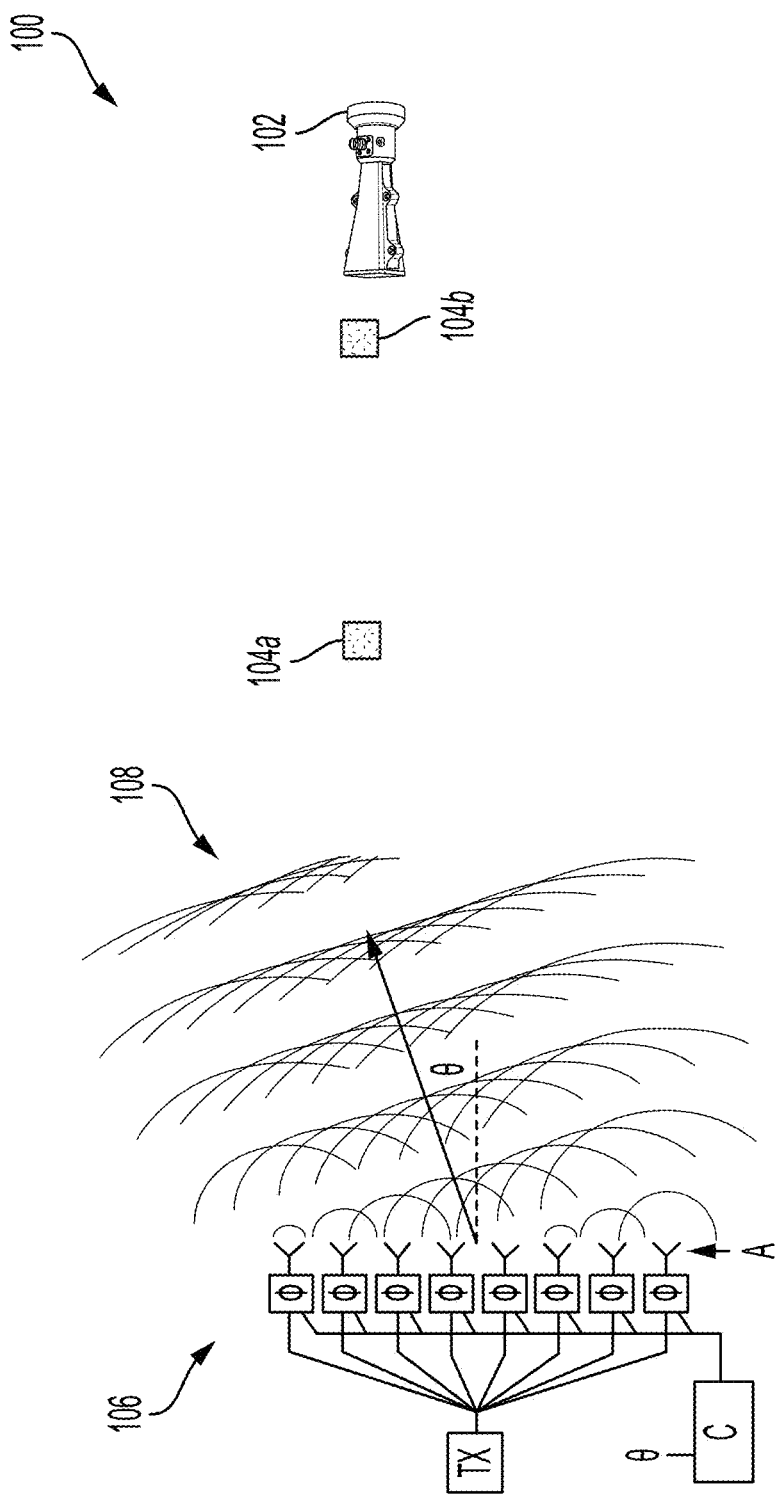
FIG. 1 is a schematic diagram of an example system for sensing multichromatic RF fields.

In a general aspect, a radio frequency (RF) local oscillator may be used to read-out a Rydberg vapor-based sensor. In some implementations, an RF local oscillator is used in a manner that preserves a self-calibration property of the Rydberg vapor-based sensor, and in certain cases, avoids or mitigates other limitations, such as limitations associated with the bandwidth of an antenna that provides the local oscillator. In some implementations, the self-calibration property of Rydberg vapor-based sensors is preserved even when a multichromatic RF field (e.g., a combination of two or more RF fields) is incident on the Rydberg vapor-based sensor. Moreover, a model may be used that represents the physics of multichromatic RF fields interacting with a vapor in a Rydberg vapor-based sensor. In the examples described here, the vapor includes Rydberg atoms or molecules that have Rydberg electronic states. In some implementations, the model allows self-calibration to be preserved in the Rydberg vapor-based sensor by using avoided crossings between the Rydberg energy levels of the atomic or molecular states dressed by the RF fields.

In some implementations, the multichromatic RF field includes two RF fields (e.g., a bichromatic field). The two RF fields may, in certain cases, have respective frequencies in a range from 100 MHz to 1 THz. In these implementations, the first RF field serves as a reference RF field (e.g., a control RF field) while the second RF field has one or more properties that are unknown (e.g., an amplitude, a phase, and a frequency, etc.). The second RF field may be a perturbing RF field (e.g., an interfering RF field). In some implementations, the multichromatic RF field includes three or more RF fields. In some implementations, the Rydberg vapor-based sensor is sensitive to near-by perturbing RF signals. As such, the frequencies and amplitudes of the near-by perturbing RF fields can be determined. The Rydberg vapor-based sensors may therefore be more attractive for sensing electromagnetic interference (EMI) in constrained environments like airplane frames or in other environments.

The RF local oscillator and the perturbing RF field may interact concurrently with a vapor of Rydberg atoms or molecules in the Rydberg vapor-based sensor. In these cases, the RF local oscillator can be tuned in several different ways relative to electronic levels of the vapor to determine the properties of the perturbing RF field. For example, the power of the RF local oscillator can be tuned to an avoided crossing or systematically across an avoided crossing. The avoided crossings can be mapped out by changing a detuning of a coupling laser, which also interacts with the vapor of Rydberg atoms or molecules. Moreover, the power of the RF local oscillator at the avoided crossing can be used to determine one or both of the amplitude and the detuning of the perturbing RF field. The power of the RF local oscillator can also be verified if the avoided crossings are mapped out as a function of local oscillator power and coupling laser frequency. In some implementations, a sign of the detuning for the RF local oscillator can be determined by detuning the RF local oscillator. In some implementations, the RF local oscillator is tuned (e.g., in frequency, power, etc.) and the detuning for the coupling laser is selected. In these implementations, the avoided crossings in the energy spectrum may be mapped out.

The interaction of multiple RF fields with the Rydberg electronic states of the vapor of Rydberg atoms or molecules is much richer than that implied by models that consider only the simple mixing of two or more RF fields (e.g., Rydberg atom mixers, heterodyne measurements, etc.). Such models do not support using Rydberg vapor-based sensors to make self-calibrated measurements. Moreover, using the physics of a Rydberg atom or a Rydberg molecule in a multichromatic RF field (e.g., a bichromatic field), rather than relying on simplified approximations that turn the system into something than mimics a conventional RF system, new functionality can be achieved with a Rydberg vapor-based sensor. For example, in some cases, all the properties of a perturbing RF field may be extracted by tuning the properties of the RF local oscillator as well as the frequency of the coupling laser. Such properties may be difficult (or impossible) to extract with small detunings where avoided crossings are not induced. Moreover, with small detunings, the RF local oscillator may be unable to extract an SI-traceable measurement.

An 'avoided crossing' is a quantum mechanical phenomenon that occurs, for example, when the energies of two different eigenstates (e.g., stationary states) of a system become close but cannot be degenerate (and therefore, the energy levels cannot cross). In some contexts, the eigenstates are a function of a parameter in the Hamiltonian that changes the energetic separation of the states. An example of such a Hamiltonian is described below in relation to FIGS. 6A-6D and Eq. (1). The states may, for example, be combinations of the RF field modes and the atomic or molecular energy levels, e.g., the two Rydberg electronic levels used for sensing. The energy states of the RF1 field mode and the atom or molecule are seemingly degenerate, because a state with N photons in the RF1 field mode in the lower atomic or molecular state has the same energy as a state with N−1 photons in the RF1 field mode in the excited state-provided the RF field mode is resonant with the atomic transition.

In some implementations, an avoided crossing can be described by a model that correctly accounts for interactions between the states. The avoided crossing may, for example, be due to a 'non-crossing rule' that represents a theorem in quantum mechanics. In these implementations, the actual eigenstates can be a mixture between the atomic or molecular levels and the RF field states, as is described further below in relation to Eq. (2). These states have energy splittings of the Rabi frequency of the RF1 field ($\Omega$) when the RF1 field is resonant with the transition. If the RF1 field is detuned ($\Delta$) from the atomic or molecular transition, the minimum splitting is $\sqrt{\Delta^2+\Omega^2}$. The behavior of the avoided crossing may depend on the detuning and power (e.g., Rabi frequency) of the RF field.

Second, third, or higher number of RF fields (e.g., RF2, RF3, etc.) can cause more avoided crossings. The respective powers and detunings of these fields can be extracted, for example, if the properties of the first RF field (RF1) can be controlled and used to determine both its own properties and the properties of the other RF fields. The former determination corresponds to an initial stage of Rydberg vapor-based sensing, and the latter determination corresponds to a subsequent stage of Rydberg vapor-based sensing that is made by mapping the avoided crossings. In a physical picture of the Rydberg atom or molecule, and in the presence of the two or more RF field modes, each field mode can be treated like a harmonic oscillator. The Rydberg atom or molecule acts as a medium for the exchange of excitations (e.g., photons) between the field modes. In certain cases, the system of RF fields becomes a series of linearly coupled harmonic oscillators (e.g., for dipole transitions).

FIG. 1 presents a schematic diagram of an example system 100 for sensing multichromatic RF fields. The example system 100 includes an RF source 102 (e.g., a Tx antenna) that is configured to generate a reference RF field (RF1). The example system 100 also includes a Rydberg vapor-based sensor 104a that contains a vapor of Rydberg atoms (e.g., Cs, Rb, etc.) or Rydberg molecules (e.g., $H_2$, $I_2$, etc.). The Rydberg vapor-based sensor 104a may, for example, be a vapor cell sensor, such as described in U.S. Pat. No. 10,859,981 entitled "Vapor Cells Having One or More Optical Windows Bonded to a Dielectric Body" and U.S. Pat. No. 10,605,840 entitled "Vapor Cells Having Reduced Scattering Cross-Sections and Their Methods of Manufacture". The example system additionally includes a second RF source 106 that is configured to generate a perturbing RF field 108. In some implementations, such as shown in FIG. 1, the second RF source 106 is a device-under-test (DUT) that can generate two or more perturbing RF fields (e.g., RF2, RF3, etc.). In these environments, the combination of the RF fields (e.g., RF1, RF2, RF3, etc.) may define a multichromatic RF field.

In some implementations, the example system 100 includes a laser system that is configured to generate a plurality of laser signals that include a probe laser signal and a coupling laser signal. The laser system may be in optical communication with the Rydberg vapor-based sensor 104a (e.g., via fiber optics), and as such, the probe and coupling laser signals can interact with the vapor of Rydberg atoms or Rydberg molecules in the Rydberg vapor-based sensor 104a. Such interaction may allow the Rydberg vapor-based sensor 104a to generate an optical signal that is based on the probe and coupling laser signals. The optical signal may represent the response of the vapor to the multichromatic RF field, such as by representing a transmission of the probe laser signal through the vapor. In some implementations, the example system 100 includes a second Rydberg vapor-based sensor 104b that is adjacent the first RF source 102. In these implementations, the laser system may also be in optical communication with the second Rydberg vapor-based sensor 104b, and the second Rydberg vapor-based sensor 104b may assist the first Rydberg vapor-based sensor 104a in controlling the reference RF field (e.g., stabilizing the reference RF field, calibrating the reference RF field, etc.). In certain cases, this control may be done in real-time using a feedback loop. Although FIG. 1 shows two Rydberg vapor-based sensors 104, other numbers and configurations of Rydberg vapor-based sensors 104 may be used (e.g., a pair of Rydberg vapor-based sensors that collectively define a single scannable sensor).

In some implementations, the example system 100 includes a detector system that is configured to receive the optical signal from the Rydberg vapor-based sensor 104a, and in response, generate a detector signal that represents the multichromatic RF field. In some implementations, the example system 100 also includes a control system configured to receive the detector signal, and in response, generate data that represents the multichromatic RF field. The data could, for example, include first data representing properties of the reference RF field (RF1), second data representing properties of a first perturbing RF field (RF2), third data representing properties of a second perturbing RF field (RF3), and so forth. Examples of the properties include an amplitude, a frequency, a phase, and a polarization of the RF fields (e.g., RF1, RF2, RF3, etc.). In some implementations, the properties include a detuning of an RF field (e.g., $\Delta_1$, $\Delta_2$, etc.) relative to an electronic transition of the vapor. In some implementations, the properties include a coupling strength of the RF field (e.g., $\Omega_1$, $\Omega_2$, etc.) to an electronic transition of the vapor. In many implementations, the control system is configured to generate the data based on a model. The model may, for example, be a Jaynes-Cummings model. Examples of possible models are described further in relation to FIGS. 6A-6D.

Figure 2:
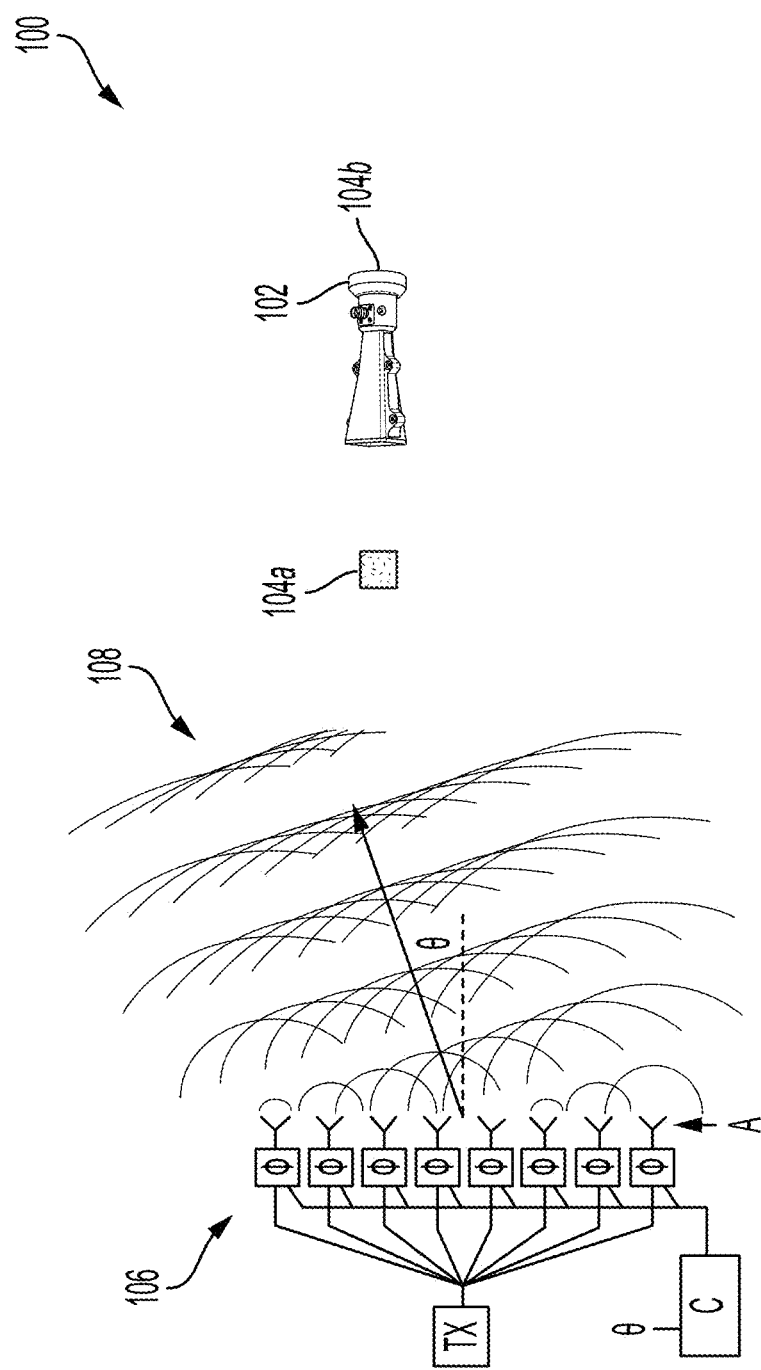
FIG. 2 is a schematic diagram of the example system of FIG. 1, but in which a Tx antenna is integrated into a second Rydberg vapor-based sensor of the example system.

In some implementations, the first RF source 102 may be integrated into the Rydberg vapor-based sensor. For example, FIG. 2 presents a schematic diagram of the example system 100 of FIG. 1, but in which a Tx antenna is integrated into the second Rydberg vapor-based sensor 104b. The second Rydberg vapor-based sensor 104b could correspond to a vapor cell sensor in which a slot waveguide defines part or all of the Tx antenna. Examples of slot waveguide structures for vapor cell sensors are described in U.S. Pat. No. 11,209,473 entitled "Sensing Radio Frequency Electromagnetic Radiation". Alternatively, the second Rydberg vapor-based sensor 104b could include a vapor cell sensor coupled to a Rydberg vapor-based maser. Examples of configurations for the Rydberg vapor-based maser are described in U.S. Pat. No. 11,303,087 entitled "Photonic Crystal Masers".

Figure 3:
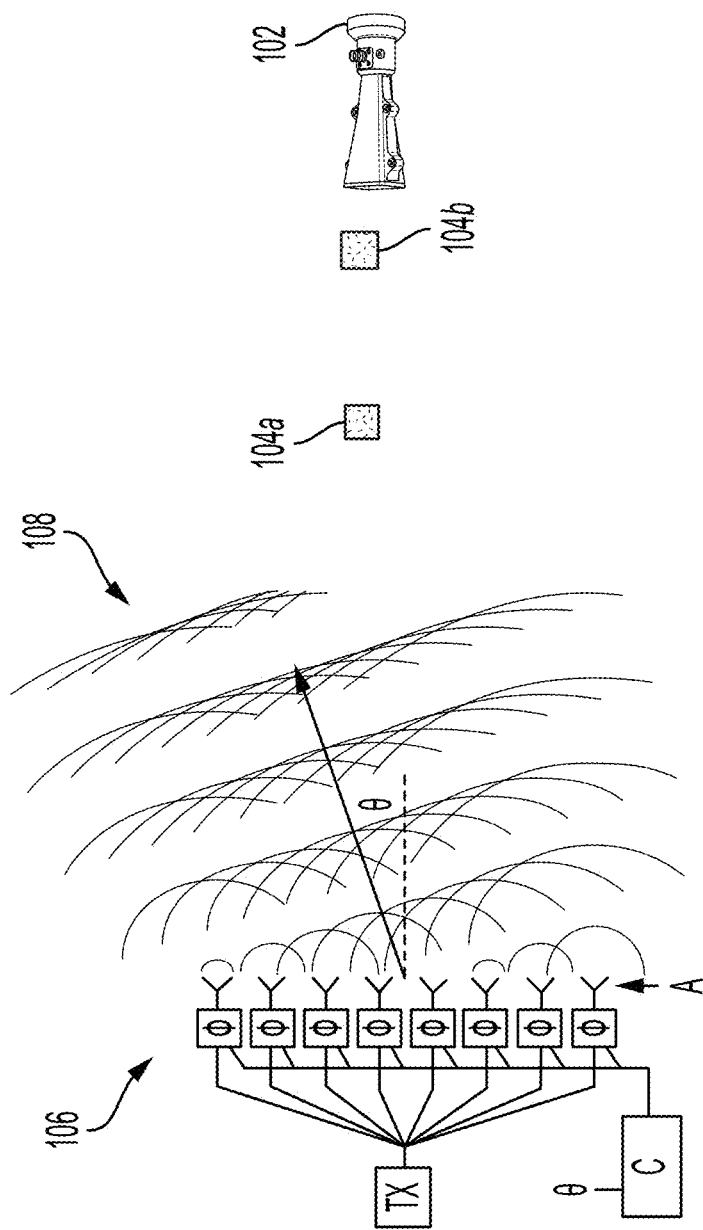
FIG. 3 is a schematic diagram of the example system of FIG. 1, but in which the second RF source generates perturbing RF fields at more than one signal frequency.

In some implementations, the second RF source 106 is a device-under-test that generates perturbing RF fields 108 at more than one signal frequency (e.g., spurs). FIG. 3 presents a schematic diagram of the example system 100 of FIG. 1, but in which the second RF source 106 generates perturbing RF fields 108 at more than one signal frequency (e.g., spurs). Here, the first RF source 102 may be a Tx antenna that generates the reference RF field (RF1). The reference RF field may correspond to a primary RF output that serves as a control RF field for the example system 100. The second RF source 106 (e.g., a device-under-test) may generate perturbing RF fields 108 (e.g., RF2, RF3, etc.) that are non-desirable or unknown secondary outputs that need to be characterized. The perturbing RF fields 108 may, in certain cases, correspond to spurs of the second RF source 106 that are at more than one signal frequency. In some implementations, the second RF source 106 is part of an environment of the example system 100. In these implementations, the second RF source 106 may be local to the example system 100. For example, the second RF source 106 may generate the perturbing RF field 108 in the environment and the example system 100 receives the perturbing RF field 108 from the environment.

Figure 4:
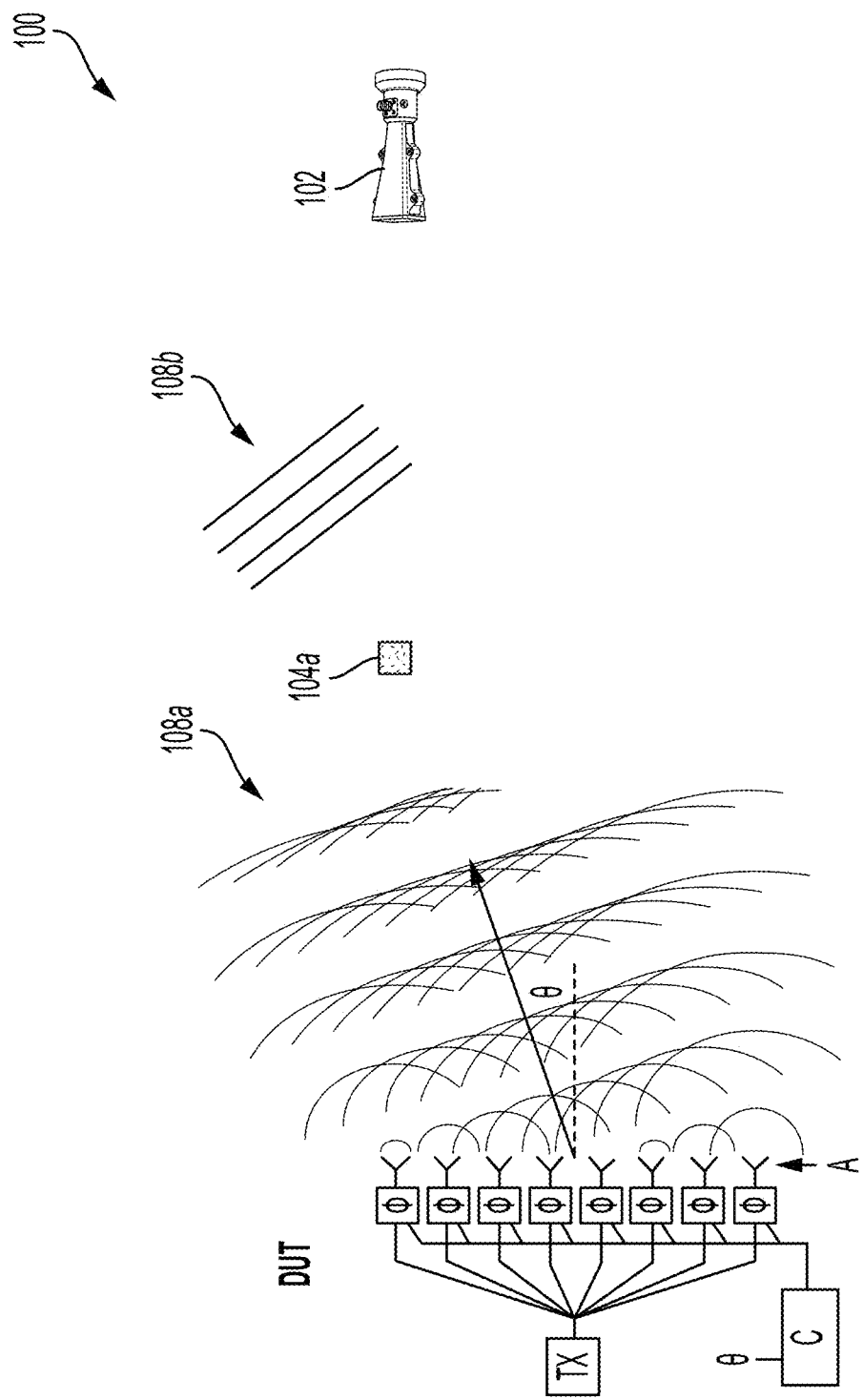
FIG. 4 is a schematic diagram of the example system of FIG. 1, but in which perturbing RF fields are generated by a device-under-test and an environment of the example system.

In some implementations, the second RF source 106 is a device-under-test and the example system 100 includes a third RF source that is part of an environment of the example system 100. FIG. 4 presents a schematic diagram of the example system 100 of FIG. 1, but in which perturbing RF fields 108 are generated by a device-under-test and an environment of the example system 100. In FIG. 4, the device-under-test generates a first perturbing RF field 108a, and the environment includes one or more second perturbing RF fields 108b. In some instances, the one or more second perturbing RF signals 108b are already present in the environment (e.g., generated by an unknown RF source). In some instances, the one or more second perturbing RF signals 108b are generated in the environment (e.g., generated by a third RF source that is local to the example system 100).

In some implementations, the properties of a target RF field (e.g., a perturbing RF field) may be determined using a Rydberg vapor-based sensor and a model, such as a Jaynes-Cummings model. Rydberg vapor-based sensors are a type of RF sensor that are inherently quantum mechanical. These sensors may be configured to use an RF local oscillator to determine the properties of a target RF field. For example, the target RF field may be one of a plurality of RF fields that are near resonant with an RF transition of the vapor. The Rydberg vapor-based sensor may therefore use the vapor to sense the target RF field. The model can represent how the plurality of RF fields interact with the Rydberg atoms or Rydberg molecules in the Rydberg vapor-based sensor, as well as representing how perturbing signals and the local oscillator can affect measurements made by the Rydberg vapor-based sensor. Conventional models may rely upon simplified approximations for the local oscillator-target field interaction, such as those that use an analogy to radio frequency heterodyning. More accurate models, such as those, described herein, can more precisely represent the physics of Rydberg vapor-based sensors in two or more RF fields. The more accurate models may, for example, correspond to a multiply dressed Jaynes-Cummings model. In such models, the Rydberg atoms or Rydberg molecules in the Rydberg vapor-based sensor act as a medium for exchanging electromagnetic field excitations of the field modes whose spectrum is a ladder. The Jaynes-Cummings states and their avoided crossings can be used to determine the properties of the two or more RF fields. RF field sensitivity enhancement for non-resonant radio frequencies can be achieved, and self-calibrated measurements can be recovered under specific conditions, as shown by the model.

Figure 5A:
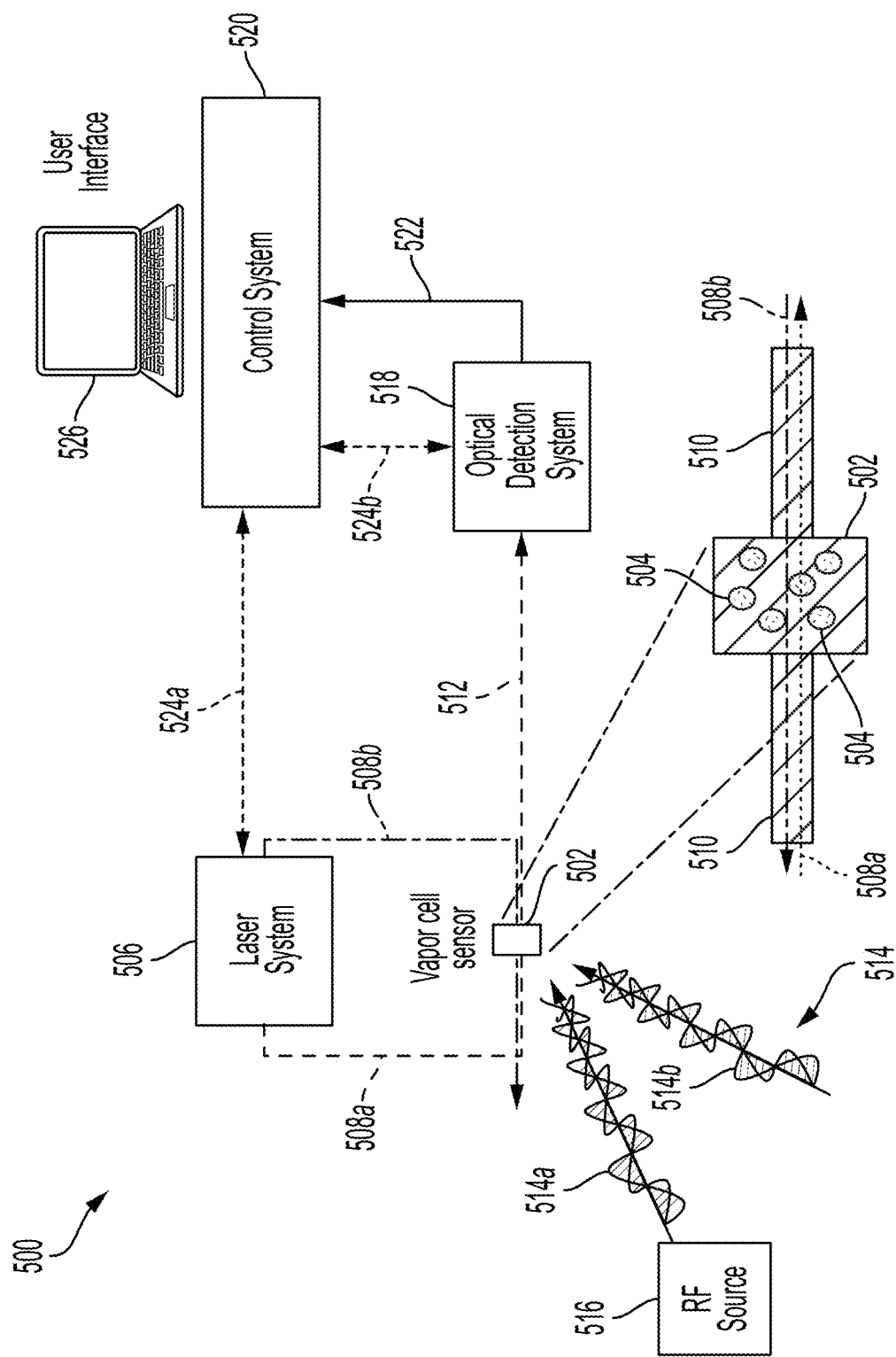
FIG. 5A is a schematic diagram is presented of an example system for sensing RF electromagnetic fields.

Now referring to FIG. 5A, a schematic diagram is presented of an example system 500 for sensing RF electromagnetic fields. The RF electromagnetic fields may, in certain cases, have respective frequencies in the range from 100 MHz to 1 THz. The example system 500 includes a vapor cell sensor 502 that contains a vapor 504 having electronic states, such as Rydberg electronic states. The vapor 504 may, for example, include one or both of a vapor of Rydberg atoms (e.g., Rb, Cs, etc.) and a vapor of Ryberg molecules (e.g., $H_2$, $I_2$, etc.). In these cases, the vapor cell sensor 502 may be a Rydberg vapor-based sensor. Moreover, the vapor cell sensor 502 may be analogous to the Rydberg vapor-based sensors described in relation to FIGS. 1-4.

Figure 5B:
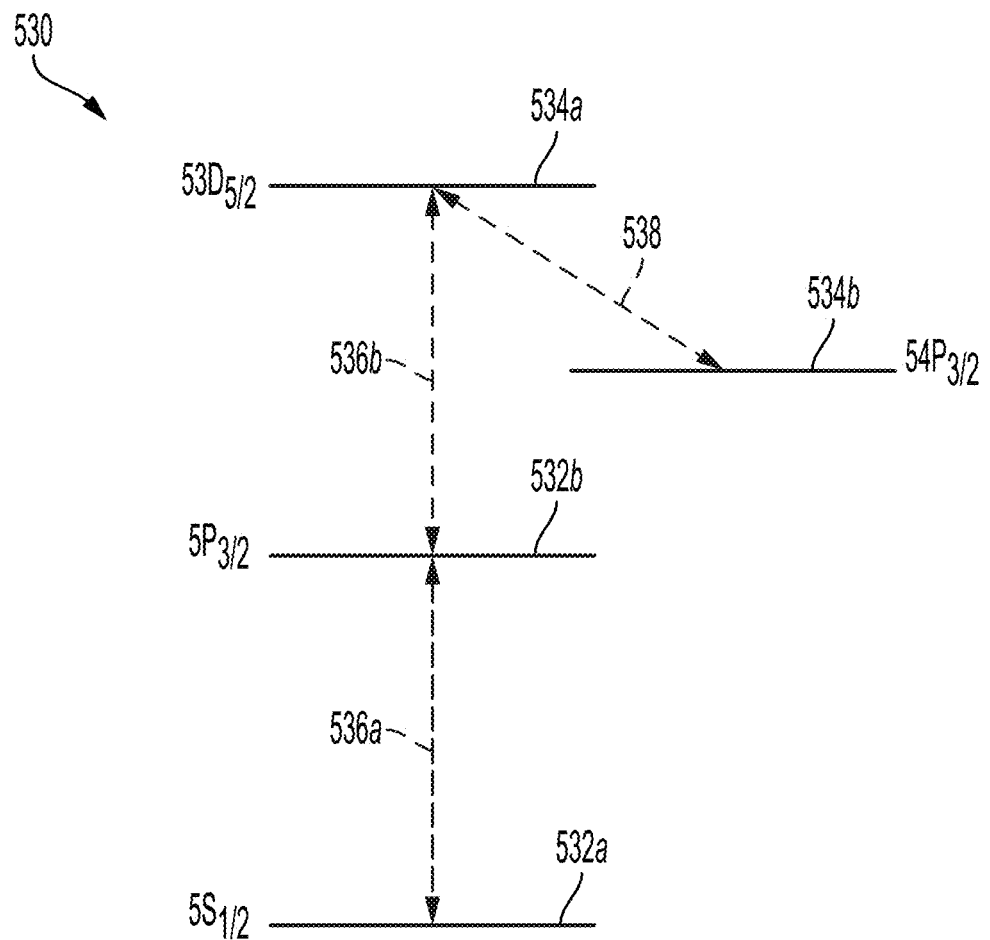
FIG. 5B is a schematic diagram of an example set of electronic states for a vapor of Rb atoms.

In some implementations, the vapor 504 includes a plurality of electronic states that define a ladder of electronic states. For example, FIG. 5B presents a schematic diagram of an example set of electronic states 530 for a vapor of Rb atoms. The example set of electronic states 530 includes first and second electronic states 532a, 532b and first and second Rydberg electronic states 534a, 534b. These states are labeled in FIG. 5A using spectroscopic notation—i.e., $5S_{1/2}$, $5P_{3/2}$, $53D_{3/2}$, and $54P_{3/2}$, respectively—that is applicable to Rb atoms. The first electronic state 532a, the second electronic state 532b, and the first Rydberg electronic state 534a are progressively higher in energy and define a ladder of electronic states. Moreover, the second Rydberg electronic state 534b is lower in energy than the first Rydberg electronic state 534a. In some implementations, the second Rydberg electronic state 534b may be higher in energy than the first Rydberg electronic state 534a.

The example set of electronic states 530 define electronic transitions of the vapor of Rb atoms. For example, the energy gap between the first and second electronic states 532a, 532b define a first optical electronic transition 536a. Similarly, the energy gap between the second electronic state 532b and the first Rydberg electronic state 534a define a second optical electronic transition 536b. The first and second optical electronic transitions 536a, 536b may interact with (e.g., absorb) optical signals, such as laser signals from a laser system. As another example, the energy gap between the first and second Rydberg electronic states 534a, 534b may define an RF transition 538 that interacts with (e.g., absorbs) an RF electromagnetic field. Examples of the RF electromagnetic field include those from a reference antenna, a device-under-test, an ambient environment of the example system 500, and so forth. Combinations of RF electromagnetic fields are also possible, such as a bichromatic or multichromatic RF electromagnetic field.

Figure 5C:
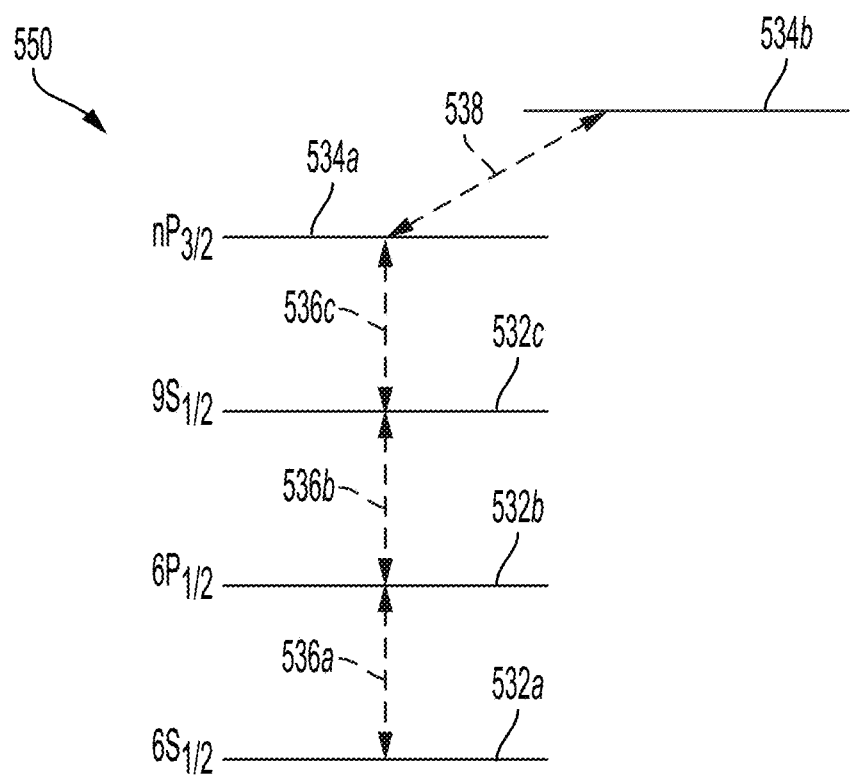
FIG. 5C is a schematic diagram of an example set of electronic states for a vapor of Cs atoms.

In FIG. 5B, the example set of electronic states 530 is depicted as having four electronic states, with two being Rydberg electronic states. Other numbers and combinations of electronic states and Rydberg electronic states are possible. For example, FIG. 5C presents a schematic diagram of an example set of electronic states 550 for a vapor of Cs atoms. The example set of electronic states 550 includes a third electronic state 532c such that the first electronic state 532a, the second electronic state 532b, the third electronic state 532c, and the first Rydberg electronic state 534a are progressively higher in energy (e.g., define a ladder of electronic states). The energy gap between the second and third electronic states 532b, 532c defines a third optical electronic transition 536c that is configured to interact with (e.g., absorb) optical signals. In FIG. 5C, the second Rydberg electronic state 534b is higher in energy than the first Rydberg electronic state 534a. However, in some implementations, the second Rydberg electronic state 534b may be lower in energy than the first Rydberg electronic state 534a.

Now referring back to FIG. 5A, the example system 500 also includes a laser system 506 that is optically coupled to the vapor cell sensor 502, such as through free space or through an optical fiber assembly. The laser system 506 is configured to generate laser signals 508 that are transmitted to the vapor cell sensor 502. For example, the laser system 506 may generate a probe laser signal 508a and a coupling laser signal 508b that are guided by optical fibers 510 to interact with the vapor 504 of the vapor cell sensor 502. FIG. 5A depicts two laser signals 508 defined by, respectively, probe and coupling laser signals 508a, 508b. However, other numbers of laser signals 508 are possible (e.g., one probe laser signal and two coupling laser signals). FIG. 5A also depicts the laser signals 508 as counter-propagating through the vapor 504 along opposing optical paths. However, other configurations of optical paths are possible (e.g., parallel), including other numbers of optical paths. Examples of configurations of laser signals and their interactions with Rydberg vapors are described further in U.S. Pat. No. 10,509,065 entitled "Imaging of Electromagnetic Fields".

In some instances, the vapor cell sensor 502 generates an optical signal 512 in response to receiving the laser signals 508. The optical signal 512 may be defined by one or more of the laser signals 508 after interacting with the vapor 504. For example, the optical signal 512 may be defined by the probe laser signal 508a after interacting with the vapor 504 (and while the coupling laser signal 508b also interacts with the vapor 504). The optical signal 512 may thus be based on a transmission of the probe laser signal 508a through the vapor 504. In many implementations, the vapor cell sensor 502 is configured to generate an optical signal 512 in response to the laser signals 508 and an RF electromagnetic field interacting with the vapor 504 (e.g., a reference RF electromagnetic field 514a, a perturbing RF electromagnetic field 514b, a combination thereof, etc.). In these implementations, the laser signals 508 interacts with the vapor 504 to generate the optical signal 512 and the RF electromagnetic field may alter the optical signal 512 by interacting with the vapor 504. In cases where the optical signal 512 is defined by the probe laser signal 508a, the RF electromagnetic field may alter an optical property of the probe laser signal 508a, such as an intensity, a frequency, a polarization, or a phase of the probe laser signal 508a. Combinations of altered optical properties are possible. The optical signal 512 may thus be based on a transmission of the probe laser signal 508a through the vapor 504 and may also represent a response of the vapor 504 to the RF electromagnetic field, if present.

In some implementations, the example system 500 includes an RF source 516 that is configured to generate a reference RF electromagnetic field 514a. The RF source 516 may, for example, be a reference RF antenna, a reference maser, or other type of local RF oscillator. Moreover, the reference RF electromagnetic field 514a may be matched to (e.g., be resonant or near resonant with) a target RF transition of the vapor 504, such as an RF transition of the vapor 504 that a perturbing RF electromagnetic field is expected to interact with. In some implementations, the RF source 516 is a reference RF antenna that is an integral part of the vapor cell sensor 502. For example, the vapor cell sensor 502 may include a slot waveguide structure, such as described in U.S. Pat. No. 11,209,473. In some implementations, the RF source 516 is a Rydberg vapor-based maser that is coupled to the vapor cell sensor 502. The Rydberg vapor-based maser may, in certain cases, be an integral part of the vapor cell sensor 502. Examples of the Rydberg vapor-based masers are described in U.S. Pat. No. 11,303,087.

In many implementations, the reference RF electromagnetic field 514a is part of a combined RF electromagnetic field 514 that includes a perturbing RF electromagnetic field 514b. For example, the example system 500 may include a device-under-test (DUT) that is configured to generate the perturbing RF electromagnetic field 514b. As another example, the perturbing RF electromagnetic field 514b may be received from an environment of the example system 500, such as from a known or unknown RF source in the environment. In these implementations, the perturbing RF electromagnetic field 514b may be at or near resonant with the RF transition of the vapor 504.

In some implementations, the example system 500 additionally includes an optical detection system 518 and a control system 520. The optical detection system 518 is optically coupled to the vapor cell sensor 502 to receive the optical signal 512, such as through free space or through an optical fiber assembly. The optical detection system 518 is configured to generate signals 522 in response to receiving the optical signal 512, and these signals 522 may represent one or more optical properties of the optical signal 512. For example, the optical detection system 518 may include a photodetector that is configured to generate electrical signals in response to measuring an amplitude of the optical signal 512. However, other optical properties of the optical signal 512 are possible, such as a frequency, a polarization, and a phase of the optical signal 512. Combinations of optical properties are also possible.

The optical detection system 518 may include one or more optical elements (e.g., lenses, mirrors, polarizers, filters, gratings, beam splitters, etc.) that can be controlled to manipulate the optical signal 512. Such manipulation may allow the optical detection system 518 to measure a target optical property of the optical signal 512, such as via a photodetector. In some implementations, the optical detection system 518 includes a photodetector configured to measure a target optical property of the optical signal 512, such as an amplitude of the optical signal 512 at a specific frequency (or within a range of frequencies). In these implementations, the optical detection system 518 may include multiple photodetectors, each configured to measure a different target property of the optical signal 512.

In some implementations, the control system 520 is configured to receive the signals 522 from the optical detection system 518 and may include analog electronics, digital electronics, or both, for processing the signals 522 once received. The control system 520 may also be configured to generate data representing the response of the vapor 504 to the RF electromagnetic field 514. For example, the control system 520 may be configured to perform operations that include tuning the coupling laser signal 508b relative to a coupling optical transition of the vapor 504 and tuning the reference RF electromagnetic field 514a relative to an RF transition of the vapor. The operations also include generating transmission data based on the optical signal 512. The transmission data represents the transmission of the probe laser signal 508a through the vapor 504 as the coupling laser signal 508b and the reference RF electromagnetic field 514a are tuned while the combined RF electromagnetic field 514 interacts with the vapor 504.

In some implementations, the operations additionally include generating a value that represents a property of the perturbing RF electromagnetic field 514b. The value is based on the transmission data and avoided crossings induced by the combined RF electromagnetic field 514 on Rydberg electronic states of the vapor 504. Examples of the property include an amplitude, a frequency, a phase, and a polarization of the perturbing RF electromagnetic field 514b. In some implementations, the avoided crossings are based on a pair of Rydberg electronic states when dressed by two or more RF electromagnetic fields (e.g., the combined RF electromagnetic field 514). The pair of Rydberg electronic states may correspond, for example, to the first and second Rydberg electronic states 534a, 534b described in relation to FIGS. 5B-5C. In some implementations, generating the value includes determining the avoided crossings using a Jaynes-Cummings model that represents a response of the vapor 504 to the combined RF electromagnetic field 514.

In some implementations, the example system 500 includes a communication channel 524a between the control system 520 and the laser system 506. The communication channel 524a may be defined, for example, by a wired connection (e.g., an Ethernet connection) or a wireless connection (e.g., a WiFi connection). The example system 500 may also include a power channel (e.g., an electrical power cable) between the control system 520 and the laser system 506. In these implementations, the control system 520 may be configured to control the laser system 506, thereby allowing the control system 520 to control an optical property of one or more of the laser signals 508 generated by the laser system 506. Such control may include altering or maintaining the optical property, and examples of the optical property include an amplitude (e.g., an intensity), a frequency, a polarization, and a phase of the one or more laser signals 508. Combinations of optical properties are possible.

In implementations where the example system 200 includes the RF source 516, the example system 500 may include a communication channel between the control system 520 and the RF source 516. The communication channel may be defined, for example, by a wired connection (e.g., an Ethernet connection) or a wireless connection (e.g., a WiFi connection). The example system 500 may also include a power channel (e.g., an electrical power cable) between the control system 520 and the RF source 516. Moreover, the control system 520 may be configured to control the RF source 516, thereby allowing the control system 520 to control a property of the reference RF electromagnetic field 514a generated by the RF source 516. Such control may include altering or maintaining the property, and examples of the property include an amplitude (e.g., an intensity), a frequency, a polarization, and a phase of the reference RF electromagnetic field 514a. Combinations of properties are possible. Such control may also allow the control system 520 to selectively match the reference RF electromagnetic field 514a to a target RF transition of the vapor 504, such as an RF transition of the vapor 504 that the perturbing RF electromagnetic field 514b is expected to interact with.

In some implementations, the example system 500 includes a communication channel 524b between the control system 220 and the optical detection system 518. The communication channel 524b may be defined, for example, by a wired connection (e.g., an Ethernet connection) or a wireless connection (e.g., a WiFi connection). The example system 500 may also include a power channel (e.g., an electrical power cable) between the control system 520 and the optical detection system 518. In these implementations, the control system 220 may be further configured to control the optical detection system 518, thereby allowing the optical detection system 518 to measure one or more target properties of the optical signal 512. Such control may include controlling optical elements of the optical detection system 518 to select a target optical property of the optical signal 512. Such control may also include controlling one or more photodetectors, each configured to measure a different target optical property.

In some implementations, the control system 520 includes a computer that provides a user interface 526 for the example system 500. Examples of the computer include a desktop computer, a workstation, a server, a laptop, a tablet, a mobile device, and so forth. The user interface 526 is configured to allow a user of the example system 500 to view and manipulate data representing properties of one or both of the reference RF electromagnetic field 514a and the perturbing RF electromagnetic field 514b. However, other functionality is possible (e.g., controlling the laser system 506, the RF source 516, and the optical detection system 518; displaying information related to the laser system 506, the RF source 516, and the optical detection system 518; etc.). In some implementations, the optical detection system 518 is configured to generate analog signals and the control system 520 is configured to convert the analog signals into digital signals for processing. In these implementations, the control system 520 may include circuits for parallel processing of the digital signals (e.g., FPGAs, ASICs, GPUs, etc.).

During operation of the example system 500, the probe and coupling laser signals 508a, 508b may interact with the vapor 504 of the vapor cell sensor 502. The combined RF electromagnetic field 514 also interacts with the vapor 504 of the vapor cell sensor 502. In response, the vapor cell sensor 502 generates the optical signal 512. For example, the probe laser signal 508a may exit the vapor 504 after the probe laser signal 508a, the coupling laser signal 508b, and the combined RF electromagnetic field 514 interact with the electronic states of the vapor 504. As such, the optical signal 512 may be based on the transmission of the probe laser signal 508a through the vapor 504. In some instances, the electronic states of the vapor correspond to those described in relation to FIG. 5A. In some instances, the electronic states of the vapor correspond to those described in relation to FIG. 5B. Other electronic states are possible.

During operation of the example system 500, the control system 520 may also tune the coupling laser signal 508b relative to a coupling optical transition of the vapor 504. In doing so, the control system 520 may instruct the laser system 506 to alter a frequency of the coupling laser signal 508b, thereby altering a difference between the frequency of the coupling laser signal 508b and a frequency of the coupling optical transition. If the resulting difference is non-zero, the coupling laser signal 508b may be "detuned" relative to the frequency of the coupling optical transition. In some implementations, the coupling optical transition may correspond to the second optical electronic transition 536b described in relation to FIG. 5A.

The control system 520 may additionally tune the reference RF electromagnetic field 514a relative to an RF transition of the vapor 504. The RF transition may, for example, be a target RF transition of the vapor 504 that the perturbing RF electromagnetic field 514b is expected to interact with. In some implementations, the RF transition corresponds to the RF transition 538 described in relation to FIGS. 5A-5B.

In tuning reference RF electromagnetic field 514a, the control system 520 may instruct the RF source 516 to alter one or more properties of the reference RF electromagnetic field 514a. For example, the control system 520 may instruct the RF source 516 to alter a frequency of the reference RF electromagnetic field 514a, thereby altering a first difference between the frequency of the reference RF electromagnetic field 514a and a frequency of the RF transition. If the resulting frequency difference is non-zero, the reference RF electromagnetic field 514a may be "detuned" relative to the frequency of the RF transition. As another example, the control system 520 may instruct the RF source 516 to alter an amplitude of the reference RF electromagnetic field 514a. As still yet another example, the control system 520 may instruct the RF source 516 to alter a phase of the reference RF electromagnetic field 514a, thereby altering a second difference between the phase of the reference RF electromagnetic field 514a and a reference phase. The reference phase may, in certain instances, be generated by a reference clock of the example system 500. In some implementations, the control system 520 tunes the reference RF electromagnetic field 514a independently of the coupling laser signal 508b. However, in other implementations, the RF electromagnetic field 514 and the coupling laser signal 508b are tuned simultaneously.

The control system 520 may additionally generate transmission data based on the optical signal 512. The transmission data represents the transmission of the probe laser signal 508a through the vapor 504 as one or both of the coupling laser signal 508b and the RF electromagnetic field 514 are tuned by the control system 520 and while the combined RF electromagnetic field 514 interacts with the vapor 504. In some implementations, the probe laser signal 508a has a frequency that is matched to (e.g., is resonant or near resonant with) a frequency of a probe optical transition of the vapor 504. In some implementations, the probe optical transition corresponds to the first optical electronic transition 536a described in relation to FIGS. 5A-5B.

The control system 520 may also generate a value that represents a property of the perturbing RF electromagnetic field 514b. The value is based on the transmission data and avoided crossings that are induced by the combined RF electromagnetic field 514 on Rydberg electronic states of the vapor 504. Examples of the property include an amplitude, a frequency, a polarization, and a phase of the perturbing RF electromagnetic field 514b. In some implementations, the avoided crossings are based on a pair of Rydberg electronic states when dressed by two or more RF electromagnetic fields (e.g., the combined RF electromagnetic field 514). The pair of Rydberg electronic states may correspond, for example, to the first and second Rydberg electronic states 534a, 534b described in relation to FIGS. 5B-5C. In some implementations, generating the value includes determining the avoided crossings using a Jaynes-Cummings model that represents a response of the vapor 504 to the combined RF electromagnetic field 514. Examples of the Jaynes-Cummings model and its application to the dressed electronic states of Rydberg atoms or molecules are discussed further below.

In some implementations, the example system 500 is operated without the perturbing RF electromagnetic field 514b present. In these implementations, the combined RF electromagnetic field 514 may include only the reference RF electromagnetic field 514a, and the operations of the control system 520 allow the example system 500 to generate reference data that represents an energy spectrum of the reference RF electromagnetic field 514a. The reference data may be based on the values generated by the control system 520 as one or both of the coupling laser signal 508b and reference RF electromagnetic field 514a are tuned. The control system 520 may then store the reference data to allow for the properties of a perturbing RF electromagnetic field to be determined at a later point in time (e.g., the perturbing RF electromagnetic field 514b).

In some implementations, the coupling laser signal 508b includes two or more components that interact with respective coupling optical transitions of the vapor 504. For example, the coupling laser signal 508b may include first and second coupling laser signals that interact with the vapor 504. In these cases, the vapor 504 (or coupling optical transition thereof) may include first and second coupling optical transitions, such as the second and third optical electronic transitions 536b, 536c described in relation to FIG. 5C. Moreover, a frequency of the first coupling laser signal may be matched to (e.g., be resonant or near resonant with) a frequency of the first coupling optical transition, and a frequency of the second coupling laser signal may be matched to (e.g., be resonant or near resonant with) a frequency of the second coupling optical transition.

In these implementations, the control system 520 may tune the first coupling laser signal relative to the first coupling optical transition. In doing so, the control system 520 may instruct the laser system 506 to alter a frequency of the first coupling laser signal, thereby altering a difference between the frequency of the first coupling laser signal and a frequency of the first coupling optical transition. If the resulting difference is non-zero, the first coupling laser signal may be "detuned" relative to the frequency of the first coupling optical transition. In some implementations, the control system 520 may also tune the second coupling optical laser signal in a manner analogous to that of the first coupling optical signal. Such tuning may be independent of, or together with, the tuning of the first coupling laser signal.

In some implementations, the perturbing RF electromagnetic field 514b may be at or near resonant with the RF transition of the vapor 504. In some implementations, the reference and perturbing RF electromagnetic fields 514a, 514b have respective amplitudes that are different from each other. For example, the amplitude of the reference RF electromagnetic field 514a may be greater in magnitude than the amplitude of the perturbing RF electromagnetic field 514b. Alternatively, the amplitude of the perturbing RF electromagnetic field 514b may be greater in magnitude than the amplitude of the reference RF electromagnetic field 514a. Such amplitude differences may cause changes in the optical signal 512 that can assist the control system 520 in generating the value that represents the property of the perturbing RF electromagnetic field 514b. For example, the optical signal 512 may include an EIT spectrum whose profile splits in response to RF electromagnetic fields interacting with the vapor 504. Such splitting can increase or decrease when the RF intensity (e.g., the Rabi frequency) is, respectively, increased or decreased. Examples of amplitude differences and their effects are described further below.

In some implementations, the example system 500 is used to determine the properties of multiple perturbing RF electromagnetic fields 514b (e.g., RF2, RF3, RF4, etc.). For example, the combined RF electromagnetic field 514 may include a second perturbing RF electromagnetic field. In these cases, the second perturbing RF electromagnetic field also interacts with the vapor 504, and as such, its presence may alter the avoided crossings, inducing a second set of avoided crossings on the Rydberg electronic states of the vapor 504. The original set of avoided crossings may therefore be associated with only the reference RF electromagnetic field 514a and the first perturbing RF electromagnetic field 514b while the second set of avoided crossings is associated with the reference RF electromagnetic field 514a, the first perturbing RF electromagnetic field 514, and the second perturbing RF electromagnetic field. In some implementations, the second perturbing RF electromagnetic field is at or near resonant with the RF transition of the vapor.

In these implementations, the control system 520 generates a second value that represents a property of the second perturbing RF electromagnetic field. The second value is based on the transmission data and the second set of avoided crossings. In some implementations, the second set of avoided crossings are based on a pair of Rydberg electronic states when dressed by two or more RF electromagnetic fields (e.g., the combined RF electromagnetic field 514). The pair of Rydberg electronic states may correspond, for example, to the first and second Rydberg electronic states 534a, 534b described in relation to FIGS. 5B-5C. In some implementations, generating the second value includes determining the second set of avoided crossings using a Jaynes-Cummings model that represents a response of the vapor 504 to the combined RF electromagnetic field 514.

Rydberg vapor-based sensors have seen growing interest for a range of applications in metrology and radio frequency (RF) field sensing. Accessibility to transition frequencies from sub-GHz to sub-THz makes these sensors suitable for calibration-free measurements over a wide range of RF frequencies. For example, the properties of an unknown RF field, resonant with a pair of Rydberg states, may be estimated by observing Autler-Townes (AT) splitting. A second RF field, slightly detuned, can then be applied to a Rydberg vapor-based sensor to address the same pair of Rydberg states. The stronger of the two fields acts as a target field while the weaker one acts as a perturbing RF field (e.g., an interfering RF field). In certain situations, however, the target field can be a control field and the weaker field may be the target field. Taking the former picture, the target field splits the EIT feature into two AT peaks. The perturbing RF field can produce additional peaks and splittings for various detunings and field strengths. The emergence of these additional spectral features is the result of harmonic and subharmonic resonances that can be explained by the doubly dressed Jaynes-Cummings model. The atoms or molecules act as a medium for the exchange of RF excitations between the two RF fields.

In some implementations, the Jaynes-Cummings model may provide an understanding of RF dressing that allows the recovery of self-calibration when measuring RF fields, including measuring an off-resonant perturbing RF field. Off-resonant sensing can, in certain cases, be achieved by other means, e.g., by tuning the transition frequencies using a DC field, but these cases have not demonstrated SI-traceability. With the Jaynes-Cummings model, perturbing and target signals can be measured with SI-traceability.

Studies have been conducted of two-level atoms starting from the ground state and interacting with two optical fields. However, these studies may not address an understanding of a perturbing RF field in Rydberg vapor-based sensors. Work on Rydberg atoms in two RF fields for sensing applications has been done, but the focus in these cases is on treating the two fields analogous to a classical RF mixer. Although these approaches are valid for certain specific range of parameters, a general response of a Rydberg vapor-based sensor to a bichromatic field is more complicated. As such, models derived from these studies (or described therein) do not support the use of a Rydberg vapor-based sensor to make a self-calibrated measurement of the bichromatic field.

To understand Rydberg sensors in a bichromatic RF field, experiments can be conducted, and their results compared to numerical calculations of the Rydberg EIT system coupled to two RF fields. The experimental data, analytical expressions, and numerical calculations demonstrate a calibration-free RF sensing of the target and perturbing field. An understanding of the results is obtained by adopting a multiply dressed Jaynes-Cummings model. The results are not limited to two fields but can be generalized to multiple RF fields via a multi-mode Jaynes-Cummings model.

Figure 6A:
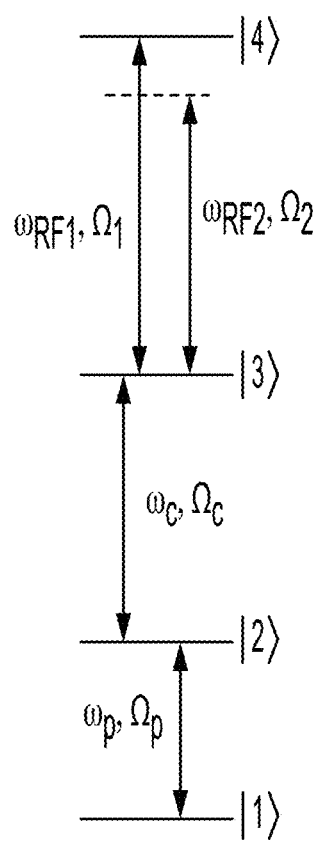
FIG. 6A is a schematic diagram of an example four-level system of electronic transitions.
Figure 6B:
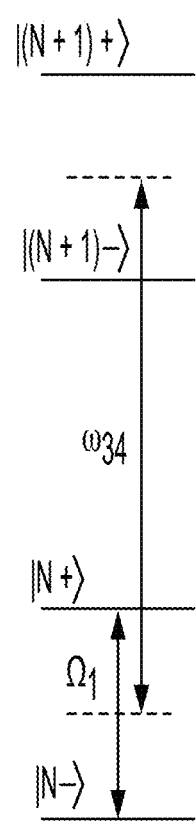
FIG. 6B is a schematic diagram of an example singly-dressed system that shows only the single photon Jaynes-Cummings states for the electronic states |3⟩ and |4⟩ in FIG. 6A.

FIG. 6A presents a schematic diagram of an example four-level system of electronic transitions. The example four-level system may experience a bichromatic RF electromagnetic field (e.g., RF1 and RF2). The example four-level system, which may correspond to a four-level EIT scheme, includes four RF-dressed electronic states that are at progressively higher energy levels. The four RF-dressed electronic states define two optical transitions and an RF transition. For example, the example four-level system may include a probe optical transition ($\omega_p$) defined by electronic states $|1\rangle$ and $|2\rangle$ and a coupling optical transition ($\omega_c$) defined by electronic states $|2\rangle$ and $|3\rangle$. The example four-level system also includes two RF electromagnetic fields (RF1 and RF2) that interact with an RF transition defined by electronic states $|3\rangle$ and $|4\rangle$. In FIG. 6A, electronic states $|3\rangle$ and $|4\rangle$ are Rydberg electronic states. FIG. 6A depicts electronic state $|4\rangle$ as higher in energy than electronic state $|3\rangle$. However, in certain cases, electronic state $|4\rangle$ is lower in energy than electronic state $|3\rangle$. FIG. 6B presents a schematic diagram of an example singly-dressed system that shows only the single photon Jaynes-Cummings states for the electronic states $|3\rangle$ and $|4\rangle$ in FIG. 6A. In FIG. 6B, the energy levels of the electronic states $|3\rangle$ and $|4\rangle$ are represented by dashed lines. Moreover, $\omega_{34}$ in FIG. 6B corresponds to the frequency (e.g., energy difference) between the electronic states $|3\rangle$ and $|4\rangle$.

Figure 6C:
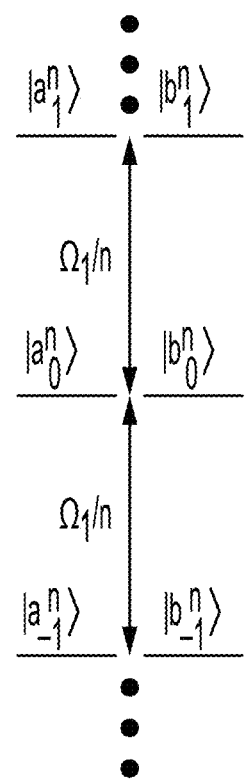
FIG. 6C is a schematic diagram of an example doubly-dressed system based on the example four-level system of FIG. 6A.
Figure 6D:
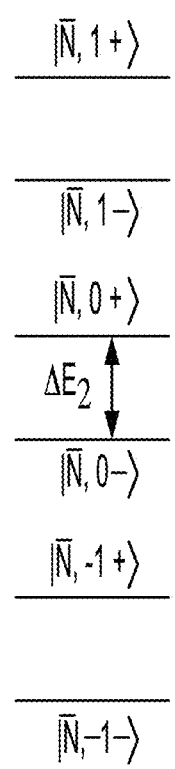
FIG. 6D is a schematic diagram of an example coupled basis that is derived from the example doubly-dressed system of FIG. 6C.

FIG. 6C presents a schematic diagram of an example doubly-dressed system based on the example four-level system of FIG. 6A. The example doubly-dressed system includes a basis of electronic states, $|a_m^n\rangle$ and $|b_m^n\rangle$, that are described by Eq. (6) below. The basis represents the electronic states $|3\rangle$ and $|4\rangle$ when dressed by the bichromatic RF field (e.g., RF1 and RF2). In the doubly-dressed system, n=−1 and the uncoupled dressed states are degenerate. FIG. 6D presents a schematic diagram of an example coupled basis that is derived from the example doubly-dressed system of FIG. 6C. In FIG. 6D, the doubly dressed states of FIG. 6C are represented in the coupled basis with a combined photon number, $\overline{N}$=N+M. The electronic states of FIG. 6D are labeled using bracket notation, which can be represented by $|\overline{N}\, n\pm\rangle$. In this bracket notation, $\overline{N}$ represents the overall number of photons; n is the difference in photon number (e.g., −1, 0, 1, etc.) between the two fields of the bichromatic RF electromagnetic field; and "+" or "−" corresponds to the symmetric and asymmetric combinations of the $|a_m^n\rangle$ and $|b_m^n\rangle$ electronic states from FIG. 6C, respectively. The coupling of these latter states to the second RF electromagnetic field (RF2) splits the degenerate states by energy, $\Delta E_2$.

In FIGS. 6A-6D, the probe (p) and the coupling (c) beams are configured for Rydberg EIT. The energy spacing between the two Rydberg states, $|3\rangle$ and $|4\rangle$, is in the RF range. A bichromatic field can be realized by addressing the two Rydberg levels with two near resonant RF fields. One of the RF fields, the in-band field, RF1, is kept on resonance while the other field, the out-band field, RF2, is kept a few tens of MHz away from the resonance. The total Hamiltonian that governs the 4-level system is described as H=$H_A$+$H_{RF1}$+$H_{RF2}$, where $H_A$ denotes the bare atom Hamiltonian interacting with the probe and the coupling beams. $H_{RF1}$ and $H_{RF2}$ describe the two RF fields interacting with the atom. The coupling strengths for the transitions are $\Omega_p$, $\Omega_c$, $\Omega_1$, and $\Omega_2$ and the detunings are $\Delta_p$=$\omega_{12}$−$\omega_p$, $\Delta_c$=$\omega_{23}$−$\omega_c$, $\Delta_1$=$\omega_{34}$−$\omega_{RF1}$, and $\Omega_2$=$\omega_{34}$−$\omega_{RF2}$.

In some implementations, the total Hamiltonian that governs the 4-level system interacting with the probe, coupling, RF1, and RF2 fields can be represented by Equation (1):

$$H = \hbar \begin{bmatrix} 0 & \frac{\Omega_p}{2} & 0 & 0 \\ \frac{\Omega_p}{2} & -\Delta_p & \frac{\Omega_c}{2} & 0 \\ 0 & \frac{\Omega_c}{2} & -\Delta_p - \Delta_c & \frac{\Omega_1 + e^{-S(t)}\Omega_2}{2} \\ 0 & 0 & \frac{\Omega_1 + e^{+S(t)}\Omega_2}{2} & -\Delta_p - \Delta_c - \Delta_1 \end{bmatrix}. \quad (1)$$

where $\Delta_p$=$\omega_{12}$−$\omega_p$, $\Delta_c$=$\omega_{23}$−$\omega_c$, and $\Delta_1$=$\omega_{34}$−$\omega_{RF1}$ are, respectively, the detunings of the probe, coupling, and RF1 fields from the corresponding transition frequencies, $w_{ij}$(i, j∈[1,2,3,4]). The relative phase may be chosen to equal zero, and in this case, the time dependent phase factor, S(t)=2π$\Delta_t$t where $\Delta_2$=$\omega_{34}$−$\omega_{RF2}$, is the detuning of the RF2 field. The coupling strengths for the transitions are the Rabi frequencies, $\Omega_p$, $\Omega_c$, $\Omega_1$, and $\Omega_2$.

The dynamics of the system can be calculated using Liouville's equation, $\dot{\rho}$=i/$\hbar$[$\rho$,H]+$\mathcal{L}$($\rho$), where $\mathcal{L}$=$\mathcal{L}_{decay}$+$\mathcal{L}_{tt}$+$\mathcal{L}_{laser}$ is the Lindblad operator. The three terms account for, respectively, the atomic decay rate, the transit time broadening and the laser dephasing rate, respectively. A steady state solution may be obtained by numerically solving the Liouville's equation. The thermal velocity distribution can be averaged over to match the experiment, which is at room temperature.

An example experimental setup includes a Cs vapor cell with counter-propagating probe and coupling laser beams. In this setup, the probe beam is tuned to the D2 transition, $\lambda_p$=852 nm, and the coupling laser is tuned to address the 56$D_{5/2}$ transition at $\lambda_c$=509 nm. The RF fields are incident on the vapor cell from an orthogonal direction and address the 56$D_{5/2}$ to 57$P_{3/2}$ transition of Cs. RF1 and RF2 are emitted from the same antenna in order to maximize the field overlap. The polarization of the two laser beams and the RF sources are linear and aligned in parallel. In many cases, the D-to-P transition can be split without any residual uncoupled transition probability in the presence of RF1 alone. Two probe transmission peaks are observed when the coupling laser is detuned across the resonance.

Figure 7A:
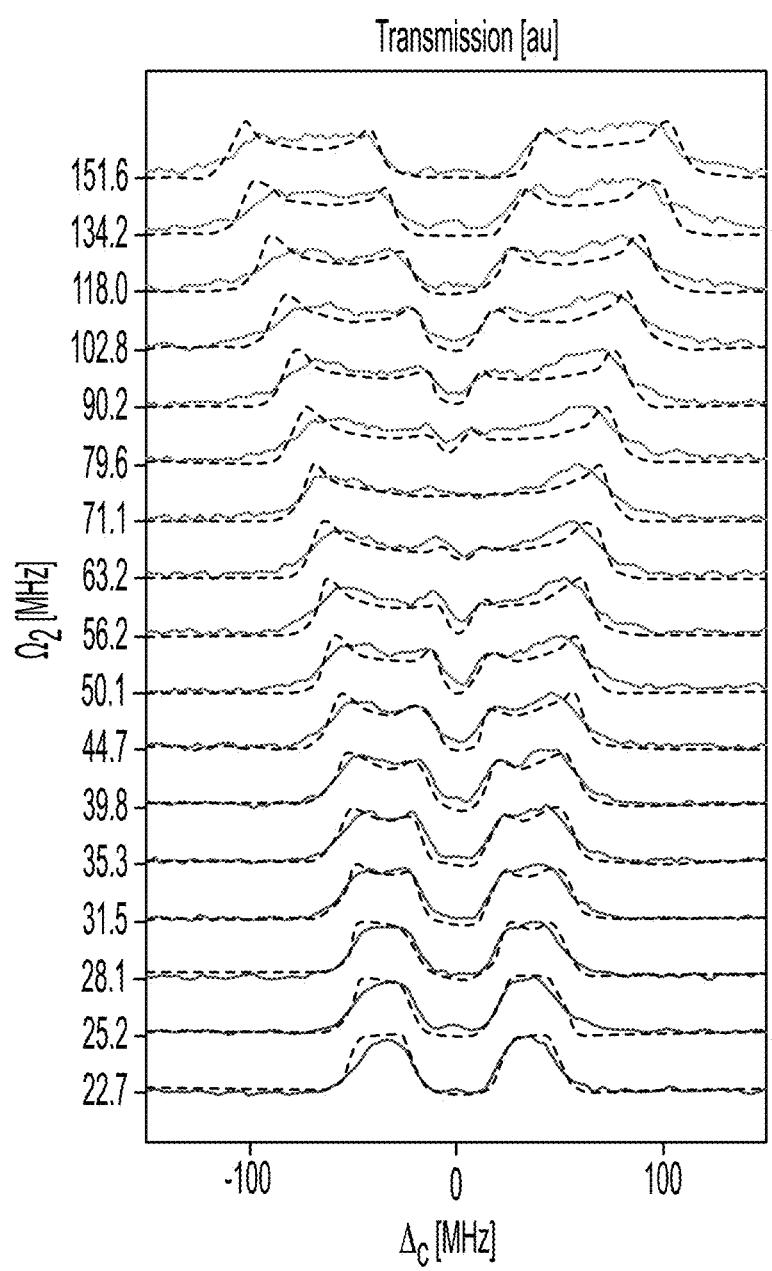
FIGS. 7A-7D are respective graphs of example transmission data for various $\Omega_2$ scans and calculations.
Figure 7B:
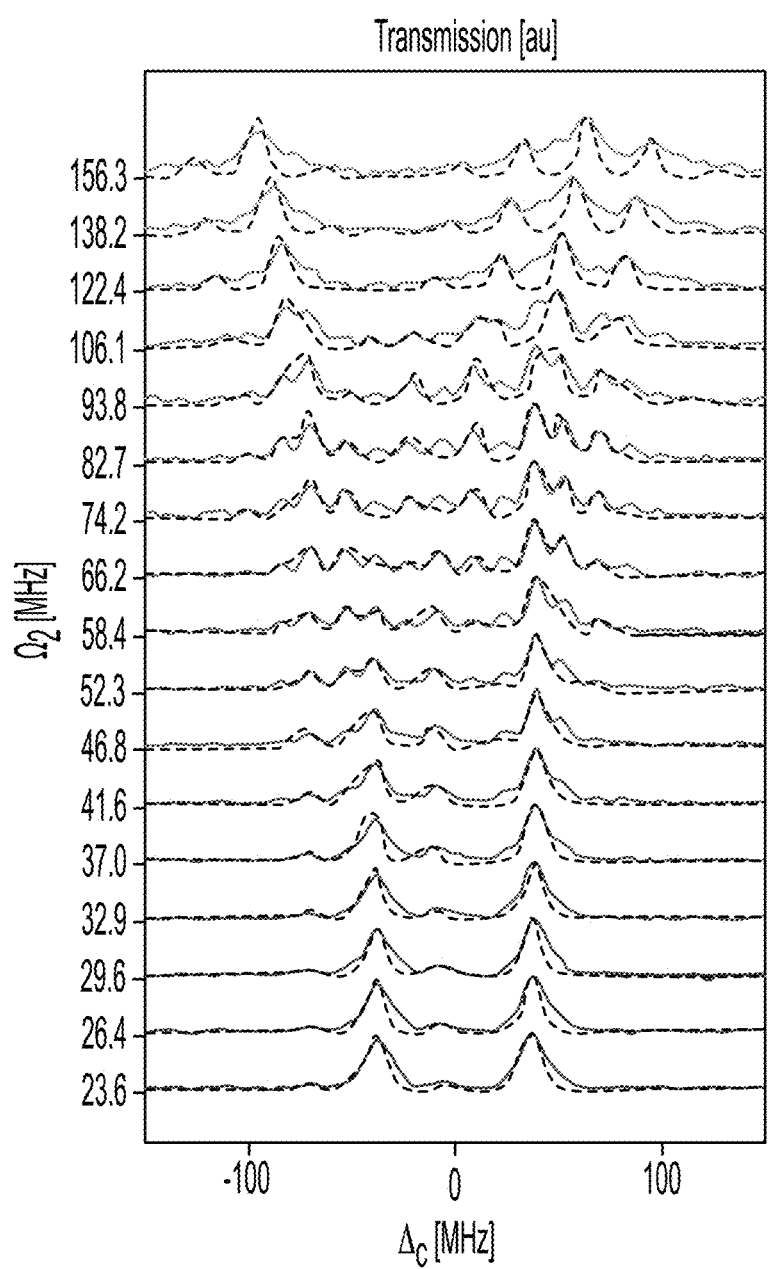
Figure 7C:
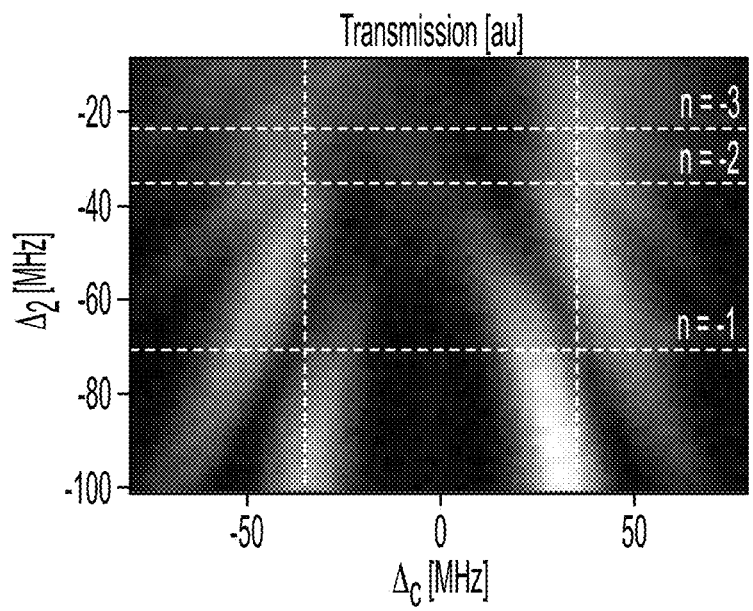
Figure 7D:
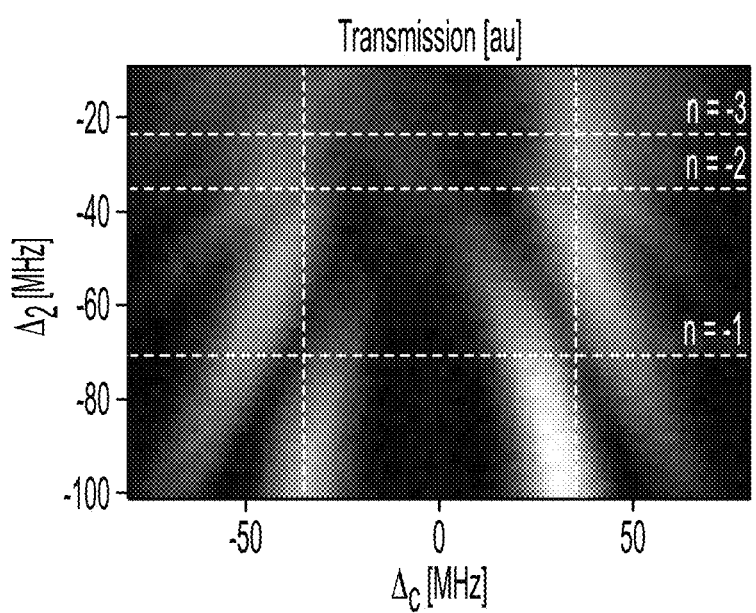

Calculated results show good agreement with experimental data from the example experimental setup, which is shown by FIGS. 7A-7D. The out-band power, $\Omega_2$, is varied for different out-band detunings, $\Delta_2$. Small deviations of the data relative to the calculations can arise from inhomogeneous and stray electric DC and RF fields. FIGS. 7A-7D present respective graphs of example transmission data (solid lines) for various 222 scans and calculations (dashed lines). In FIG. 7A, $\Omega_2$=−1 MHz, and in FIG. 7B, $\Omega_2$=−30 MHz. FIG. 7C presents a contour graph showing the experimental data for a $\Delta_2$ scan at $\Omega_1$=74.5 MHz, and FIG. 7D presents a contour graph showing the calculated data for the $\Delta_2$ scan at $\Omega_1$=74.5 MHz. Multiple avoided crossings occur as $\Delta_1$ matches the harmonic and sub-harmonic conditions. The horizontal dashed lines in FIGS. 7C and 7D mark the values of n, $\Delta_2$=$\Omega_1$/n. The vertical dashed lines mark the singly dressed state Rabi splitting, $\pm\Omega_1/2$.

The spectra may be understood using a dressed state model where the two Rydberg states, $|3\rangle$ and $|4\rangle$, are dressed by the RF fields. The Rydberg states may be dressed first with RF1, which is on resonance, as represented by $\omega_{RF1}=\omega_{34}$. The RF1 dressed states are then dressed by RF2. The doubly dressed model can reveal the conditions for harmonic and sub-harmonic resonances.

The singly dressed states can be described by uncoupled atomic and photonic states, as represented below by Equation (2):

$$|N\pm\rangle = \frac{1}{\sqrt{2}}(|3, N\rangle \pm |4, N-1\rangle). \quad (2)$$

Here, $|r, N\rangle$ is comprised of the Rydberg states $|r\rangle$ (r=3, 4) and photon number state $|N\rangle$, with N being the number of excitations present in the RF1 field mode. The Hamiltonian of the Rydberg states interacting with RF1 is $H_1=H_0+H_{RF1}$, where:

$$H_1|N\pm\rangle = \hbar(N\omega_{34} \pm \Omega_1/2)|N\pm\rangle. \quad (3)$$

The dressed states, $|N+\rangle$ and $|N-\rangle$ form a ladder of doublets separated by $\omega_{34}$ with intra-doublet spacing $\Omega_1$, as shown in FIG. 6B.

The addition of RF2 can modify the RF1 Jaynes-Cumming ladder. For M excitations in RF2, the uncoupled doubly dressed states are $|N\pm, M\rangle$ with energy, $E\pm=\hbar(N\omega_{34}+\Omega_1/2+M\omega_{RF2})$. Exchange of RF2 excitations, m and m' with the singly dressed system, $|N+\rangle$ and $|N-\rangle$, results in states represented by Equation (4) below:

$$|+\rangle = |(N-m')+, M+m'\rangle, \quad (4)$$
$$|-\rangle = |(N-m)-, M+m\rangle.$$

Here, m' and m are, respectively, the excitation number loss (gain) from the singly dressed states and gain (loss) in the RF2 mode. The energies are as follows:

$$E_+ = \hbar[(N-m')\omega_{34} + \Omega_1/2 + (M+m')\omega_{RF2}], \quad (5)$$

$$E_- = \hbar[(N-m)\omega_{34} + \Omega_1/2 + (M+m)\omega_{RF2}].$$

In certain cases, the two states are degenerate, i.e., $E_+=E_-$. In these cases, the states cross when $\Delta_2=\Omega_1/n$, where n=m−m' is a non-zero integer. The expression indicates that for fixed n, $|+\rangle$ and $|-\rangle$ cross as a function of $\Delta_2$ and $\Omega_1$. It may be convenient to redefine the states by substituting m'=m−n to form the basis shown below by Equation (6):

$$|(N+n-m)+, M-n+m\rangle \equiv |a_m^n\rangle, \quad (6)$$
$$|(N-m)-, M+m\rangle \equiv |b_m^n\rangle.$$

The energy spacing between the ladder of these degenerate states is $\Omega_1/n$ for two adjacent m values, as shown in FIG. 6C.

The coupling between RF2 and the singly dressed states is captured by treating the interaction perturbatively. For $|n|=1$, the solution is straight forward. The interaction causes avoided energy level crossings with energy splitting, $$\Delta E_2 = \hbar \frac{\Omega_1}{2}\left[\left(\frac{2\delta}{\Omega_1} - \frac{1}{8}\left(\frac{\Omega_2}{\Omega_1}\right)^2\right)^2 + \left(\frac{\Omega_2}{\Omega_1}\right)^2\right]^{\frac{1}{2}}, \quad (7)$$

where $\delta=\Delta_2-\Omega_1/n$ is the detuning of RF2 from the harmonic resonance. The coupled, doubly dressed states are shown in FIG. 6D with energy splitting $\Delta E_2$. Eq. (7) has a minimum splitting of $\Omega_2$ when $\delta=\delta_{min}=\Omega_2^2/(16\Omega_1)$. Eq. (7) demonstrates that, for a detuning near the harmonic resonance (e.g., $\Delta_2 \sim \Omega_1/n$), the energy splitting of the two doublets can change with effective Rabi frequency, $\Omega'_2=\sqrt{\delta'^2+\Omega_2^2}/4$, where $\delta'=\delta-\delta_{min}$.

For Rydberg vapor-based RF field sensing, and as shown by the experimental and calculated data, the minimum splitting of the doubly dressed states can be invariant to the in-band RF1 field and only depends on the perturbative field resonant Rabi frequency. The intra-doublet splitting at the resonance is $\Delta E_2^{res}=\hbar\Omega_2/2$. The doubly dressed system can thus provide a calibration-free method to measure the power of the perturbative field. Furthermore, RF1 offers a knob to tune the resonance frequency for sensing the perturbative field, RF2. The shape of the avoided crossing can be used to determine SI traceable properties of RF2 and RF1. It is possible to use other sub-harmonic resonances and tune other parameters, like $\Delta_c$, to determine the properties of the RF fields.

In some implementations, when RF2 is applied, a set of different transmission peaks emerge as a function of $\Delta_c$. At $\Delta_2 \leq \Gamma$, where Γ is the EIT linewidth, the bichromatic EIT signal may be broadened as the RF2 power increases, as shown in FIG. 7A. The sum of the two fields produces an effective field that oscillates at the average frequency and has a slowly beating amplitude. For small detuning, the beat rate can achieve steady state. The total amplitude swings between the sum and difference of the two field amplitudes. When the two powers are equal, the minimum splitting reaches 0 MHz, as can be seen in FIG. 7A at $\Omega \sim$ 74.5 MHz. At larger RF2, the detuning dynamics can be different. In this case, the atoms see two different frequency components at any given time. The full picture requires a complete Hamiltonian with two RF components, as shown in FIG. 7B.

In the case of larger RF2 detunings, there is an interplay between the RF1 Rabi frequency and the RF2 detuning. Subharmonic resonances can occur when, $\Delta_2=\Omega_1/n$. FIGS. 7C and 7D show a comparison between the experimental results and the calculations. The avoided crossings occur at the resonance condition, e.g., for n=−1, −2. −3. The slight mismatch between the data and calculations can be attributed to broadening and shifts due to RF field inhomogeneity, stray fields, etc.

Figure 8A:
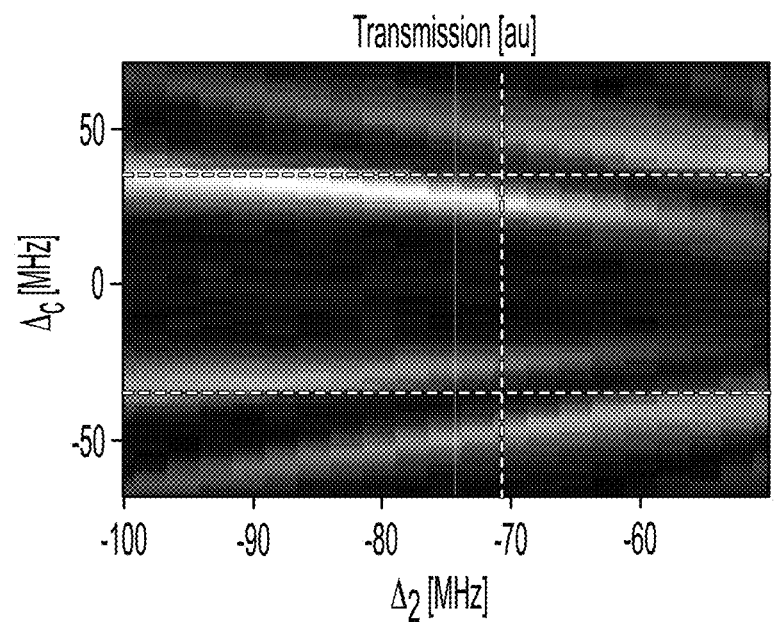
FIG. 8A is a contour map of an example spectra as a function of $\Delta_2$ with $\Omega_1$=70.6 MHz and $\Omega_2$=19.8 MHz.
Figure 8B:
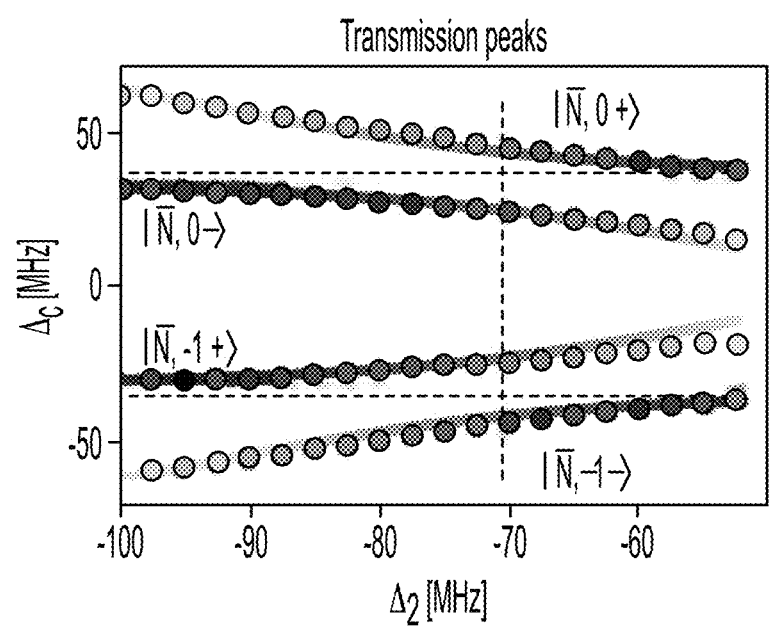
FIG. 8B is a graph of the transmission peaks of FIG. 8A.
Figure 8C:
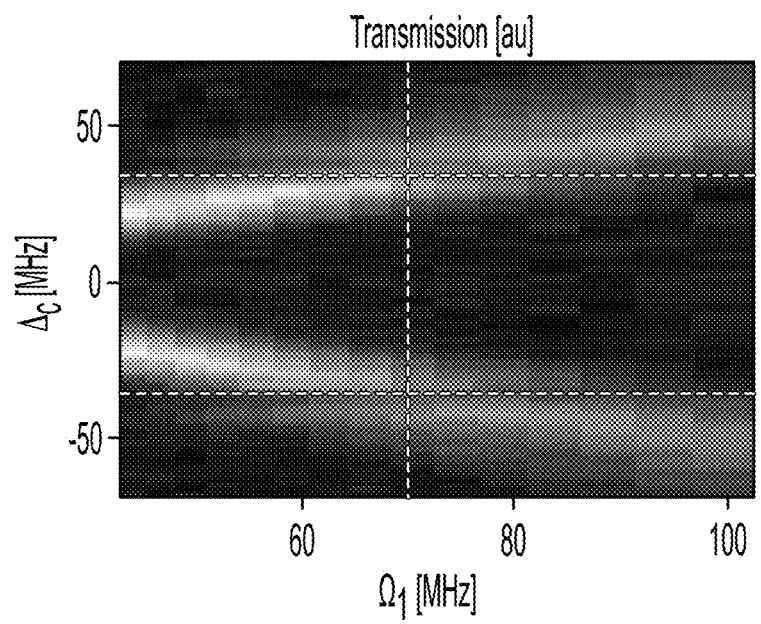
FIG. 8C is a contour map of an example spectra as a function of $\Omega_1$ with $\Delta_2$=−70.0 MHz and $\Omega_2$=12.5 MHz.
Figure 8D:
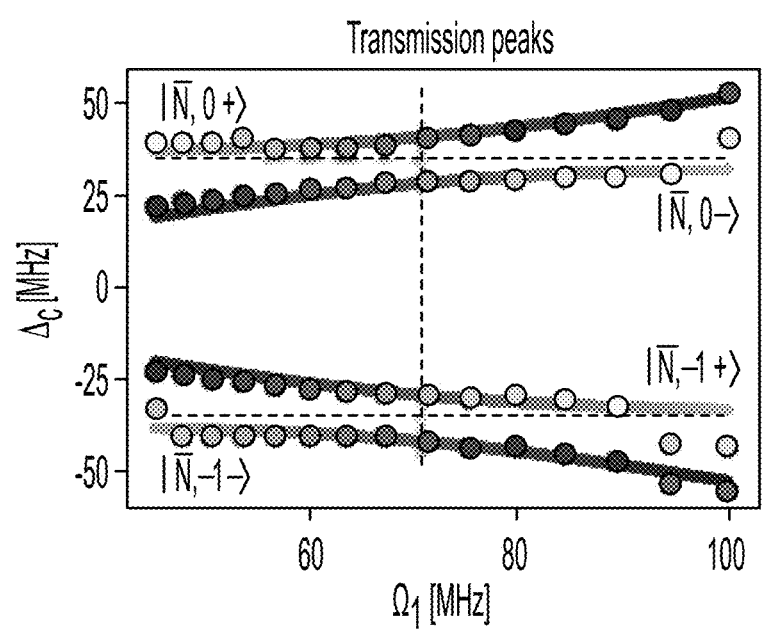
FIG. 8D is a graph of the transmission peaks of FIG. 8C.

A detailed analysis may be performed on the avoided crossing features near the first harmonic where n=−1. FIGS. 8A and 8C present respective contour maps of example spectra as a function of $\Delta_2$ and $\Omega_1$. In FIG. 8A, the contour map is a function of $\Delta_2$ with $\Omega_1$=70.6 MHz and $\Omega_2$=19.8 MHz. In FIG. 8C, the contour map is a function of $\Omega_1$ with $\Delta_2$=−70.0 MHz and $\Omega_2$=12.5 MHz. The peak positions of FIGS. 8A and 8C are plotted in respective FIGS. 8B and 8D, with the amplitude being represented by a color depth scale. The circles in FIGS. 8B and 8D are peak values obtained from the data. The lines overlay the avoided crossing model considering only the first harmonic resonance.

In FIGS. 8A-8D, two independent experiments are performed. First, $\Delta_2$ is scanned near $\Omega_1/n$, as shown by FIGS. 8A and 8B. Second, $\Omega_1$ is scanned near $\Delta_2$, as shown by FIGS. 8C and 8D. The two cases represent the scanning of the detuning, $\delta$, across 0 MHz in Eq. (7), thereby producing harmonic resonance conditions. The transmission peaks display avoided crossing features. The minimum splitting between the transmission peaks is equal to $\Omega_2/2$, as if RF2 is on resonance. The condition preserves SI-traceability. Additionally, the two cases estimate $\Omega_1$ and $\Delta_2$, respectively.

The sub-harmonic resonances can be utilized to obtain improved amplitude sensitivity of an off-resonant field by putting the dressed state energy level in resonance. An enhanced sensitivity for $\Omega_1$, $\Omega_2$, and $\Omega_2$ can be observed when $\Delta_2$ matches the harmonic resonance conditions. For example, the RF2 detuning may be set to −73 MHz, which is close to the RF1 Rabi frequency. RF power as low as −20 dBm can be detected, whereas in the off resonant case, the detection may be limited to −8 dBm, as shown in FIGS. 9A-9D. The spectral resolution of the pair of the peaks split by RF2 is plotted in FIG. 9D. The resolution may be represented by $R=2|\bar{x}_1-\bar{x}_2|/(\sigma_1+\sigma_2)$ where $\bar{x}_i$ and $\sigma_i$ with $i\in[1,2]$ are the mean and standard deviation. The resolution can be obtained by fitting a double Gaussian to each pair of split peaks. At R=1, the two peaks are separated by $\sigma_1+\sigma_2$. For R≥1, the peaks are resolved.

Figure 9A:
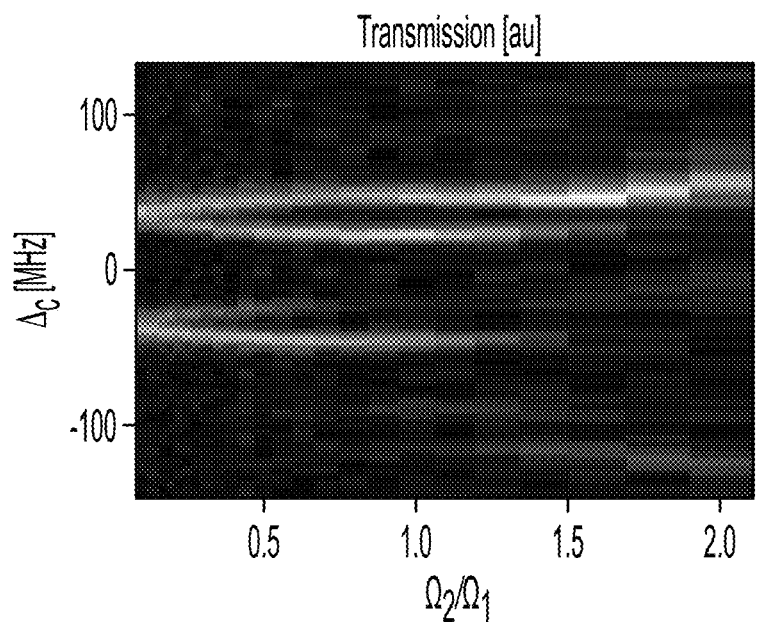
FIGS. 9A-9C are respective contour graphs of example $\Omega_2$ scans at various magnitudes of $\Delta_2$ with $\Omega_1$=72.9 MHZ.
Figure 9B:
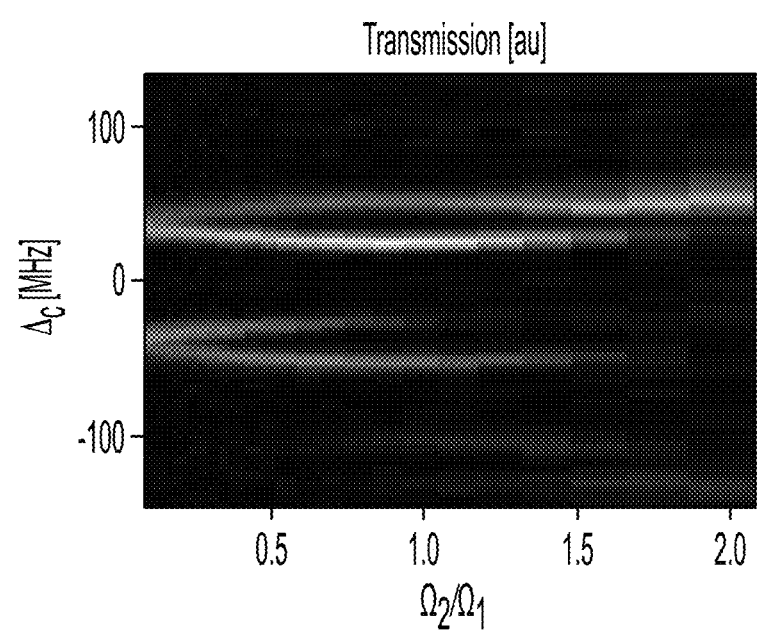
Figure 9C:
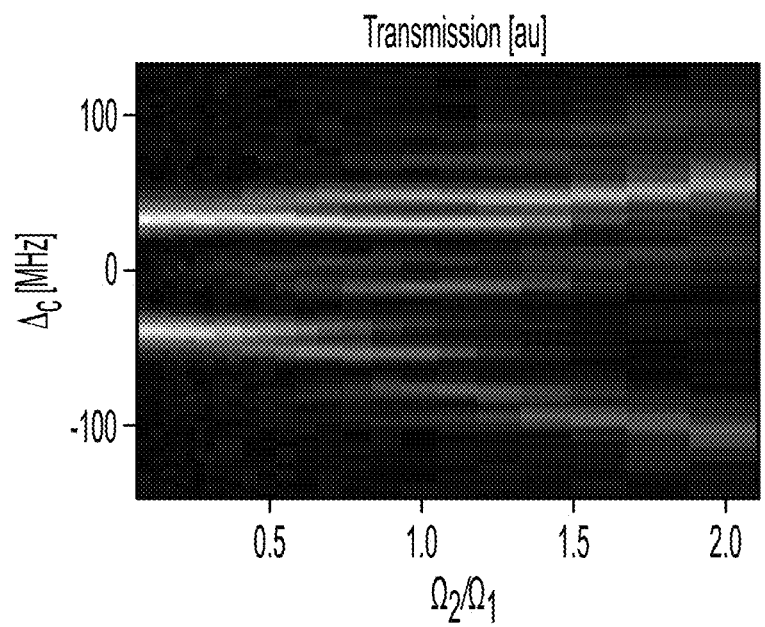
Figure 9D:
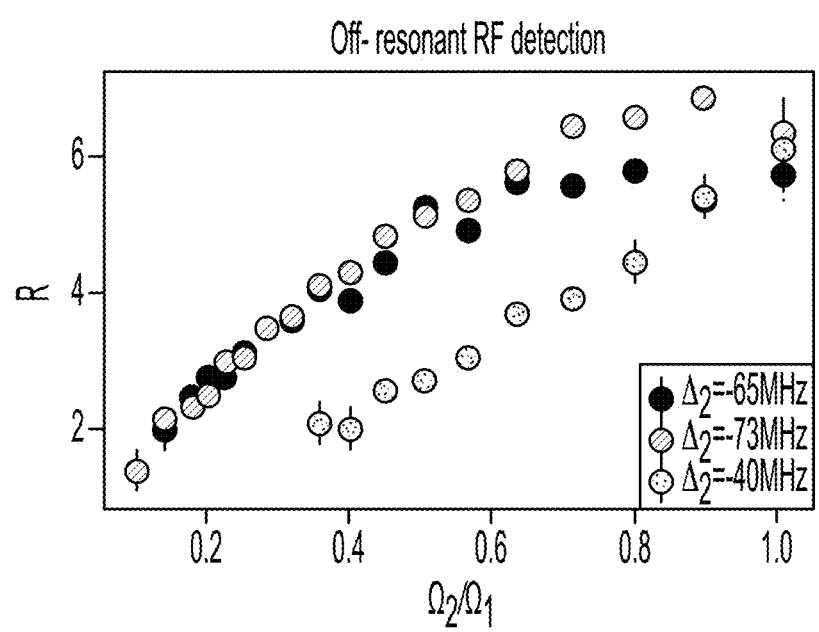
FIG. 9D is a graph of the average resolution, R, for each of the doublet pairs shown in FIGS. 9A-9C.

FIGS. 9A-9C present respective contour graphs of example $\Omega_2$ scans at various magnitudes of $\Delta_2$ with $\Omega_1$=72.9 MHz. The magnitude of $\Delta_2$ in FIGS. 9A-9C is −65 MHZ, −73 MHz, and −40 MHz, respectively. FIG. 9D presents the average resolution, R, for each of the doublet pairs shown in FIGS. 9A-9C. For these example $\Omega_2$ scans, the condition where $\Delta_2$=−73.0 MHz produces the best detectable peaks, which corresponds to an enhanced sensitivity of ~12 dB over the non-resonant condition. The RF1 field is about 11 mV/cm whereas the lowest detected RF2 field is about 1.1 mV/cm. The double peak near $\Delta_c$=0 MHz in FIG. 9C emerges as $\Delta_2\sim\Omega_1/n$ with n=−2.

In many implementations, the appearance of equal spaced doublets serves to indicate a double Rydberg state dressing. FIGS. 9A and 9B correspond to the condition where n~−1. The emergence of a doublet in the middle of the main AT peaks at $\Delta_c$=0 MHz fulfills the condition n~−2, as shown in FIG. 9C. For $\Omega_2<\Omega_1$, the doublet splitting increases with $\Omega_2$. When $\Omega_2/\Omega_1>1$, the doublet splitting starts to decrease. The effect results from the role reversal of the dressing fields. As $\Omega_2/\Omega_1>1$, the system of energy levels may first be dressed by RF2 and then by RF1. In the absence of RF1, the AT peaks would be asymmetric with peaks at $\Delta_c$~−50 MHz and $\Delta_c$~−100 MHz with AT splitting of ~150 MHz, as shown in FIGS. 9A and 9B. RF1 is shifted by +73 MHz from RF2 and fulfils the sub-harmonic condition with n~+2. Thus, a doublet peak near $\Delta_c$~−50 MHz emerges. The similar situation can be observed in FIG. 9C where $\Delta_1$ is shifted by 40 MHz from RF2. Near $\Omega_c$~ 100 MHZ, the sub-harmonic condition is fulfilled with n~+3, thus two doublet peaks emerge between the main AT peak splitting. When RF1 and RF2 have equal power, the combined field oscillates according to sin $((\omega_{34}-\Omega_2)t)$. The average frequency may be shifted to the center of the two bands, thus the observed AT doublets show asymmetric peak height.

Figure 10A:
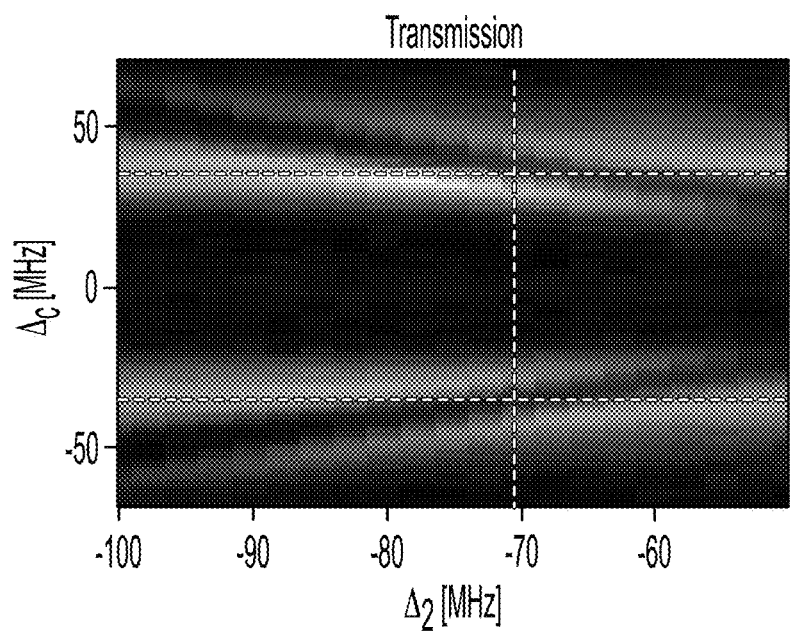
FIG. 10A is a contour graph of an example transmission map generated by scanning $\Delta_2$ and $\Delta_c$ with $\Omega_1$=70.56 MHz and $\Omega_2$=19.84 MHZ.
Figure 10B:
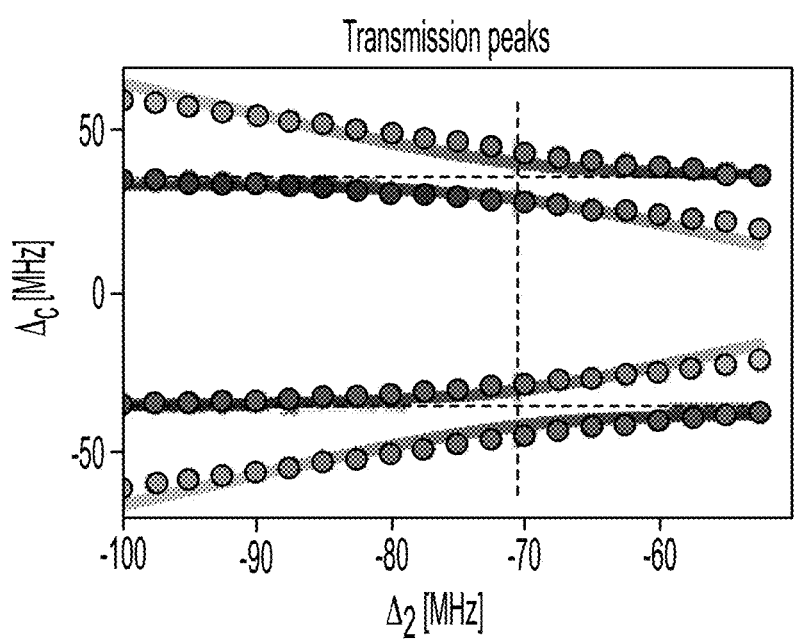
FIG. 10B is a graph showing the peak transmission positions from the example transmission map of FIG. 10A.

In some implementations, $\Delta_2$ may be scanned while keeping $\Omega_1$=70.56 MHz and $\Omega_2$=19.84 MHz. The corresponding peak transmission frequencies can be obtained by fitting a double Gaussian model to the scan data. FIG. 10A presents a contour graph of an example transmission map generated by scanning $\Delta_2$ and $\Delta_c$ with $\Omega_1$=70.56 MHz and $\Omega_2$=19.84 MHz. FIG. 10B presents a graph showing the peak transmission frequencies from the example transmission map of FIG. 10A. An avoided crossing model is plotted against the peak transmission data and is represented in FIG. 10B by dashed lines.

Figure 11A:
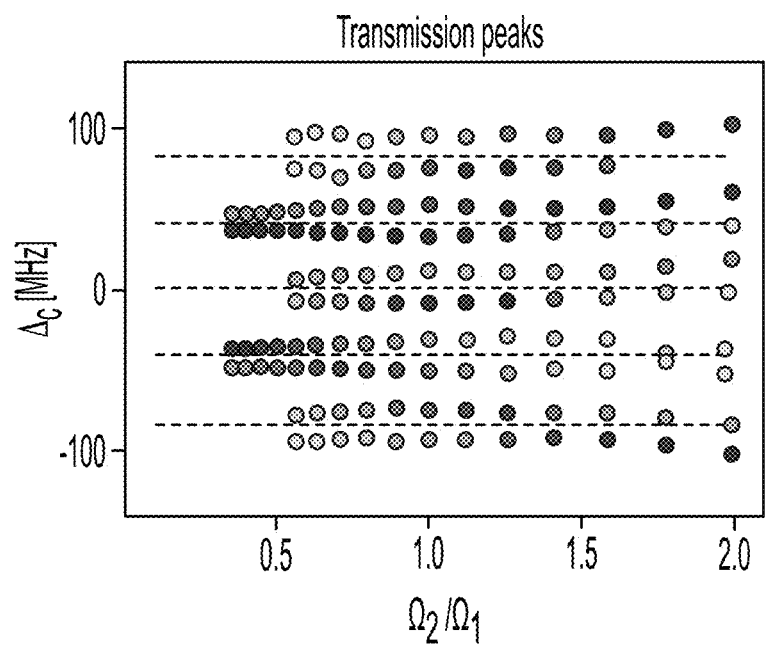
FIG. 11A is a graph of example peak transmission positions for double dressed states where $\Omega_1$=72.9 MHz and $\Omega_2$=−40 MHz.
Figure 11B:
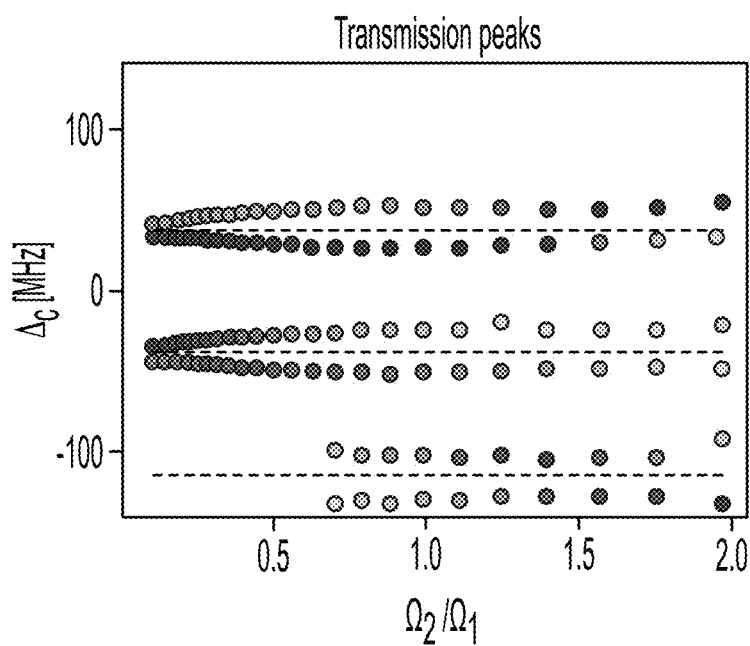
FIG. 11B is a graph of example peak transmission positions for double dressed states where $\Omega_1$=72.9 MHz and $\Omega_2$=−73 MHZ.

In some implementations, $\Omega_2$ may be scanned while keeping $\Omega_1$=72.9 MHz. Peak positions can be obtained by fitting a double Gaussian model to the data of the transmission map. The equally spaced doublets can show the energies of the doubly dressed states as well as their role reversal as RF2 becomes stronger than RF1. FIG. 11A presents a graph of example peak transmission positions for double dressed states where $\Omega_1$=72.9 MHz and $\Omega_2$=−40 MHz. FIG. 11B presents a graph of example peak transmission positions for double dressed states where $\Omega_1$=72.9 MHz and $\Omega_2$=−73 MHz.

Figure 12A:
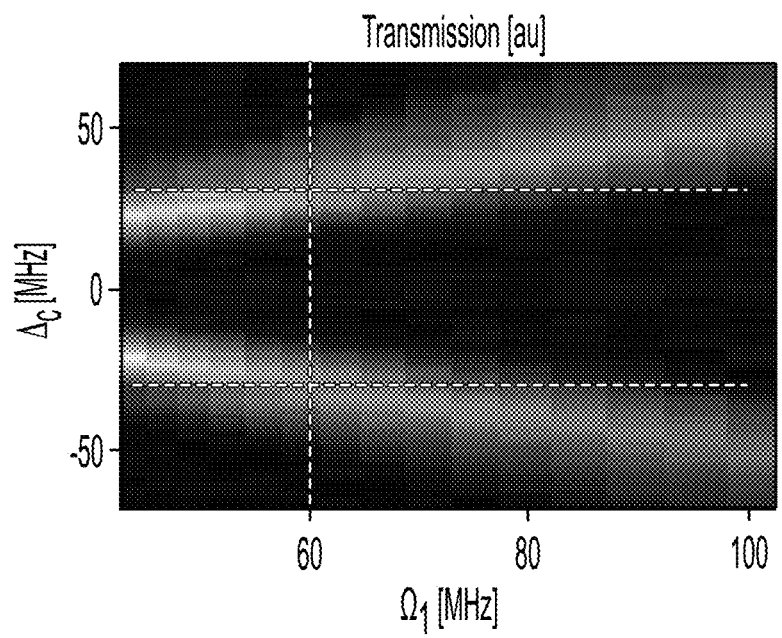
FIG. 12A is a contour map of an example RF1 Rabi frequency scan measurement near $\Delta_2$=$\Omega_1$/n for n=−1, $\Omega_1$=−60 MHz, and $\Omega_2$=7.1 MHZ.
Figure 12B:
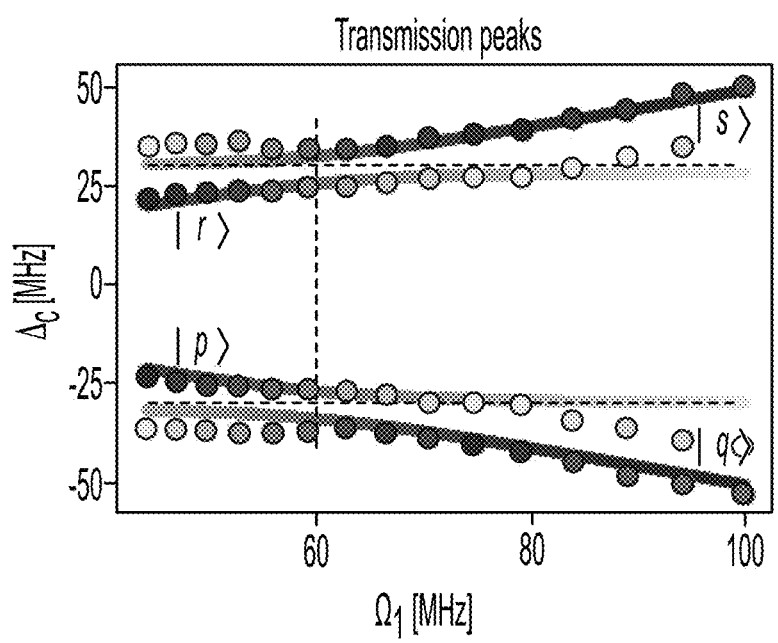
FIG. 12B is graph showing the peak transmission positions generated from the example measurement data of FIG. 12A.
Figure 12C:
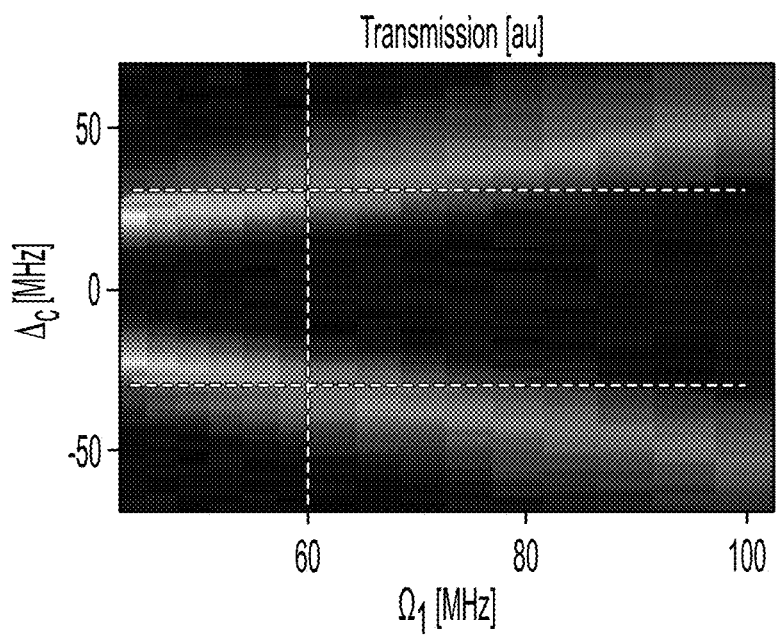
FIG. 12C is a contour map of an example RF1 Rabi frequency scan measurement near $\Delta_2$=$\Omega_1$/n for n=−1, $\Omega_1$=−60 MHz, and $\Omega_2$=8.9 MHz.
Figure 12D:
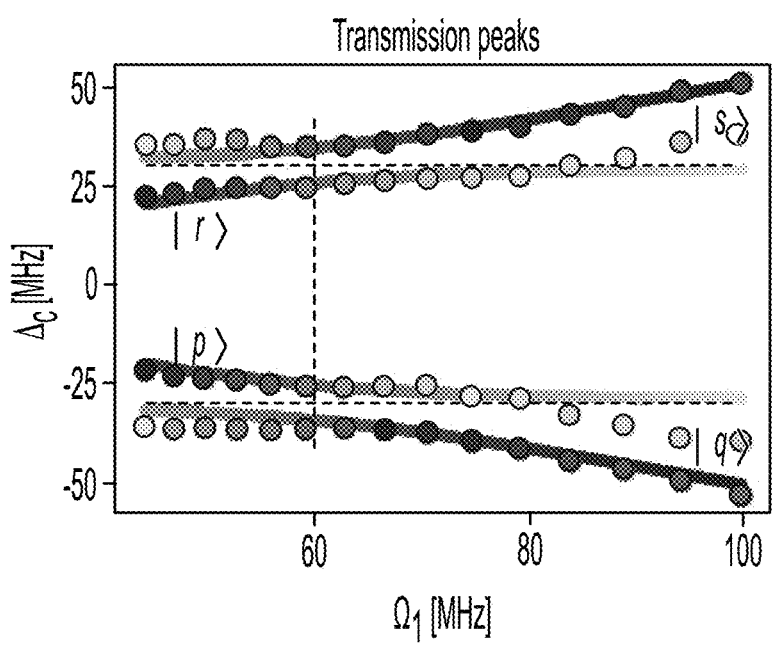
FIG. 12D is graph showing the peak transmission positions generated from the example measurement data of FIG. 12C.
Figure 12E:
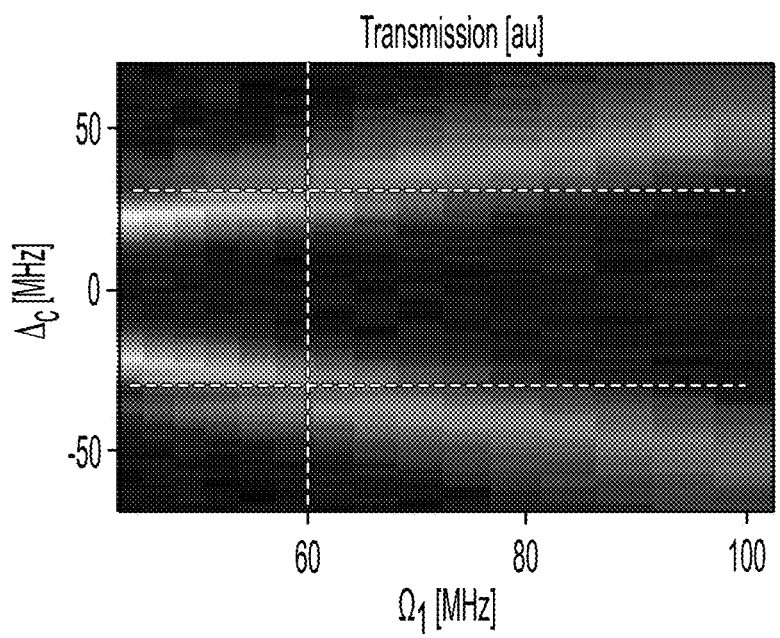
FIG. 12E is a contour map of an example RF1 Rabi frequency scan measurement near $\Delta_2$=$\Omega_1$/n for n=−1, $\Omega_1$=−60 MHz, and $\Omega_2$=12.5 MHZ.
Figure 12F:
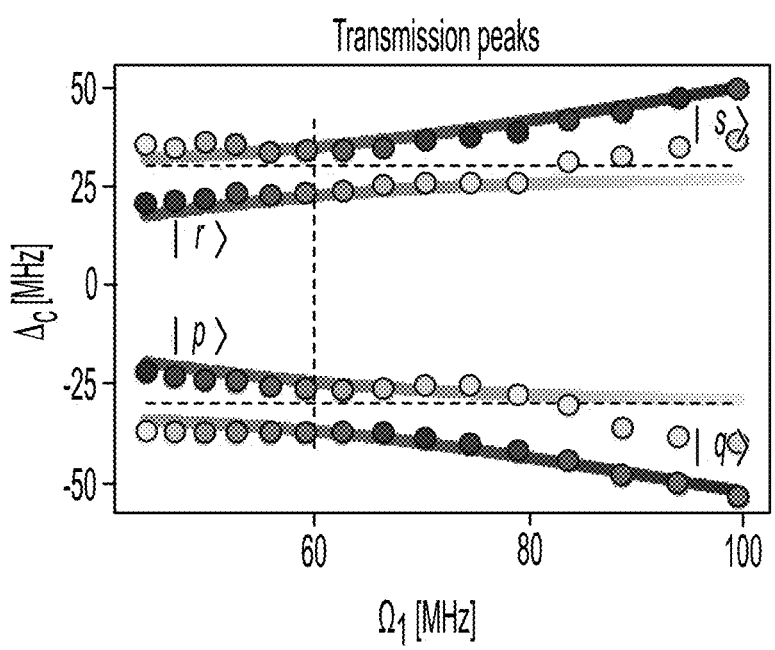
FIG. 12F is graph showing the peak transmission positions generated from the example measurement data of FIG. 12E.

In some implementations, $\Omega_2$ may be scanned while keeping $\Omega_1$=−60 MHz. Peak positions can be obtained by fitting a double Gaussian model to the data of the transmission map. FIGS. 12A, 12C, and 12E present respective contour maps of example RF1 Rabi frequency scan measurements near $\Delta_2=\Omega_1/n$ for n=−1 and $\Omega_1$=−60 MHz where $\Omega_2$=7.1 MHz, 8.9 MHz, and 12.5 MHz, respectively. The corresponding peak transmission positions in FIGS. 12B, 12D, and 12F are plotted with the amplitude shown in the color depth scale for the same parameters as the contour maps. The circles in these figures are peak values obtained from the experimental scan measurement data. The doubly dress states are $|p\rangle=|\bar{N}, -1+)$, $|q\rangle=|\bar{N}, -1-\rangle$, $|sr\rangle=|N, 0-\rangle$, and $|s\rangle=|\bar{N}, 0+\rangle$.

The experimental and calculated data demonstrate the suitability of the doubly dressed Jaynes-Cummings model to represent Rydberg states that are coupled to two near-resonant RF fields. The data show that the exchange of excitations between the two fields plays a notable role in revealing the spectral features. Moreover, double dressing features can be used to recover SI traceable RF-based sensing, and the Jaynes-Cummings model is utilized as an approach for measuring multiple RF fields by means of mapping avoided crossings. A modulated RF field contains multiple frequency components, and the model provides a way to obtain information associated with each frequency component of a modulated signal. The model may also allow for enhancing the sensitivity of a Rydberg atom-based sensor to a non-resonant RF field.

In some implementations, estimation of an unknown field, RF2, is carried out by control of a local RF field, RF1, which is set to resonance with the atomic Rydberg transition. The atomic Rydberg states coupled to RF1 can generate dressed states with energy splitting=$\hbar\Omega_1$. The RF1 field strength can thus provide a knob to control the energy levels of the dressed states. Resonance conditions occur when the shifted transition energy matches $\Delta_2$. Such conditions may be represented by Equation (8):

$$\Delta_2 = \pm(\Omega_1 + 1/16\Omega_2^2/\Omega_1). \tag{8}$$

Figure 13:
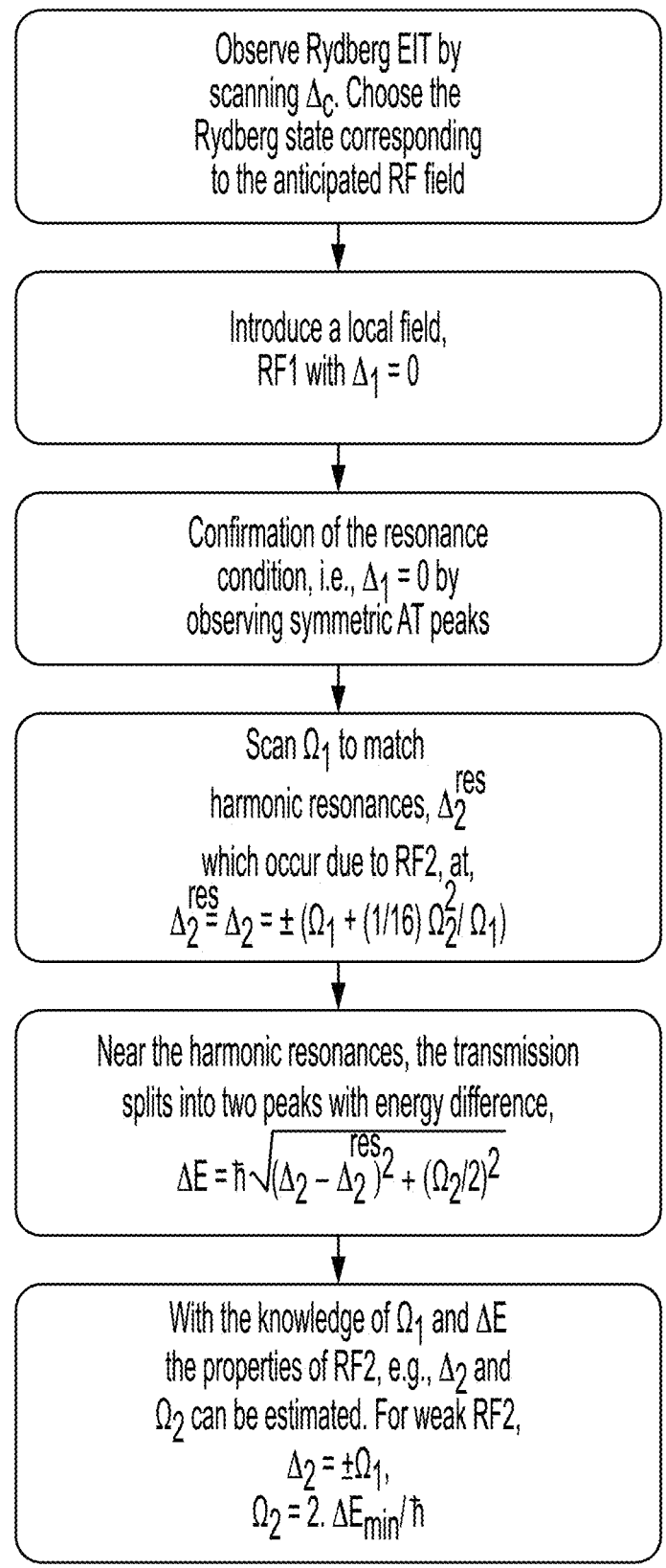
FIG. 13 is a flowchart of an example measurement process for determining $\Delta_2$ and $\Omega_2$ for an out-of-band RF field.
Figure 15A:
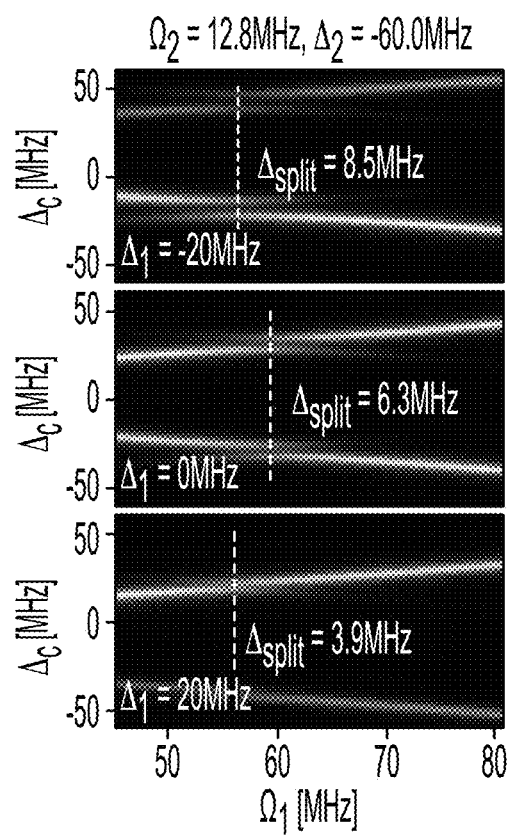
FIGS. 15A-15B are respective graphs of example transmission maps that are generated by scanning $\Omega_1$ and $\Delta_c$.
Figure 15B:
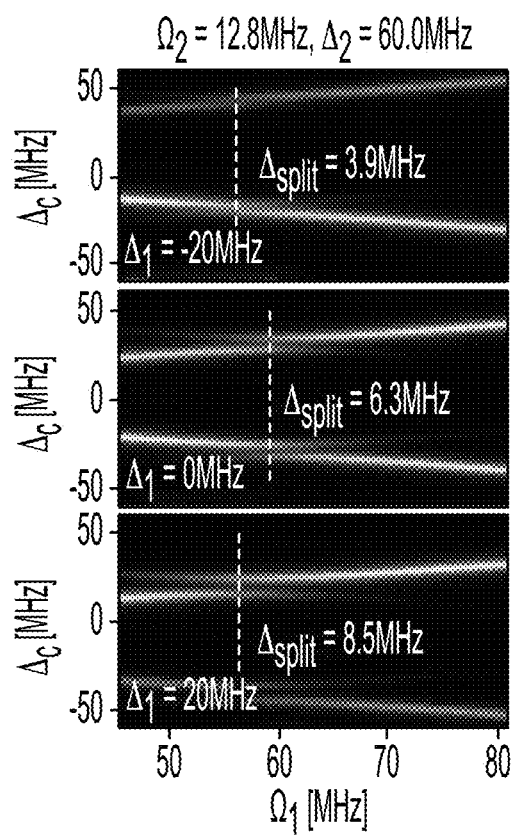

For weak RF2 field amplitudes, the resonance conditions can be approximated by $\Delta_2=\pm\Omega_1$. The sign of $\Delta_2$ can be obtained by observing the splitting for $\Delta_1\pm 0$. As illustrated in the contour map plots of FIGS. 15A and 15B, for $\Delta_1<0$, the minimum doublet splitting, $\Delta E_{min}$, increases if $\Delta_2>0$ and decreases if $\Delta_2<0$. Similarly, for $\Delta_1>0$, $\Delta E_{min}$ increases if $\Delta_2<0$ and decreases if $\Delta_2>0$, as shown in the table of FIG. 14. The table in FIG. 14 shows the dependence of the minimum energy splitting, $\Delta E_{min}$, for different conditions of $\Delta_1$ and $\Delta_2$. The harmonic resonance can be further utilized for estimating the RF2 field strength. For $\Delta_1=0$, $\Delta E_{min}=\hbar\Omega_2/2$. By measuring the doublet splitting, the power and detuning of the RF2 field can then be estimated. FIG. 13 presents a flowchart of an example measurement process for determining the detuning, $\Delta_2$, and the power, $\Omega_2$, of the out-of-band RF field, RF2. The example measurement process may include, for example, measuring $\Delta_2$ and $\Omega_2$ by scanning $\Delta_c$ and $\Omega_1$ for a fixed $\Delta_1=0$.

Figure 16A:
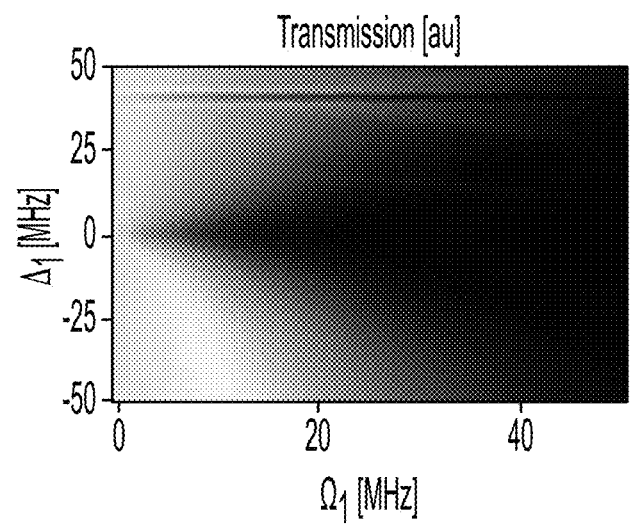
FIGS. 16A-16B are respective graphs of example probe transmission maps that are generated by scanning $\Omega_1$ and $\Delta_1$ at $\Delta_c$=0 MHZ.
Figure 16B:
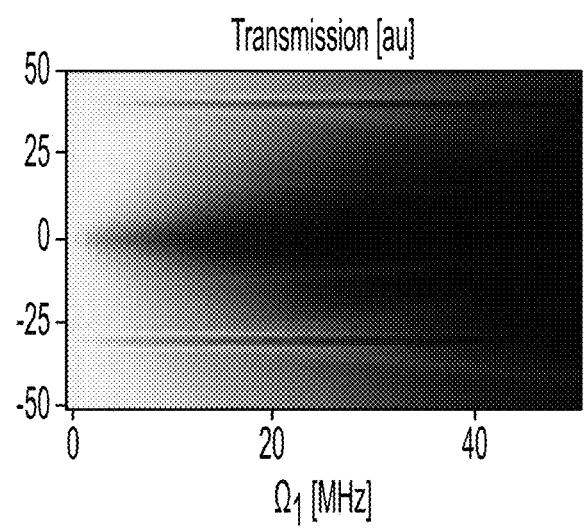

In a second approach to estimate $\Omega_2$ and $\Delta_2$, a transmission map is generated as a function of $\Omega_1$ and $\Delta_1$, while keeping $\Delta_c$ fixed. At first, we estimate $\Delta_2$ by setting $\Delta_c=0$ MHz, as shown in FIG. 16A. The influence of RF2 on the probe transmission at $\Delta_1=40$ MHz can clearly be seen. The transmission dip occurs when $\Delta_1=\Delta_2$ as a result of interference between the two fields. Extending the approach further, we can detect several out-band frequency components together, as shown in FIG. 16B. This approach paves a way for all-optical detection of multiple RF components at the same time. The effect of the relative phase is discussed further below.

Figure 17A:
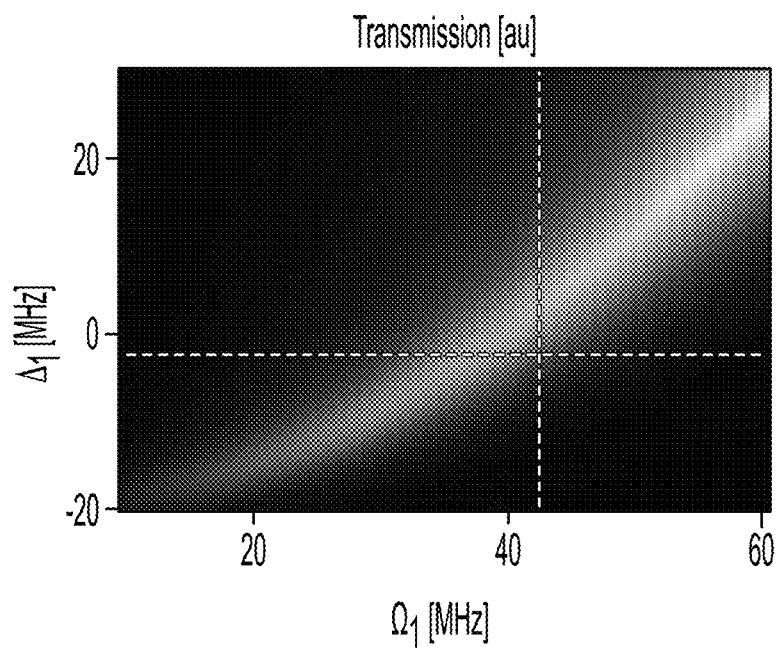
FIGS. 17A-17D are respective graphs of example probe transmission maps that are generated by scanning $\Omega_1$ and $\Delta_1$ at $\Delta_c$=20 MHZ.

The RF dressed atom picture may be further utilized to estimate $\Delta_2$. As $\Omega_1$ is increased, the dressed state energy level starts to diverge. To observe these states $\Delta_c$ is set to a non-zero detuning. As $\Omega_1$ is increased, the dressed state energy level crosses $\Omega_c$. It is an alternative process of observing atomic spectra: $\Delta_c$ is kept fixed and the energy level is scanned. The transmission profile is plotted in FIG. 17A where $\Omega_1$ and $\Delta_1$ are scanned at $\Delta_c=20$ MHz. The transmission peak occurs when $\Delta_c=E\pm$, where $E\pm=(\Delta_1\pm\sqrt{\Delta_1^2+\Omega_1^2})/2$ are the dressed state energy levels.

Figure 17B:
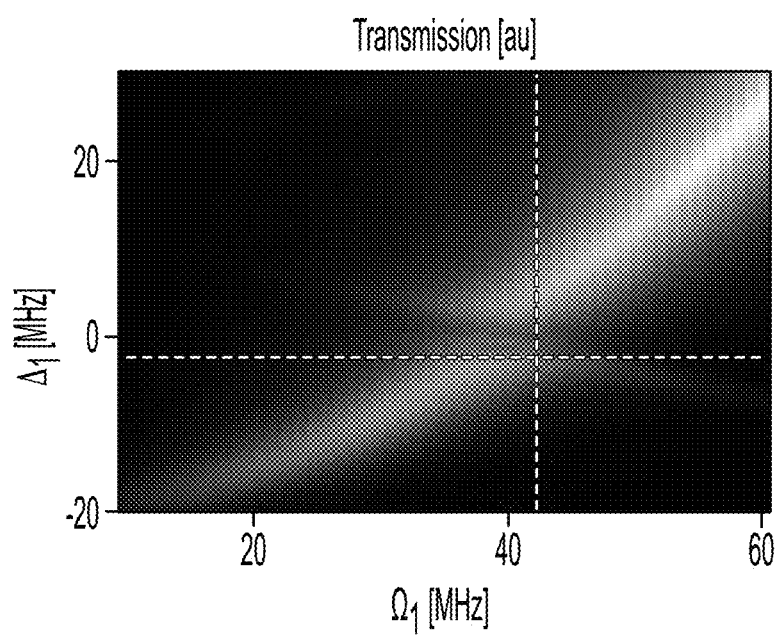
Figure 17C:
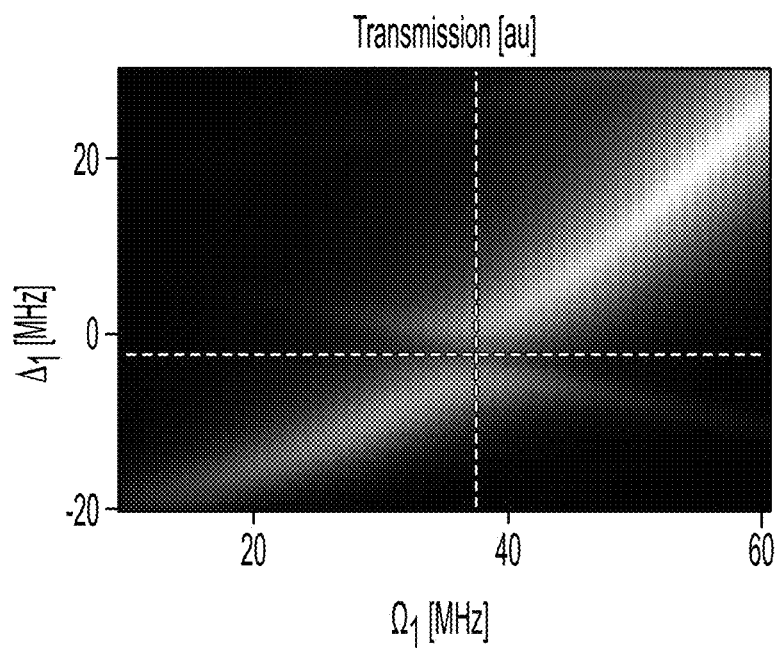
Figure 17D:
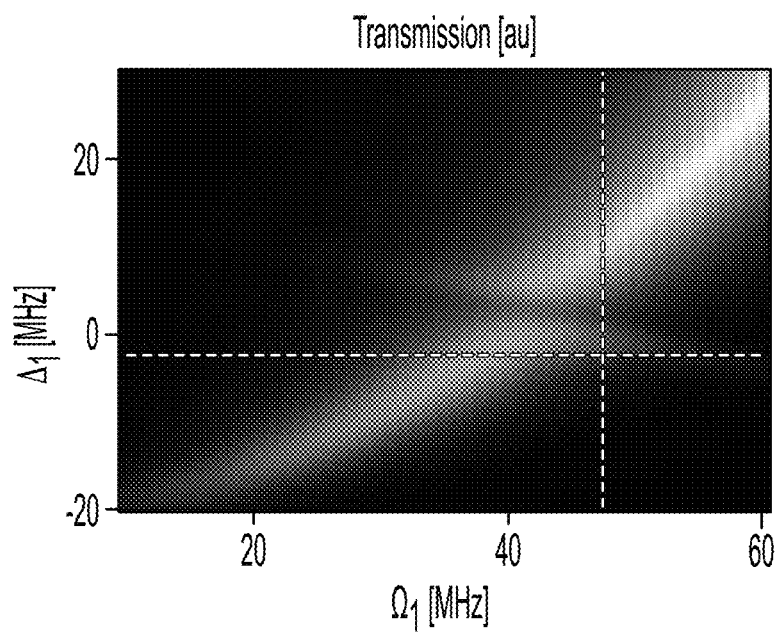

For $\Omega_2>0$ at certain $\Delta_1$ and $\Omega_1$ the singly dressed energy level matches the RF2 detuning, $\Delta_2$. As a result, the energy state splits into a doublet, as shown in FIGS. 17B-17D. The relation between $\Delta_2$, $\Delta_c$ and $\Delta_1$ where the avoided crossing occurs, i.e., $\Delta_1^{crossing}$ is, $$\Delta_2 = 2(\Delta_1^{crossing} + \Delta_c). \tag{9}$$

Thus, by knowing $\Delta_1^{crossing}$ and $\Delta_c$, the RF2 detuning, $\Delta_2$, can be estimated. For $\Delta_c=\Delta_2/2=20$ MHz the avoided crossing occurs at $\Delta_1=0$ MHz, as shown in FIG. 17B. This approach of measuring $\Delta_2$ proves its utility as RF1 and RF2 do not have the same frequency, therefore measurements do not get affected by the relative phase. In certain cases, $\Delta_2$ may be set to different frequencies near 40 MHz. FIGS. 17C and 17D show cases where $\Delta_2=35$ MHz and $\Omega_2=45$ MHz. The avoided crossing (grey lines) occurs at shifted positions as explained by Eq. (9). The two methods discussed here demonstrate ways to estimate $\Delta_2$.

Figure 18A:
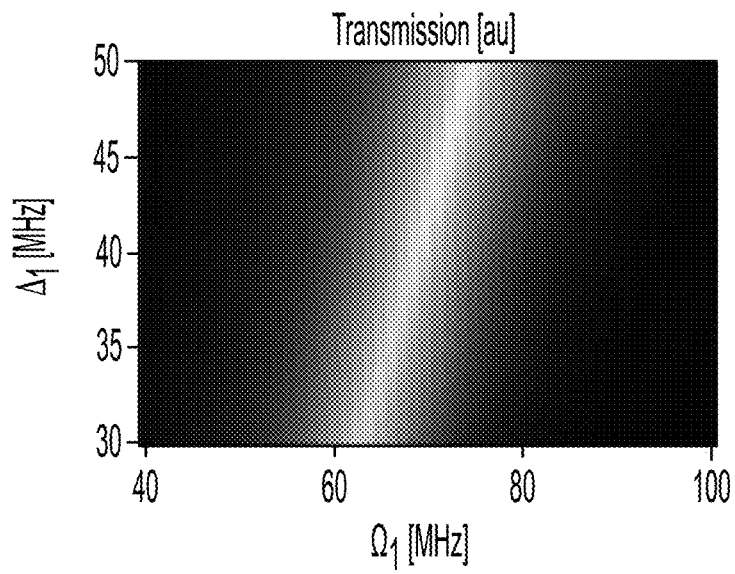
FIGS. 18A-18E are respective graphs of example probe transmission maps that are generated by scanning $\Omega_1$ and $\Delta_1$ at $\Delta_c$=20 MHz for $\Delta_2$=40 MHZ.
Figure 18B:
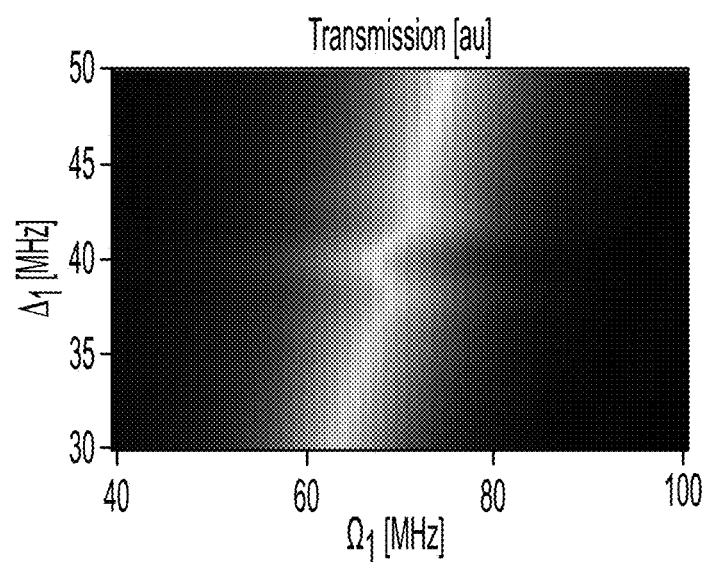
Figure 18C:
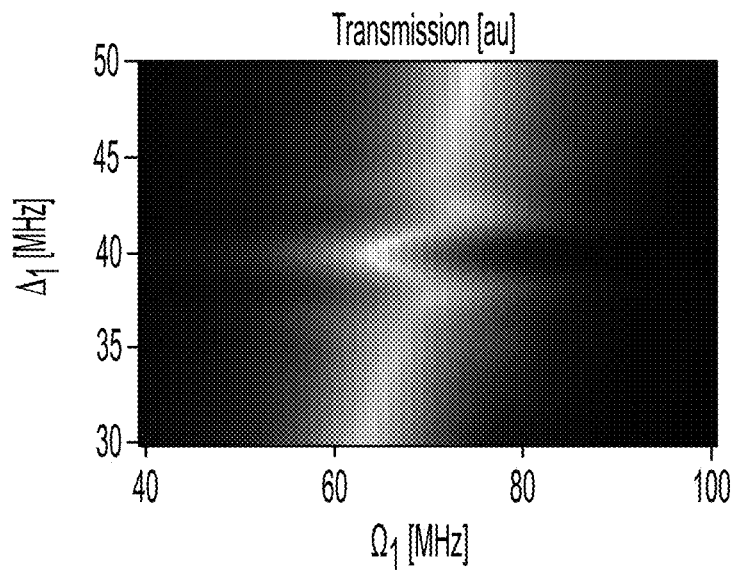
Figure 18D:
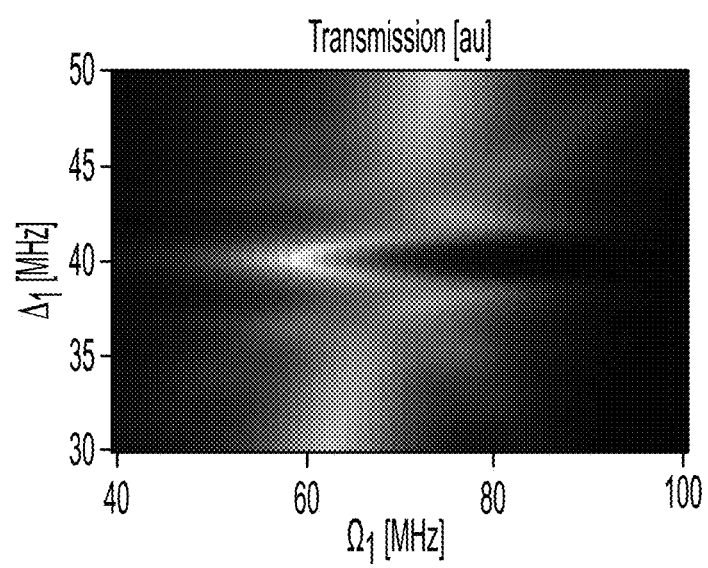
Figure 18E:
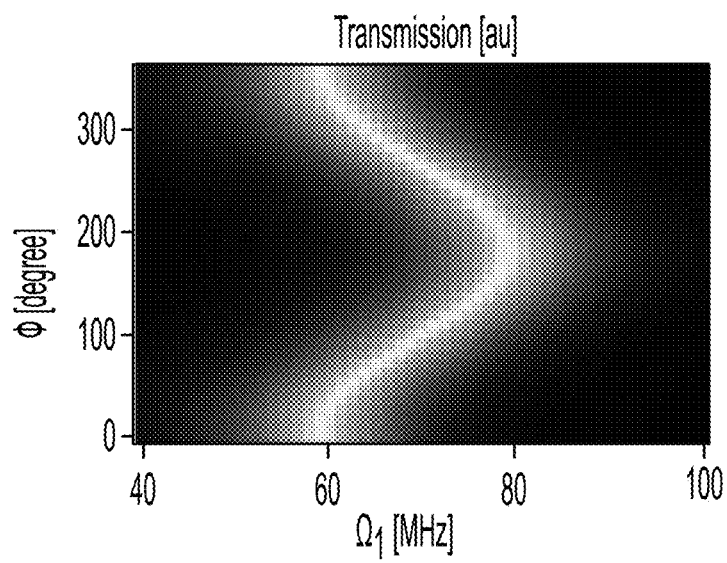
Figure 18F:
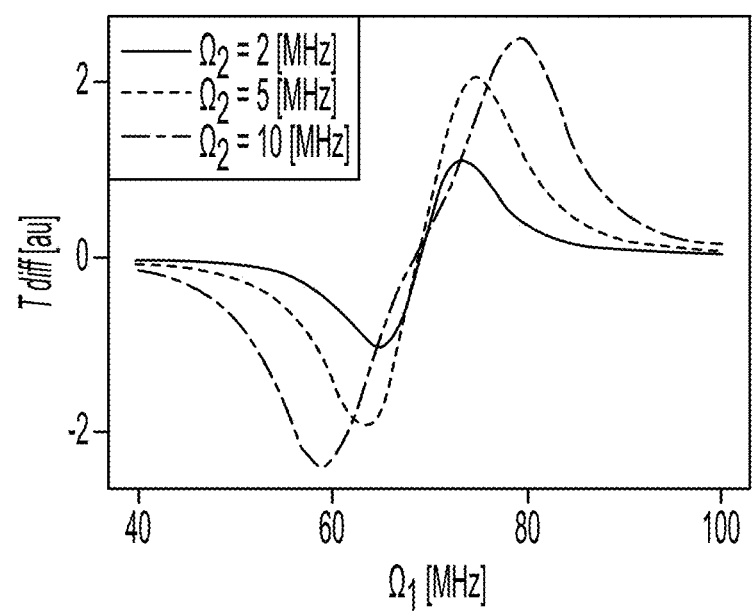
FIG. 18F is a graph comparing a difference, $T_\pi$−$T_0$, for different example magnitudes of $\Omega_2$.

The RF2 field strength, $\Omega_2$, can be estimated by setting $\Delta_1=\Delta_2$. When $\Delta_1$ is scanned near $\Delta_2$, the interference between the two fields produces a vector sum of the RF fields. The transmission signal shows deviation in the signal from the case when $\Omega_2=0$ MHz, as shown in FIGS. 18A-18D. For a non-varying (or slowly varying) RF2 phase the amplitude and the phase of RF2 can be precisely estimated. The transmission signal is calculated for different phases at $\Delta_1=\Delta_2=40$ MHz in FIG. 18E. The variation in the peak position of the transmission is a result of the interference between RF1 and RF2. The difference between the transmission at $\Phi=\pi$ and $\Phi=0$ shows a peak and dip whose frequency difference corresponds to $\Omega_2$, as shown by FIG. 18F. Thus, by measuring the frequency difference $\Omega_2$ can be estimated.

Figure 19A:
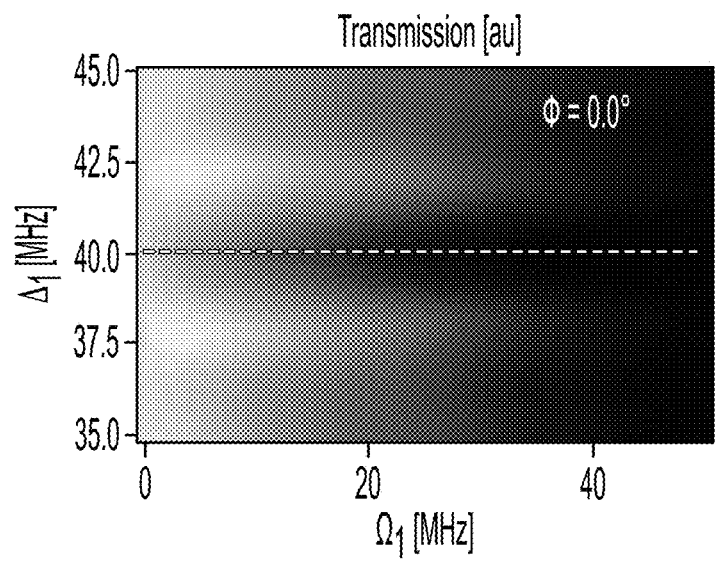
FIGS. 19A-19E are respective graphs of example probe transmission maps that are generated by scanning $\Omega_1$ and $\Delta_1$ near $\Delta_2$=40 MHz at $\Delta_c$=0 MHz for different relative phases.
Figure 19B:
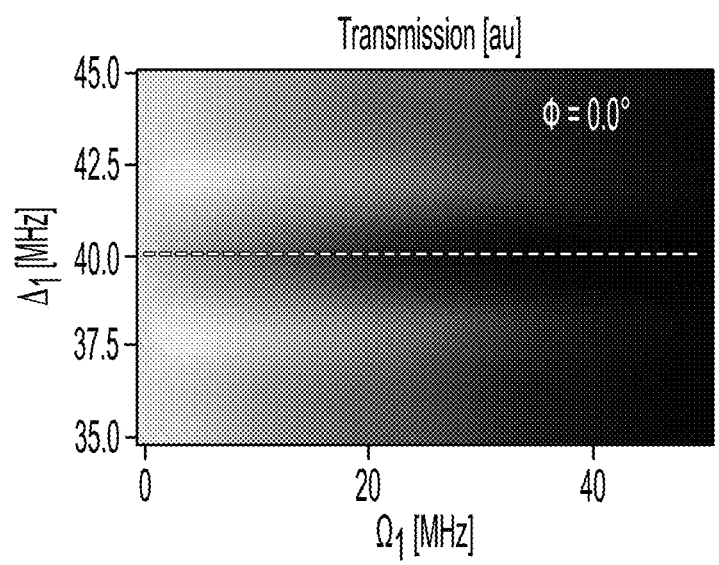
Figure 19C:
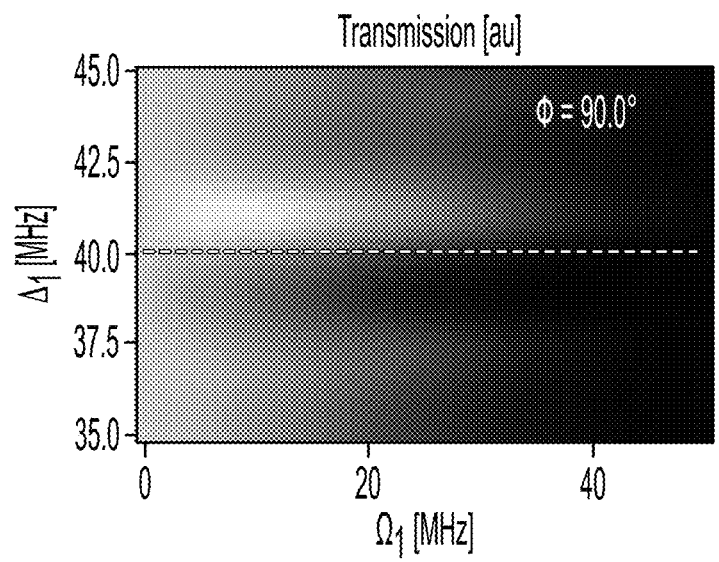
Figure 19D:
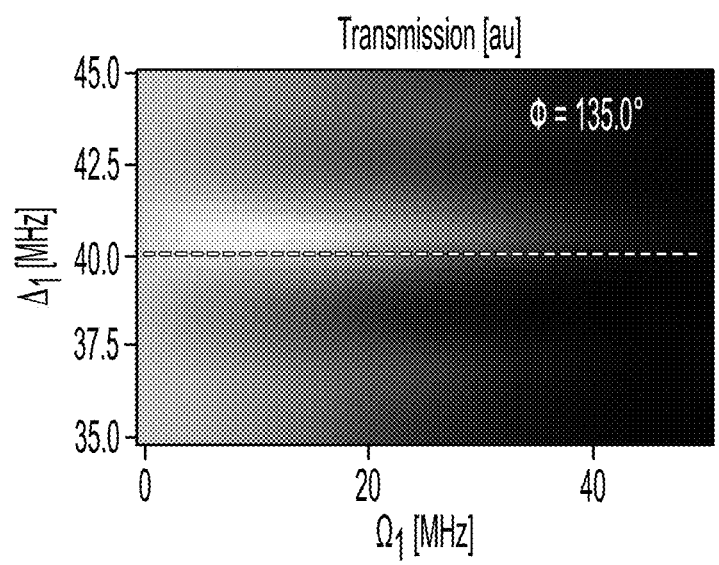
Figure 19E:
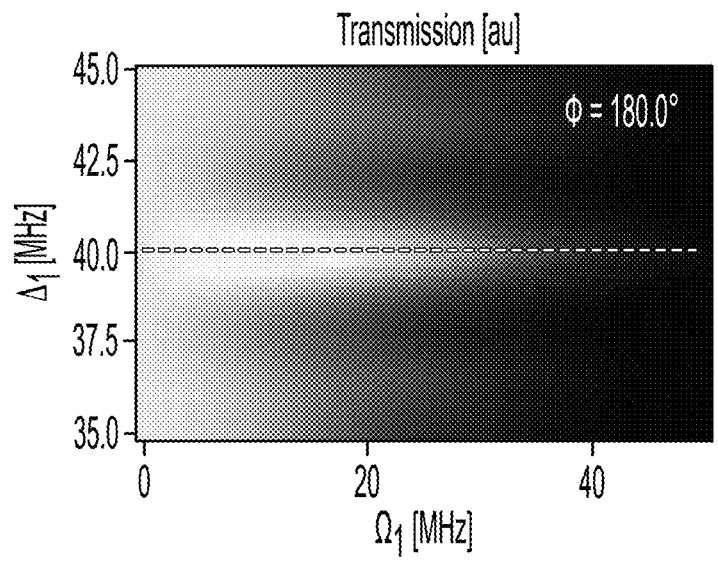
Figure 19F:
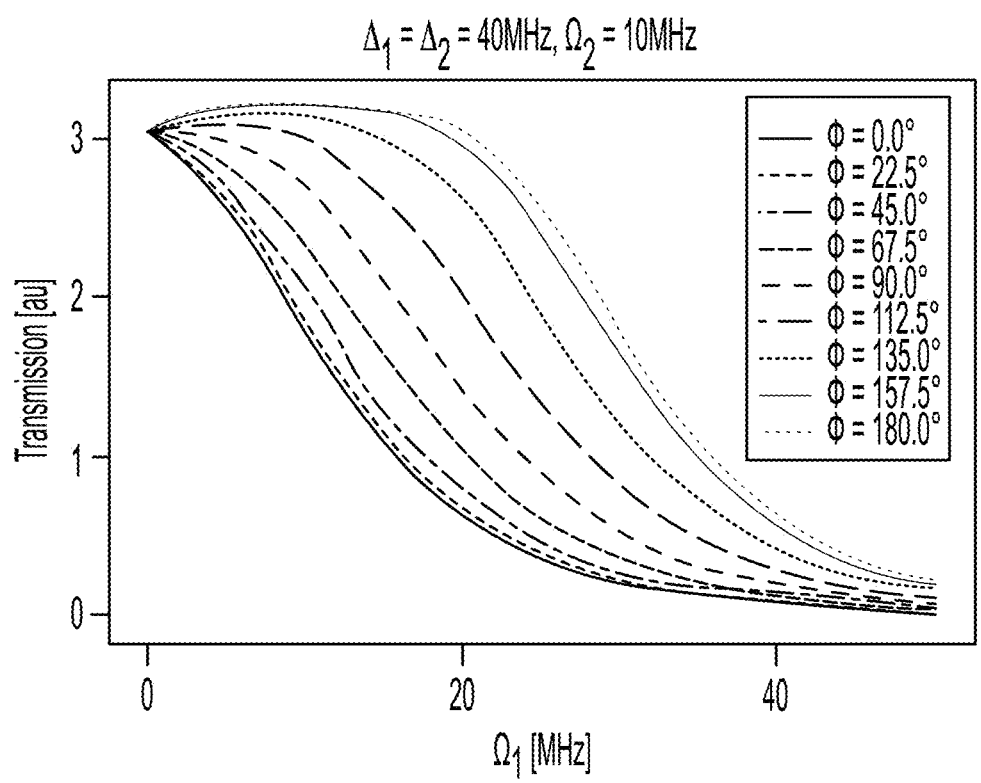
FIG. 19F is a graph showing example transmission profiles at $\Delta_1$=$\Delta_2$ as a function of $\Omega_1$ for various relative phases, $\Phi$.

We further explore the transmission at $\Delta_c=0$ MHz near $\Delta_1\sim40$ MHz, i.e., $\Delta_1\sim\Delta_2$ for different relative phases, as shown in FIGS. 19A-19F. The data show varying signal transmission at the matching frequency as a result of interference. It is evident that the total RF field is added when $\Phi=0$ and subtracted when $\Phi=\pi$. FIG. 19F shows the transmission profile at $\Delta_1=\Delta_2$ as a function of $\Omega_1$ for various relative phase, $\Phi$. At $\Phi=1$, the peak appears at the largest $\Omega_1$. The phase dependent transmission profile can be used to estimate the relative phase between the two RF fields.

Figure 20A:
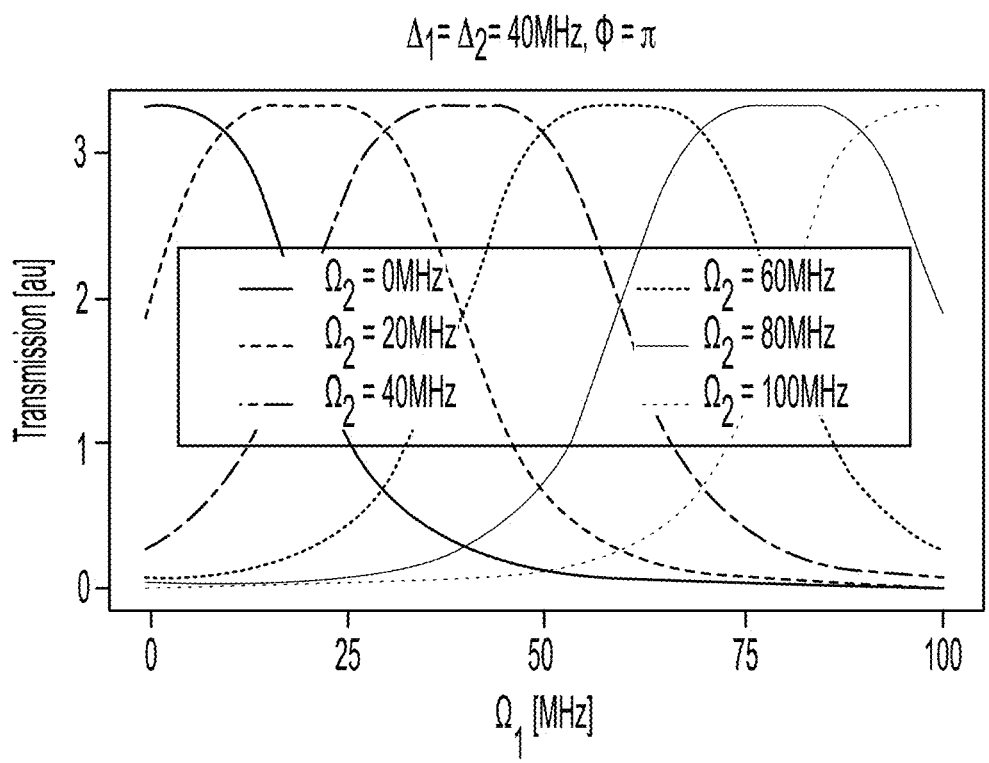
FIG. 20A is a graph showing example transmission peaks that are generated by scanning $\Omega_1$ for different example magnitudes of $\Omega_2$ when $\Delta_c$=0 MHZ, $\Delta_1$=$\Delta_2$=40 MHZ, and $\Phi$=$\pi$.
Figure 20B:
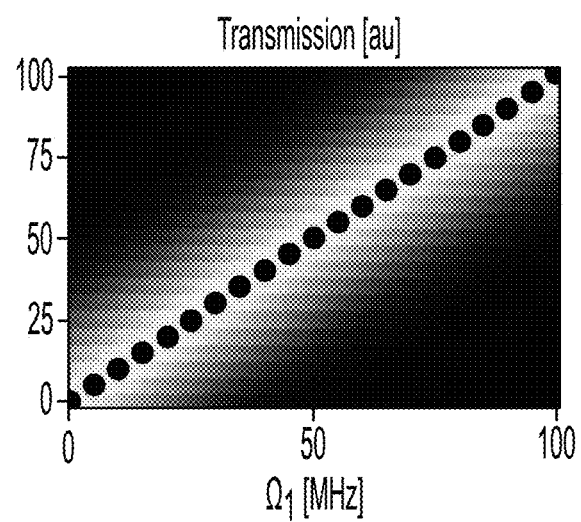
FIG. 20B is a graph showing a linear relationship between $\Omega_1$ and the corresponding $\Omega_2$ where the example transmission peaks of FIG. 20A are observed.

Scanning $\Omega_1$ at $\Delta_1=\Delta_2=40$ MHz with $\Phi=\pi$ reveals a transmission peak, as shown in FIGS. 20A and 20B. The peak is symmetric and centered at $\Omega_1=\Omega_2$. Although the peak has a flat top, the edges are sharp. By measuring the full profile, the center frequency can be measured. FIG. 20B demonstrates the linearity between $\Omega_2$ and the corresponding $\Omega_1$ where the peak is observed. Here, the relative phase of RF1 and RF2 can also be determined.

Figure 21:
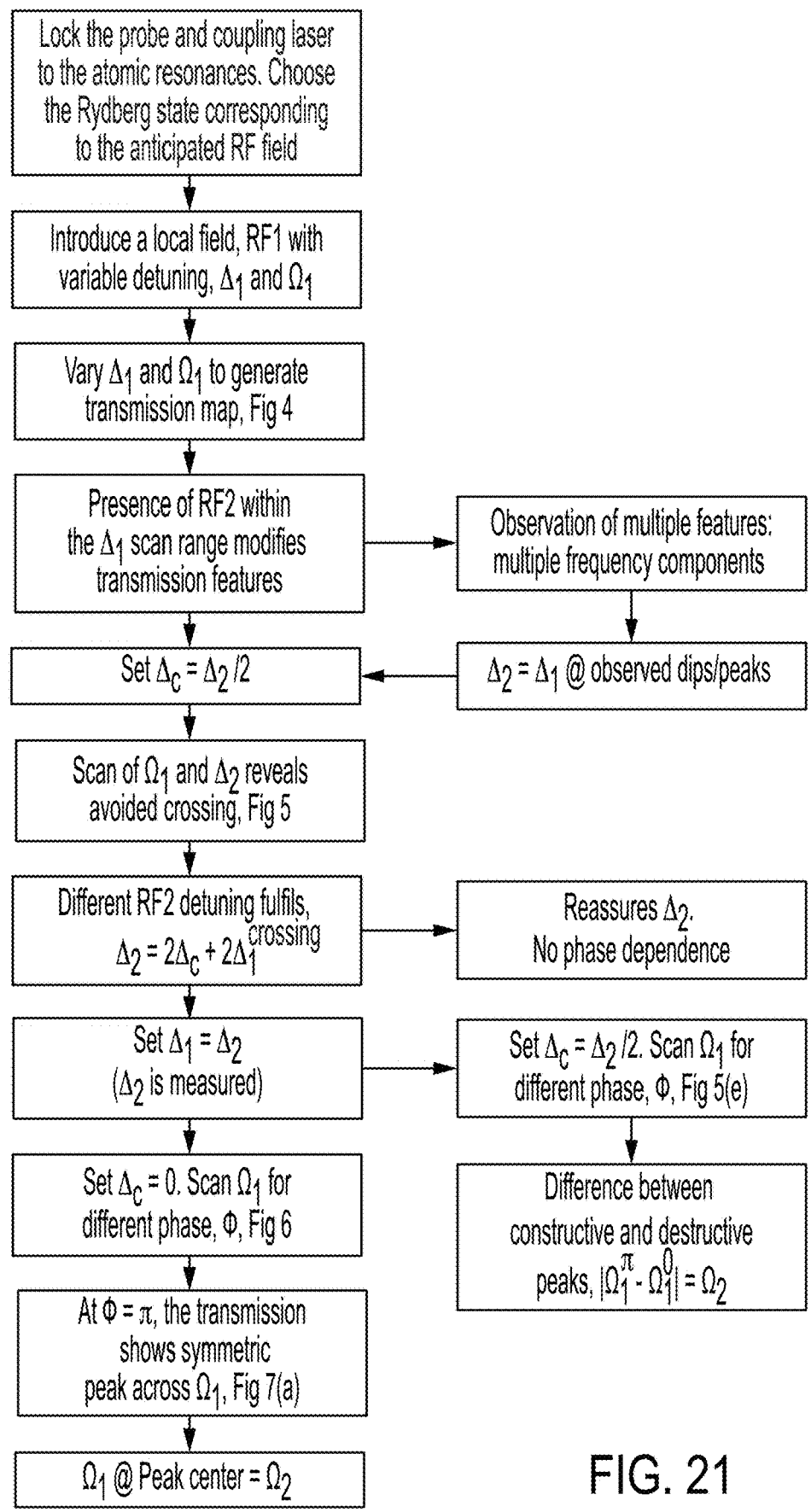
FIG. 21 is a flowchart of an example measurement process for obtaining $\Delta_2$ and $\Omega_2$ by scanning $\Delta_1$ and $\Omega_1$.

FIG. 21 presents a flowchart of an example measurement process for obtaining $\Delta_2$ and $\Delta_2$ by scanning $\Delta_1$ and $\Omega_1$. The example measurement process may include determining $\Delta_2$ and $\Omega_2$ for an out-of-band RF field by scanning $\Delta_1$ and $\Omega_1$ for a fixed magnitude of $\Delta_c$. In the process, $\Delta_1$ and $\Omega_1$ are scanned to produce a probe laser transmission map. If avoided crossing occur within the probe laser transmission map, then other frequencies (e.g., RF2, RF3, etc.) exist. $\Delta_2$ can be determined by the position of the level crossings. When $\Delta_c=\Delta_2/2$, and $\Delta_1$ is scanned, the crossing point and RF2 frequency can be confirmed. Setting the RF1 and RF2 detuning ($\Delta_1$ and $\Delta_2$) equal by tuning RF1 and setting the coupling laser detuning to half the RF2 detuning ($\Delta_c=\Delta_2/2$), the RF2 Rabi frequency can be determined. The example measurement process enables the determination of the parameters of the RF2 field based on the calibration of the RF1 field, which can be done using the principles of Rydberg vapor-based electrometry (e.g., Rydberg atom-based electrometry) and measuring the coupling laser and RF1 detunings ($\Delta_c$ and $\Delta_1$).

In the examples described herein, the coupling laser detuning, $\Delta_c$, the RF1 detuning, $\Delta_1$, the RF1 amplitude, $\Omega_1$, and the RF1 phase are used as control parameters to measure the properties of RF2. Multiple fields (e.g., RF3, RF4, etc.) can also be measured. Other combinations of scanned parameters can also be used to map out the avoided crossings once the Jaynes-Cummings model is understood. The model uncovers analytic expressions for where the crossings occur and how the energy splitting evolves as a function of the parameters. Fitting the regions around the avoided crossings enables one to extract (e.g., estimate) the properties of the RF fields, such as power, frequency, and phase. The understanding of the Jaynes-Cummings model and the derivation of the expressions describing the avoided crossings allows one to recover SI traceability of the measurements.

In some aspects of what is described, a system may be described by the following examples. The system may be configured to sense radio frequency (RF) electromagnetic fields, such as those associated with RF electromagnetic waves. In certain cases, the RF electromagnetic fields define a combined RF electromagnetic field that is multichromatic.

Example 1. A system for sensing radio frequency (RF) electromagnetic fields, the system comprising:
  a laser system configured to generate a probe laser signal and a coupling laser signal;
  an RF source configured to generate a reference RF electromagnetic field;
  a vapor cell sensor configured to generate an optical signal in response to the probe laser signal, the coupling laser signal, and a combined RF electromagnetic field interacting with a vapor of the vapor cell sensor, wherein:
    the optical signal is based on a transmission of the probe laser signal through the vapor, and
    the combined RF electromagnetic field comprises the reference RF electromagnetic field and a perturbing RF electromagnetic field; and
  a control system configured to perform operations that comprise:
    tuning the coupling laser signal relative to a coupling optical transition of the vapor,
    tuning the reference RF electromagnetic field relative to an RF transition of the vapor,
    generating transmission data based on the optical signal, the transmission data representing the transmission of the probe laser signal through the vapor as:
      one or both of the coupling laser signal and the reference RF electromagnetic field are tuned by the control system, and
      the combined RF electromagnetic field interacts with the vapor, and
    generating a value that represents a property of the perturbing RF electromagnetic field, the value based on:
      the transmission data, and
      avoided crossings induced by the combined RF electromagnetic field on Rydberg electronic states of the vapor.

Example 2. The system of example 1, wherein tuning the coupling laser signal comprises altering a frequency of the coupling laser signal, thereby altering a difference between the frequency of the coupling laser signal and a frequency of the coupling optical transition.

Example 3. The system of example 1 or example 2, wherein tuning the reference RF electromagnetic field comprises:
  altering a frequency of the reference RF electromagnetic field, thereby altering a first difference between the frequency of the reference RF electromagnetic field and a frequency of the RF transition;
  altering an amplitude of the reference RF electromagnetic field; or
  altering a phase of the reference RF electromagnetic field, thereby altering a second difference between the phase of the reference RF electromagnetic field and a reference phase (e.g., from a reference clock of the system).

Example 4. The system of example 1 or any one of examples 2-3, wherein the perturbing RF electromagnetic field is at or near resonant with the RF transition of the vapor.

Example 5. The system of example 1 or any one of examples 2-4, wherein the property of the perturbing RF electromagnetic field comprises:
  an amplitude of the perturbing RF electromagnetic field;
  a frequency of the perturbing RF electromagnetic field;
  a phase of the perturbing RF electromagnetic field; or a polarization of the perturbing RF electromagnetic field.

Example 6. The system of example 1 or any one of examples 2-5, wherein the probe laser signal has a frequency that is matched to a frequency of a probe optical transition of the vapor.

Example 7. The system of example 1 or any one of examples 2-6, wherein the generating the value comprises determining the avoided crossings using a Jaynes-Cummings model that represents a response of the vapor to the combined RF electromagnetic field.

Example 8. The system of example 1 or any one of examples 2-7,
  wherein the vapor has electronic states that comprise:
    first and second electronic states, and
    first and second Rydberg electronic states that are part of the Rydberg electronic states of the vapor,
      wherein the first electronic state, the second electronic state, and the first Rydberg electronic state are progressively higher in energy;
  wherein the coupling optical transition is defined by the second electronic state and the first Rydberg electronic state; and
  wherein the RF transition is defined by the first and second Rydberg electronic states.

Example 9. The system of example 8,
  wherein the probe laser signal has a frequency that is matched to a frequency of a probe optical transition of the vapor; and
  wherein the probe optical transition is defined by the first and second electronic states of the vapor.

Example 10. The system of example 8 or example 9, wherein the second Rydberg electronic state is higher in energy than the first Rydberg electronic state.

Example 11. The system of example 8 or example 9, wherein the second Rydberg electronic state is lower in energy than the first Rydberg electronic state.

Example 12. The system of example 8 or any one of examples 9-11, wherein the avoided crossings are based on the first and second Rydberg electronic states when dressed by two or more RF electromagnetic fields (e.g., the combined RF electromagnetic field).

Example 13. The system of example 1 or any one of examples 2-12, comprising:
  a device-under-test (DUT) that is configured to generate the perturbing RF electromagnetic field.

Example 14. The system of example 1 or any one of examples 2-12, wherein the perturbing RF electromagnetic field is received from an environment of the system.

Example 15. The system of example 13 or example 14, wherein an amplitude of the reference RF electromagnetic field is greater in magnitude than an amplitude of the perturbing RF electromagnetic field.

Example 16. The system of example 13 or example 14, wherein an amplitude of the perturbing RF electromagnetic field is greater in magnitude than an amplitude of the reference RF electromagnetic field.

Example 17. The system of example 1,
  wherein the coupling laser signal comprises first and second coupling laser signals;
  wherein the coupling optical transition comprises first and second coupling optical transitions; and
  wherein tuning the coupling laser signal comprises one or both of:
    tuning the first coupling laser signal relative to the first coupling optical transition of the vapor; and
    tuning the second coupling laser signal relative to the second coupling optical transition of the vapor.

Example 18. The system of example 17,
  wherein tuning the first coupling laser signal comprises altering a frequency of the first coupling laser signal, thereby altering a difference between the frequency of the first coupling laser signal and a frequency of the first coupling optical transition; and
  wherein tuning the second coupling laser signal comprises altering a frequency of the second coupling laser signal, thereby altering a difference between the frequency of the second coupling laser signal and a frequency of the second coupling optical transition.

Example 19. The system of example 17 or example 18, wherein tuning the reference RF electromagnetic field comprises:
  altering a frequency of the reference RF electromagnetic field, thereby altering a first difference between the frequency of the reference RF electromagnetic field and a frequency of the RF transition;
  altering an amplitude of the reference RF electromagnetic field; or
  altering a phase of the reference RF electromagnetic field, thereby altering a second difference between the phase of the reference RF electromagnetic field and a reference phase (e.g., from a reference clock of the system).

Example 20. The system of example 17 or any one of examples 18-19, wherein the perturbing RF electromagnetic field is at or near resonant with the RF transition of the vapor.

Example 21. The system of example 17 or any one of examples 18-20, wherein the property of the perturbing RF electromagnetic field comprises:
  an amplitude of the perturbing RF electromagnetic field;
  a frequency of the perturbing RF electromagnetic field;
  a phase of the perturbing RF electromagnetic field; or
  a polarization of the perturbing RF electromagnetic field.

Example 22. The system of example 17 or any one of examples 18-21, wherein the probe laser signal has a frequency that is matched to a frequency of a probe optical transition of the vapor.

Example 23. The system of example 17 or any one of examples 18-22, wherein generating the value comprises determining the avoided crossings using a Jaynes-Cummings model that represents a response of the vapor to the combined RF electromagnetic field.

Example 24. The system of example 17 or any one of examples 18-23,
  wherein the vapor has electronic states that comprise:
    first, second and third electronic states, and
    first and second Rydberg electronic states that are part of the Rydberg electronic states of the vapor,
  wherein the first electronic state, the second electronic state, the third electronic state, and the first Rydberg electronic state are progressively higher in energy;
  wherein the first coupling optical transition is defined by the second and third electronic states;
  wherein the second coupling optical transition defined by the third electronic state and the first Rydberg electronic state; and
  wherein the RF transition is defined by the first and second Rydberg electronic states.

Example 25. The system of example 24,
  wherein the probe laser signal has a frequency that is matched to a frequency of a probe optical transition of the vapor; and
  wherein the probe optical transition is defined by the first and second electronic states of the vapor.

Example 26. The system of example 24 or example 25, wherein the second Rydberg electronic state is higher in energy than the first Rydberg electronic state.

Example 27. The system of example 24 or example 25, wherein the second Rydberg electronic state is lower in energy than the first Rydberg electronic state.

Example 28. The system of example 24 or any one of examples 25-27, wherein the avoided crossings are based on the first and second Rydberg electronic states when dressed by two or more RF electromagnetic fields (e.g., the combined RF electromagnetic field).

Example 29. The system of example 1 or any one of examples 2-28,
  wherein the perturbing RF electromagnetic field is a first perturbing RF electromagnetic field, the value is a first value, and the avoided crossings are a first set of avoided crossings that are associated with the reference RF electromagnetic field and the first perturbing RF electromagnetic field;
  wherein the combined RF electromagnetic field comprises a second perturbing RF electromagnetic field; and
  wherein the operations of the control system comprise generating a second value that represents a property of the second perturbing RF electromagnetic field, the second value based on:
    the transmission data, and
    a second set of avoided crossings that are induced by the combined RF electromagnetic field on the Rydberg electronic states of the vapor, the second set of avoided crossings associated with the reference RF electromagnetic field, the first perturbing RF electromagnetic field, and the second perturbing RF electromagnetic field.

Example 30. The system of example 29, wherein the second perturbing RF electromagnetic field is at or near resonant with the RF transition of the vapor.

Example 31. The system of example 29 or example 30, wherein generating the second value comprises determining the second set of avoided crossings using a Jaynes-Cummings model that represents a response of the vapor to the combined RF electromagnetic field.

Example 32. The system of example 29 or any one of examples 30-31,
  wherein the Rydberg electronic states of the vapor comprise first and second Rydberg electronic states; and
  wherein the second set of avoided crossings are based on the first and second Rydberg electronic states when dressed by two or more RF electromagnetic fields (e.g., the combined RF electromagnetic field).

Example 33. The system of example 29 or any one of examples 30-32,
  wherein the system comprises a device-under-test (DUT) that is configured to generate the first perturbing RF electromagnetic field; and
  wherein the second perturbing RF electromagnetic field is received from an environment of the system.

Example 34. The system of example 29 or any one of examples 30-32, wherein the first and second perturbing RF electromagnetic fields are received from an environment of the system.

In some aspects of what is described, a method may be described by the following examples. The method may be used to sense radio frequency (RF) electromagnetic fields, such as those associated with RF electromagnetic waves. In certain cases, the RF electromagnetic fields define a combined RF electromagnetic field that is multichromatic.

Example 35. A method for sensing radio frequency (RF) electromagnetic fields, the method comprising:
  interacting probe and coupling laser signals with a vapor of a vapor cell sensor, the probe and coupling laser signals generated by a laser system;
  interacting a combined RF electromagnetic field with the vapor of the vapor cell sensor, the combined RF electromagnetic field comprising a reference RF electromagnetic field and a perturbing RF electromagnetic field, the reference RF electromagnetic field generated by an RF source;
  generating, by operation of the vapor cell sensor, an optical signal in response to the probe laser signal, the coupling laser signal, and the combined RF electromagnetic field interacting with a vapor of the vapor cell sensor, the optical signal based on a transmission of the probe laser signal through the vapor; and
  by operation of a control system in communication with the laser system and the RF source:
    tuning the coupling laser signal relative to a coupling optical transition of the vapor,
    tuning the reference RF electromagnetic field relative to an RF transition of the vapor,
    generating transmission data based on the optical signal, the transmission data representing the transmission of the probe laser signal through the vapor as:
      one or both of the coupling laser signal and the reference RF electromagnetic field are tuned by the control system, and
      the combined RF electromagnetic field interacts with the vapor, and
    generating a value that represents a property of the perturbing RF electromagnetic field, the value based on:
      the transmission data, and
      avoided crossings induced by the combined RF electromagnetic field on Rydberg electronic states of the vapor.

Example 36. The method of example 35, wherein tuning the coupling laser signal comprises altering a frequency of the coupling laser signal, thereby altering a difference between the frequency of the coupling laser signal and a frequency of the coupling optical transition.

Example 37. The method of example 35 or example 36, wherein tuning the reference RF electromagnetic field comprises:
  altering a frequency of the reference RF electromagnetic field, thereby altering a first difference between the frequency of the reference RF electromagnetic field and a frequency of the RF transition;
  altering an amplitude of the reference RF electromagnetic field; or
  altering a phase of the reference RF electromagnetic field, thereby altering a second difference between the phase of the reference RF electromagnetic field and a reference phase (e.g., from a reference clock of the system).

Example 38. The method of example 35 or any one of examples 36-37, wherein the perturbing RF electromagnetic field is at or near resonant with the RF transition of the vapor.

Example 39. The method of example 35 or any one of examples 36-38, wherein the property of the perturbing RF electromagnetic field comprises:
  an amplitude of the perturbing RF electromagnetic field;
  a frequency of the perturbing RF electromagnetic field;
  a phase of the perturbing RF electromagnetic field; or
  a polarization of the perturbing RF electromagnetic field.

Example 40. The method of example 35 or any one of examples 36-39, wherein the probe laser signal has a frequency that is matched to a frequency of a probe optical transition of the vapor.

Example 41. The method of example 35 or any one of examples 36-40, wherein generating the value comprises determining the avoided crossings using a Jaynes-Cummings model that represents a response of the vapor to the combined RF electromagnetic field.

Example 42. The method of example 35 or any one of examples 36-41,
  wherein the vapor has electronic states that comprise:
    first and second electronic states, and
    first and second Rydberg electronic states that are part of the Rydberg electronic states of the vapor,
    wherein the first electronic state, the second electronic state, and the first Rydberg electronic state are progressively higher in energy;
  wherein the coupling optical transition is defined by the second electronic state and the first Rydberg electronic state; and
  wherein the RF transition is defined by the first and second Rydberg electronic states.

Example 43. The method of example 42,
  wherein the probe laser signal has a frequency that is matched to a frequency of a probe optical transition of the vapor; and
  wherein the probe optical transition is defined by the first and second electronic states of the vapor.

Example 44. The method of example 42 or example 43, wherein the second Rydberg electronic state is higher in energy than the first Rydberg electronic state.

Example 45. The method of example 42 or example 43, wherein the second Rydberg electronic state is lower in energy than the first Rydberg electronic state.

Example 46. The method of example 42 or any one of examples 43-45, wherein the avoided crossings are based on the first and second Rydberg electronic states when dressed by two or more RF electromagnetic fields (e.g., the combined RF electromagnetic field).

Example 47. The method of example 35 or any one of examples 36-46, comprising:
  generating the perturbing RF electromagnetic field by operation of a device-under-test (DUT).

Example 48. The method of example 35 or any one of examples 36-46,
  wherein the laser system, the RF source, the vapor cell sensor, and the control unit are part of a sensing system; and wherein the method comprises receiving the perturbing RF electromagnetic field from an environment of the sensing system.

Example 49. The method of example 47 or example 48, wherein an amplitude of the reference RF electromagnetic field is greater in magnitude than an amplitude of the perturbing RF electromagnetic field.

Example 50. The method of example 47 or example 48, wherein an amplitude of the perturbing RF electromagnetic field is greater in magnitude than an amplitude of the reference RF electromagnetic field.

Example 51. The method of example 35,
wherein the coupling laser signal comprises first and second coupling laser signals;
wherein interacting the probe and coupling laser signals comprises interacting the first and second coupling laser signals with the vapor of the vapor cell sensor;
wherein the coupling optical transition comprises first and second coupling optical transitions; and
wherein tuning the coupling laser signal comprises one or both of:
tuning the first coupling laser signal relative to the first coupling optical transition of the vapor; and
tuning the second coupling laser signal relative to the second coupling optical transition of the vapor.

Example 52. The method of example 51,
wherein tuning the first coupling laser signal comprises altering a frequency of the first coupling laser signal, thereby altering a difference between the frequency of the first coupling laser signal and a frequency of the first coupling optical transition; and
wherein tuning the second coupling laser signal comprises altering a frequency of the second coupling laser signal, thereby altering a difference between the frequency of the second coupling laser signal and a frequency of the second coupling optical transition.

Example 53. The method of example 51 or example 52, wherein tuning the reference RF electromagnetic field comprises:
altering a frequency of the reference RF electromagnetic field, thereby altering a first difference between the frequency of the reference RF electromagnetic field and a frequency of the RF transition;
altering an amplitude of the reference RF electromagnetic field; or
altering a phase of the reference RF electromagnetic field, thereby altering a second difference between the phase of the reference RF electromagnetic field and a reference phase (e.g., from a reference clock of the system).

Example 54. The method of example 51 or any one of examples 52-53, wherein the perturbing RF electromagnetic field is at or near resonant with the RF transition of the vapor.

Example 55. The method of example 51 or any one of examples 52-54, wherein the property of the perturbing RF electromagnetic field comprises:
an amplitude of the perturbing RF electromagnetic field;
a frequency of the perturbing RF electromagnetic field;
a phase of the perturbing RF electromagnetic field; or
a polarization of the perturbing RF electromagnetic field.

Example 56. The method of example 51 or any one of examples 52-55, wherein the probe laser signal has a frequency that is matched to a frequency of a probe optical transition of the vapor.

Example 57. The method of example 51 or any one of examples 52-56, wherein generating the value comprises determining the avoided crossings using a Jaynes-Cummings model that represents a response of the vapor to the combined RF electromagnetic field.

Example 58. The method of example 51 or any one of examples 52-57,
wherein the vapor has electronic states that comprise:
first, second, and third electronic states, and
first and second Rydberg electronic states that are part of the Rydberg electronic states of the vapor,
wherein the first electronic state, the second electronic state, the third electronic state, and the first Rydberg electronic state are progressively higher in energy;
wherein the first coupling optical transition is defined by the second and third electronic states;
wherein the second coupling optical transition defined by the third electronic state and the first Rydberg electronic state; and
wherein the RF transition is defined by the first and second Rydberg electronic states.

Example 59. The method of example 58, wherein the probe laser signal has a frequency that is matched to a frequency of a probe optical transition of the vapor; and wherein the probe optical transition is defined by the first and second electronic states of the vapor.

Example 60. The method of example 58 or example 59, wherein the second Rydberg electronic state is higher in energy than the first Rydberg electronic state.

Example 61. The method of example 58 or example 59, wherein the second Rydberg electronic state is lower in energy than the first Rydberg electronic state.

Example 62. The method of example 58 or any one of examples 59-61, wherein the avoided crossings are based on the first and second Rydberg electronic states when dressed by two or more RF electromagnetic fields (e.g., the combined RF electromagnetic field).

Example 63. The method of example 35 or any one of examples 36-62,
wherein the perturbing RF electromagnetic field is a first perturbing RF electromagnetic field, the value is a first value, and the avoided crossings are a first set of avoided crossings that are associated with the reference RF electromagnetic field and the first perturbing RF electromagnetic field;
wherein the combined RF electromagnetic field comprises a second perturbing RF electromagnetic field; and
wherein the method comprises:
by operation of the control system, generating a second value that represents a property of the second perturbing RF electromagnetic field, the second value based on:
the transmission data, and
a second set of avoided crossings that are induced by the combined RF electromagnetic field on the Rydberg electronic states of the vapor, the second set of avoided crossings associated with the reference RF electromagnetic field, the first perturbing RF electromagnetic field, and the second perturbing RF electromagnetic field.

Example 64. The method of example 63, wherein the second perturbing RF electromagnetic field is at or near resonant with the RF transition of the vapor.

Example 65. The method of example 63 or example 64, wherein generating the second value comprises determining the second set of avoided crossings using a Jaynes-Cummings model that represents a response of the vapor to the combined RF electromagnetic field.

Example 66. The method of example 63 or any one of examples 64-65,
  wherein the Rydberg electronic states of the vapor comprise first and second Rydberg electronic states; and
  wherein the second set of avoided crossings are based on the first and second Rydberg electronic states when dressed by two or more RF electromagnetic fields (e.g., the combined RF electromagnetic field).

Example 67. The method of example 63 or any one of examples 64-66,
  wherein the system comprises a device-under-test (DUT) that is configured to generate the first perturbing RF electromagnetic field; and
  wherein the second perturbing RF electromagnetic field is received from an environment of the system.

Example 68. The method of example 63 or any one of examples 64-67, wherein the first and second perturbing RF electromagnetic fields are received from an environment of the system.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A system for sensing radio frequency (RF) electromagnetic fields, the system comprising:
  a laser system configured to generate a probe laser signal and a coupling laser signal;
  an RF source configured to generate a reference RF electromagnetic field;
  a vapor cell sensor configured to generate an optical signal in response to the probe laser signal, the coupling laser signal, and a combined RF electromagnetic field interacting with a vapor of the vapor cell sensor, wherein:
    the optical signal is based on a transmission of the probe laser signal through the vapor, and
    the combined RF electromagnetic field comprises the reference RF electromagnetic field and a perturbing RF electromagnetic field; and
  a control system configured to perform operations that comprise:
    tuning the coupling laser signal relative to a coupling optical transition of the vapor,
    tuning the reference RF electromagnetic field relative to an RF transition of the vapor,
    generating transmission data based on the optical signal, the transmission data representing the transmission of the probe laser signal through the vapor as:
      one or both of the coupling laser signal and the reference RF electromagnetic field are tuned by the control system, and
      the combined RF electromagnetic field interacts with the vapor, and
    generating a value that represents a property of the perturbing RF electromagnetic field, the value based on:
      the transmission data, and
      avoided crossings induced by the combined RF electromagnetic field on Rydberg electronic states of the vapor, the avoided crossings determined using a Jaynes-Cummings model that represents a response of the vapor to the combined RF electromagnetic field.

2. The system of claim 1, wherein tuning the coupling laser signal comprises altering a frequency of the coupling laser signal, thereby altering a difference between the frequency of the coupling laser signal and a frequency of the coupling optical transition.

3. The system of claim 1, wherein tuning the reference RF electromagnetic field comprises:
  altering a frequency of the reference RF electromagnetic field, thereby altering a first difference between the frequency of the reference RF electromagnetic field and a frequency of the RF transition;
  altering an amplitude of the reference RF electromagnetic field; or
  altering a phase of the reference RF electromagnetic field, thereby altering a second difference between the phase of the reference RF electromagnetic field and a reference phase from a reference clock of the system.

4. The system of claim 1, wherein the perturbing RF electromagnetic field is at or near resonant with the RF transition of the vapor.

5. The system of claim 1, wherein the property of the perturbing RF electromagnetic field comprises:
  an amplitude of the perturbing RF electromagnetic field;
  a frequency of the perturbing RF electromagnetic field;
  a phase of the perturbing RF electromagnetic field; or
  a polarization of the perturbing RF electromagnetic field.

6. The system of claim 1,
  wherein the vapor has electronic states that comprise:
    first and second electronic states, and
    first and second Rydberg electronic states that are part of the Rydberg electronic states of the vapor,
    wherein the first electronic state, the second electronic state, and the first Rydberg electronic state are progressively higher in energy;
  wherein the coupling optical transition is defined by the second electronic state and the first Rydberg electronic state; and
  wherein the RF transition is defined by the first and second Rydberg electronic states.

7. The system of claim 6, wherein the avoided crossings are based on the first and second Rydberg electronic states when dressed by two or more RF electromagnetic fields.

8. The system of claim 1, comprising:
  a device-under-test (DUT) that is configured to generate the perturbing RF electromagnetic field.

9. The system of claim 1, wherein the perturbing RF electromagnetic field is received from an environment of the system.

10. The system of claim 1,
wherein the coupling laser signal comprises first and second coupling laser signals;
wherein the coupling optical transition comprises first and second coupling optical transitions; and
wherein tuning the coupling laser signal comprises one or both of:
tuning the first coupling laser signal relative to the first coupling optical transition of the vapor; and
tuning the second coupling laser signal relative to the second coupling optical transition of the vapor.

11. The system of claim 10,
wherein the vapor has electronic states that comprise:
first, second, and third electronic states, and
first and second Rydberg electronic states that are part of the Rydberg electronic states of the vapor,
wherein the first electronic state, the second electronic state, the third electronic state, and the first Rydberg electronic state are progressively higher in energy;
wherein the first coupling optical transition is defined by the second and third electronic states;
wherein the second coupling optical transition defined by the third electronic state and the first Rydberg electronic state; and
wherein the RF transition is defined by the first and second Rydberg electronic states.

12. The system of claim 1,
wherein the perturbing RF electromagnetic field is a first perturbing RF electromagnetic field, the value is a first value, and the avoided crossings are a first set of avoided crossings that are associated with the reference RF electromagnetic field and the first perturbing RF electromagnetic field;
wherein the combined RF electromagnetic field comprises a second perturbing RF electromagnetic field; and
wherein the operations of the control system comprise generating a second value that represents a property of the second perturbing RF electromagnetic field, the second value based on:
the transmission data, and
a second set of avoided crossings that are induced by the combined RF electromagnetic field on the Rydberg electronic states of the vapor, the second set of avoided crossings associated with the reference RF electromagnetic field, the first perturbing RF electromagnetic field, and the second perturbing RF electromagnetic field.

13. The system of claim 12, wherein generating the second value comprises determining the second set of avoided crossings using the Jaynes-Cummings model.

14. The system of claim 12, wherein the first and second perturbing RF electromagnetic fields are received from an environment of the system.

15. A method for sensing radio frequency (RF) electromagnetic fields, the method comprising:
interacting probe and coupling laser signals with a vapor of a vapor cell sensor, the probe and coupling laser signals generated by a laser system;
interacting a combined RF electromagnetic field with the vapor of the vapor cell sensor, the combined RF electromagnetic field comprising a reference RF electromagnetic field and a perturbing RF electromagnetic field, the reference RF electromagnetic field generated by an RF source;
generating, by operation of the vapor cell sensor, an optical signal in response to the probe laser signal, the coupling laser signal, and the combined RF electromagnetic field interacting with a vapor of the vapor cell sensor, the optical signal based on a transmission of the probe laser signal through the vapor; and
by operation of a control system in communication with the laser system and the RF source:
tuning the coupling laser signal relative to a coupling optical transition of the vapor, tuning the reference RF electromagnetic field relative to an RF transition of the vapor,
generating transmission data based on the optical signal, the transmission data representing the transmission of the probe laser signal through the vapor as:
one or both of the coupling laser signal and the reference RF electromagnetic field are tuned by the control system, and
the combined RF electromagnetic field interacts with the vapor, and
generating a value that represents a property of the perturbing RF electromagnetic field, the value based on:
the transmission data, and
avoided crossings induced by the combined RF electromagnetic field on Rydberg electronic states of the vapor, the avoided crossings determined using a Jaynes-Cummings model that represents a response of the vapor to the combined RF electromagnetic field.

16. The method of claim 15, wherein tuning the coupling laser signal comprises altering a frequency of the coupling laser signal, thereby altering a difference between the frequency of the coupling laser signal and a frequency of the coupling optical transition.

17. The method of claim 15, wherein tuning the reference RF electromagnetic field comprises:
altering a frequency of the reference RF electromagnetic field, thereby altering a first difference between the frequency of the reference RF electromagnetic field and a frequency of the RF transition;
altering an amplitude of the reference RF electromagnetic field; or
altering a phase of the reference RF electromagnetic field, thereby altering a second difference between the phase of the reference RF electromagnetic field and a reference phase from a reference clock.

18. The method of claim 15, wherein the perturbing RF electromagnetic field is at or near resonant with the RF transition of the vapor.

19. The method of claim 15, wherein the property of the perturbing RF electromagnetic field comprises:
an amplitude of the perturbing RF electromagnetic field;
a frequency of the perturbing RF electromagnetic field;
a phase of the perturbing RF electromagnetic field; or
a polarization of the perturbing RF electromagnetic field.

20. The method of claim 15,
wherein the vapor has electronic states that comprise:
first and second electronic states, and
first and second Rydberg electronic states that are part of the Rydberg electronic states of the vapor,
wherein the first electronic state, the second electronic state, and the first Rydberg electronic state are progressively higher in energy;

wherein the coupling optical transition is defined by the second electronic state and the first Rydberg electronic state; and wherein the RF transition is defined by the first and second Rydberg electronic states.

21. The method of claim 20, wherein the avoided crossings are based on the first and second Rydberg electronic states when dressed by two or more RF electromagnetic fields.

22. The method of claim 15, comprising:
generating the perturbing RF electromagnetic field by operation of a device-under-test (DUT).

23. The method of claim 15,
wherein the laser system, the RF source, the vapor cell sensor, and the control unit are part of a sensing system; and
wherein the method comprises receiving the perturbing RF electromagnetic field from an environment of the sensing system.

24. The method of claim 15,
wherein the coupling laser signal comprises first and second coupling laser signals;
wherein interacting the probe and coupling laser signals comprises interacting the first and second coupling laser signals with the vapor of the vapor cell sensor;
wherein the coupling optical transition comprises first and second coupling optical transitions; and
wherein tuning the coupling laser signal comprises one or both of:
tuning the first coupling laser signal relative to the first coupling optical transition of the vapor; and
tuning the second coupling laser signal relative to the second coupling optical transition of the vapor.

25. The method of claim 24,
wherein the vapor has electronic states that comprise:
first, second, and third electronic states, and
first and second Rydberg electronic states that are part of the Rydberg electronic states of the vapor, wherein the first electronic state, the second electronic state, the third electronic state, and the first Rydberg electronic state are progressively higher in energy;
wherein the first coupling optical transition is defined by the second and third electronic states;
wherein the second coupling optical transition defined by the third electronic state and the first Rydberg electronic state; and
wherein the RF transition is defined by the first and second Rydberg electronic states.

26. The method of claim 15, comprising:
wherein the perturbing RF electromagnetic field is a first perturbing RF electromagnetic field, the value is a first value, and the avoided crossings are a first set of avoided crossings that are associated with the reference RF electromagnetic field and the first perturbing RF electromagnetic field;
wherein the combined RF electromagnetic field comprises a second perturbing RF electromagnetic field; and
wherein the method comprises:
by operation of the control system, generating a second value that represents a property of the second perturbing RF electromagnetic field, the second value based on:
the transmission data, and
a second set of avoided crossings that are induced by the combined RF electromagnetic field on the Rydberg electronic states of the vapor, the second set of avoided crossings associated with the reference RF electromagnetic field, the first perturbing RF electromagnetic field, and the second perturbing RF electromagnetic field.

27. The method of claim 26, wherein generating the second value comprises determining the second set of avoided crossings using the Jaynes-Cummings model.

28. The method of claim 26, wherein the first and second perturbing RF electromagnetic fields are received from an environment of the system.

* * * * *

UNITED STATES PATENT AND TRADEMARK OFFICE
CERTIFICATE OF CORRECTION

PATENT NO. : 12,306,236 B2
APPLICATION NO. : 18/650804
DATED : May 20, 2025
INVENTOR(S) : Mohammad Noaman et al.

It is certified that error appears in the above-identified patent and that said Letters Patent is hereby corrected as shown below:

On the Title Page

Page 2, Column 1, item [56], Other Publications, Line 2 - Delete "byRabi Matching'Dressed" and insert --by 'Rabi Matching' Dressed-- therefor Page 2, Column 2, item [56], Other Publications, Line 32 - Delete "Ribidium" and insert --Rubidium-- therefor In the Specification Column 1, Description of Drawings, Line 67 - Delete "MHZ;" and insert --MHz;-- therefor Column 2, Description of Drawings, Line 5 - Delete "MHZ;" and insert --MHz;-- therefor Column 2, Description of Drawings, Line 10 - Delete "$\Omega_2$" and insert --$\Delta_2$-- therefor Column 2, Description of Drawings, Line 13 - Delete "$\Omega_2$" and insert --$\Delta_2$-- therefor Column 2, Description of Drawings, Line 13 - Delete "MHZ;" and insert --MHz;-- therefor Column 2, Description of Drawings, Line 15 - Delete "MHZ;" and insert --MHz;-- therefor Column 2, Description of Drawings, Line 27 - Delete "MHZ;" and insert --MHz;-- therefor Column 2, Description of Drawings, Line 39 - Delete "MHZ;" and insert --MHz;-- therefor Column 2, Description of Drawings, Line 42 - Delete "MHZ;" and insert --MHz;-- therefor Column 2, Description of Drawings, Line 45 - Delete "MHZ;" and insert --MHz;-- therefor Signed and Sealed this
Twelfth Day of August, 2025

Coke Morgan Stewart
*Acting Director of the United States Patent and Trademark Office*

Column 2, Description of Drawings, Line 56 - Delete "MHZ," and insert --MHz,-- therefor Column 2, Description of Drawings, Line 56 - Delete "MHZ," and insert --MHz,-- therefor Column 7, Detailed Description, Line 30 - Delete "Ryberg" and insert --Rydberg-- therefor Column 7, Detailed Description, Line 43 - Delete "$53D_{3/2}$," and insert --$53D_{5/2}$,-- therefor Column 11, Detailed Description, Line 9 - Delete "220" and insert --520-- therefor Column 11, Detailed Description, Line 16 - Delete "220" and insert --520-- therefor Column 15, Detailed Description, Line 37 - Delete "$|3\rangle$ ." and insert --$|3\rangle$.-- therefor Column 15, Detailed Description, Line 40 - Delete "$|4\rangle$ ." and insert --$|4\rangle$.-- therefor Column 15, Detailed Description, Line 43 - Delete "$|3\rangle$ ." and insert --$|3\rangle$.-- therefor Column 15, Detailed Description, Line 44 - Delete "$|3\rangle$ ." and insert --$|3\rangle$.-- therefor Column 15, Detailed Description, Line 52 - Delete "$|4\rangle$ ." and insert --$|4\rangle$.-- therefor Column 15, Detailed Description, Line 56 - Delete "$|b_m{}^n\rangle$ ," and insert -- $|b_m^n\rangle$,-- therefor Column 15, Detailed Description, Line 67 - Delete "$|\bar{N}\ n\pm\rangle$." and insert --$|\bar{N}\ n\pm\rangle$.-- therefor Column 16, Detailed Description, Line 5 - Delete "$|a_m{}^n\rangle$" and insert --$|a_m^n\rangle$-- therefor Column 16, Detailed Description, Line 11 - Delete "$|4\rangle$ ," and insert --$|4\rangle$,-- therefor Column 16, Detailed Description, Line 24 - Delete "$\Omega_2$" and insert --$\Delta_2$-- therefor Column 16, Detailed Description, Line 41 - Delete "$w_{ij}(i,$" and insert --$\omega_{ij}(i,$-- therefor Column 17, Detailed Description, Line 10 - Delete "222" and insert --$\Omega_2$-- therefor Column 17, Detailed Description, Line 21 - Delete "$|4\rangle$ ," and insert --$|4\rangle$,-- therefor Column 17, Detailed Description, Line 36 - Delete "$|N\rangle$ ," and insert --$|N\rangle$,-- therefor Column 17, Detailed Description, Line 50 - Delete "$|N\pm, M\rangle$" and insert --$|N\pm, M\rangle$-- therefor Column 17, Detailed Description, Line 50 - Delete "$E\pm=\hbar(N\omega_{34}+$" and insert --$E\pm = \hbar(N\omega_{34}\pm$-- therefor

CERTIFICATE OF CORRECTION (continued)
U.S. Pat. No. 12,306,236 B2

Column 17, Detailed Description, Line 52 - Delete "$|N-\rangle$ ," and insert --$|N-\rangle$,-- therefor Column 18, Detailed Description, Line 55 - Delete "$\Delta_2 \leq \Gamma$," and insert --$\Delta_2 \lesssim \Gamma$,-- therefor Column 18, Detailed Description, Line 55 - Delete "Γ" and insert --$\Gamma$-- therefor Column 18, Detailed Description, Line 63 - Delete "$\Omega$~" and insert --$\Omega_2$~-- therefor Column 19, Detailed Description, Line 6 - Delete "-2." and insert -- -2,-- therefor Column 19, Detailed Description, Line 35 - Delete "$\Omega_2$" and insert --$\Delta_2$-- therefor Column 19, Detailed Description, Line 43 - Delete "$R=2|\bar{x}_1-\bar{x}_2/(\sigma_1+\sigma_2)$" and insert --$R = 2|\bar{x}_1 - \bar{x}_2|/(\sigma_1 + \sigma_2)$-- therefor Column 19, Detailed Description, Line 50 - Delete "MHZ," and insert --MHz,-- therefor Column 20, Detailed Description, Line 5 - Delete "fulfils" and insert --fulfills-- therefor Column 20, Detailed Description, Line 9 - Delete "MHZ," and insert --MHz,-- therefor Column 20, Detailed Description, Line 35 - Delete "$\Omega_2$" and insert --$\Delta_2$-- therefor Column 20, Detailed Description, Line 37 - Delete "$\Omega_2$" and insert --$\Delta_2$-- therefor Column 20, Detailed Description, Line 51 - Delete "$|p\rangle = |\bar{N}, -1+\rangle$," and insert --$|p\rangle = |\bar{N}, -1 +\rangle$,-- therefor Column 20, Detailed Description, Line 51 - Delete "$|q\rangle = |\bar{N}, -1-\rangle$ ," and insert --$|q\rangle = |\bar{N}, -1 -\rangle$,-- therefor Column 20, Detailed Description, Lines 51-52 - Delete "$|sr\rangle = |N, 0-\rangle$ ," and insert --$|sr\rangle = |\bar{N}, 0 -\rangle$,-- therefor Column 20, Detailed Description, Line 52 - Delete "$|s\rangle = |\bar{N}, 0+\rangle$ ." and insert --$|s\rangle = |\bar{N}, 0 +\rangle$.-- therefor Column 21, Detailed Description, Line 17 - Delete "$\Delta_1 \pm 0$." and insert --$\Delta_1 \neq 0$.-- therefor Column 21, Detailed Description, Line 18 - Delete "$\Delta_1 <0$," and insert --$\Delta_1<0$,-- therefor Column 21, Detailed Description, Line 19 - Delete "$\Delta E_{min}$;" and insert --$\Delta E_{min}$,-- therefor Column 21, Detailed Description, Line 49 - Delete "$\Omega_c$." and insert --$\Delta_c$.-- therefor Column 22, Detailed Description, Line 5 - Delete "$\Omega_2$" and insert --$\Delta_2$-- therefor

CERTIFICATE OF CORRECTION (continued)
U.S. Pat. No. 12,306,236 B2

Column 22, Detailed Description, Line 31 - Delete "$\Phi=1,$" and insert --$\Phi=\pi,$-- therefor Column 22, Detailed Description, Line 43 - Delete "$\Delta_2$" and insert --$\Omega_2$-- therefor Column 22, Detailed Description, Line 46 - Delete "$\Delta_c$ ." and insert --$\Delta_c$.-- therefor Column 24, Detailed Description, Line 15 - After "or", insert --¶--

Column 25, Detailed Description, Line 65 - After "second", insert --,--

Column 30, Detailed Description, Line 20 - After "58,", insert --¶--

Column 30, Detailed Description, Line 22 - After "and", insert --¶--